United States Patent [19]

Mitchell et al.

[11] Patent Number: 4,891,643

[45] Date of Patent: Jan. 2, 1990

[54] ARITHMETIC CODING DATA COMPRESSION/DE-COMPRESSION BY SELECTIVELY EMPLOYED, DIVERSE ARITHMETIC CODING ENCODERS AND DECODERS

[75] Inventors: Joan L. Mitchell, Ossining; William B. Pennebaker, Carmel, both of N.Y.

[73] Assignee: International Business Machines Corporation, Armonk, N.Y.

[21] Appl. No.: 907,700

[22] Filed: Sep. 15, 1986

[51] Int. Cl.[4] .............................................. H03M 7/30
[52] U.S. Cl. .................................... 341/107; 341/51; 358/426
[58] Field of Search ................ 340/347 DD; 341/107, 341/50, 109, 51, 63; 364/554; 358/135, 260, 261.1, 261.2; 381/31, 30, 29

[56] References Cited

U.S. PATENT DOCUMENTS

| | | | |
|---|---|---|---|
| 4,028,731 | 6/1977 | Arps et al. | 178/6 |
| 4,122,440 | 10/1978 | Langdon, Jr. et al. | 340/347 DD |
| 4,168,513 | 9/1979 | Hains et al. | 358/261 |
| 4,259,693 | 3/1981 | Aaron et al. | 358/261 |
| 4,286,256 | 8/1981 | Langdon, Jr. et al. | 340/347 DD |
| 4,295,125 | 10/1981 | Langdon, Jr. | 340/347 DD |
| 4,363,036 | 12/1982 | Subramaniam | 358/261 |
| 4,369,463 | 1/1983 | Anastassiou et al. | 358/135 |
| 4,462,081 | 7/1984 | Lehan | 364/554 |
| 4,463,342 | 7/1984 | Langdon, Jr. et al. | 340/347 DD |
| 4,467,317 | 8/1984 | Langdon, Jr. et al. | 235/310 X |
| 4,494,108 | 1/1985 | Langdon, Jr. et al. | 340/347 DD |
| 4,516,241 | 5/1985 | Farah et al. | 370/110.1 |
| 4,540,973 | 9/1985 | Grallert | 340/347 DD |
| 4,558,302 | 12/1985 | Welch | 340/347 DD |
| 4,577,314 | 3/1986 | Chu et al. | 370/94 |
| 4,584,561 | 4/1986 | Bernardson | 340/347 DA |
| 4,596,024 | 6/1986 | Thomson | 375/100 |
| 4,633,490 | 12/1986 | Goertzel et al. | 375/122 |

OTHER PUBLICATIONS

J. Rissanen, G. G. Langdon, Jr.,–Arithmetic Coding, RJ2174, 1/88.
F. Barsi, P. Maestrini, Arithmetic Codes in Residue Number Systems, Digital Processes, 1978.
I. M. Boyarinov, G. A. Kabatyanskii, Iterative Arithmetic Independent-Error-Correcting Codes, Probl. Peredachi Inf. (USSR).
J. Rissanen–Combinatorial Coding, Conditional Entropy, and Distance for Sequences, Feb. 1975, RJ 1538.
G. N. N. Martin, Range Encoding: An Algorithm for (List continued on next page.)

Primary Examiner—William M. Shoop, Jr.
Assistant Examiner—Brian K. Young
Attorney, Agent, or Firm—Marc A. Block; Thomas P. Dowd

[57] ABSTRACT

A data compression/de-compression system includes a first arithmetic coding encoder, characterized by a first set of encoding conventions, which encoder generates a code stream that points to an interval along a number line in response to decision event inputs. The code stream can be adjusted to point to the same interval as code streams generated by one or more other arithmetic coding encoders characterized by encoding conventions differing in some way from those in the first set. In a binary context, optimal hardware encoders increment or decrement the value of the code stream in response to each occurrence of a more probable decision event while optimal software so changes the code stream value for each occurrence of a less likely event. According to the invention, the code streams for optimal hardware encoders and optimal software encoders are made either identical or compatible to enable similar decoding for each. Identical or compatible code streams are obtained from encoders having different event sequence or symbol ordering along intervals on the number line. Moreover, various hardware and software decoders—with respective symbol ordering and other conventions—can be used in conjunction with encoders having respective conventions, wherein each decoder retrieves the same sequence of decisions for a code stream pointing to a given interval. In both encoding and decoding, the present invention overcomes finite precision problems of carry propagation and borrow propagation by handling data in bytes and bit stuffing at byte boundaries and by pre-borrowing as required.

33 Claims, 34 Drawing Sheets

OTHER PUBLICATIONS

Removing Redundancy from a Digitised Message.

J. Rissanen-Arithmetic Coding of Strings, Jun. 1975, RJ 1591.

J. Rissanen, G. G. Langdon, Jr., Arithmetic Coding, IBM Journal of Res. & Dev., vol. 23, No. 2.

F. Rubin, Arithmetic Stream Coding Using Fixed Precision Registers, IEEE, 11/79.

G. G. Langdon, Jr., J. J. Rissanen, Integer-Length Arithmetic Code for Conditional Binary Sources, IBM TDB, vol. 22, No. 10.

G. G. Langdon, Jr., Method for Carry-Over Control in a FIFO Arithmetic Code String, IBM TDB, vol. 23, No. 1, 6/80.

D. G. Abraham, Parallel Compression by Table Look-Up, IBM TDB, vol. 23, No. 7A, 12/80.

D. R. Helman, G. G. Langdon, Jr., J. J. Rissanen, Arithmetic Compression Code Control Parameter Approximation, IBM TDB, vol. 23, No. 11, 4/81.

G. G. Langdon, Jr., Apparatus Supporting Half-Duplexed Encoding/Decoding Action, IBM TDB, vol. 23, No. 11, 4/81.

G. G. Langdon, Jr., J. J. Rissanen, S. J. P. Todd, K. Y. Wong, Encryption Properties of Arithmetic Codes, IBM TDB, vol. 23, No. 11, 4/81.

R. B. Arps, G. G. Langdon, Jr., LIFO Arithmetic Compression Coding Method for Conditional Sources, IBM TDB, vol. 23, No. 11, 4/81.

G. G. Langdon, Jr., Tutorial on Arithmetic Coding, Computer Science Research Report, RJ3128, 5/6/81.

C. B. Jones, An Efficient Coding System for Long Source Sequences, IEEE, vol. 27, No. 3, 5/81.

G. G. Langdon, Jr., Table-Driven Decoder Involving Prefix Codes, IBM TDB, vol. 23, No. 12, 5/81.

G. G. Langdon, Jr., J. Rissanen, Compression of Black-White Images with Arithmetic Coding, IEEE, vol. 29, No. 6, 1981.

G. G. Langdon, Jr., J. J. Rissanen, Computational Speed Enhancement by Selective Precision in Arithmetic Code Operations, IBM TDB, vol. 24, No. 2, 7/81.

G. G. Langdon, Jr., Constrained Channel Coding Using a Reduced Number of Arithmetic String Coding Steps Per Cycle, IBM TDB, vol. 24, No. 8, 1/82.

G. G. Langdon, Jr., J. J. Rissanen, An Adaptive File Compression Algorithm, RJ3460, 4/23/82.

G. G. Langdon, Jr., S. J. P. Todd, General Unit-Time Arithmetic Codes for Constrained Channels, IBM TDB, vol. 25, No. 3A, 8/82.

G. G. Langdon, Jr., S. J. P. Todd, Augend Computation for Arithmetic Channel Codes, IBM TDB, vol. 25, No. 3A, 8/82.

R. B. Arps, J. M. Cheng, G. G. Langdon, Jr., Control Character Insertion Into Arithmetically Encoded Strings, IBM TDB, vol. 25, No. 4, 9/82.

G. G. Langdon, Jr., S. J. P. Todd, Method for Application of ECC to Constrained Channels, IBM TDB, vol. 25, No. 3A, 8/82.

G. G. Langdon, Jr., J. Rissanen, A Simple General Binary Source Code, IEEE, vol. 28, No. 5, 1982.

G. Nigel, N. Martin, G. G. Langdon, Jr., S. J. P. Todd, Arithmetic Codes for Constrained Channels, IBM J. Res. Dev., vol. 27, No. 2, 3/83.

S. J. P. Todd, G. G. Langdon, Jr., G. N. N. Martin, A General Fixed Rate Arithmetic Coding Method for Constrained Channels, IBM J. Res. Dev., vol. 27, No. 2, 3/83.

G. G. Langdon, Jr., A Note on the Ziv-Lempel Model for Compressing Individual Sequences, IEEE, 1983, vol. 29, No. 2.

G. G. Langdon, P. H. Siegel, S. Todd, Constrained Channel Coding with Spectral Null, IBM TDB, vol. 26, No. 5, 10/83.

G. G. Langdon, Jr., An Adaptive Run-Length Coding Algorithm, IBM TDB, vol. 26, No. 7B, 12/83.

G. G. Langdon, Jr., An Introduction to Arithmetic Coding, IBM J. Res. Develop., vol. 28, No. 2, 3/84.

D. Mahlab, Complexity of Data Compression Algorithms, IEEE (Israel), Mar. 1985.

H. Morita, K. Fujimoto, S. Kitada, S. Arimoto, On Efficiency of Binary Arithmetic Codes, Trans. Inf. Process. Soc. Jpn., vol. 25, No. 4, 1984.

HARDWARE (-H) ENCODER/DECODER

INVERTED (−1) SOFTWARE ENCODER

SOFTWARE (-S) ENCODER/DECODER

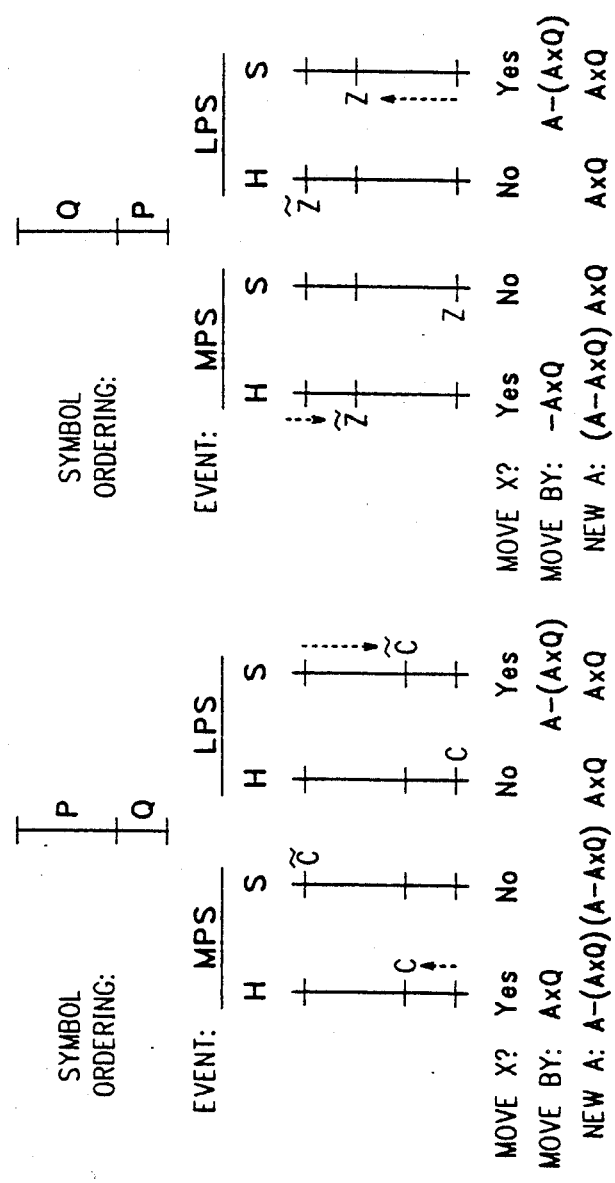

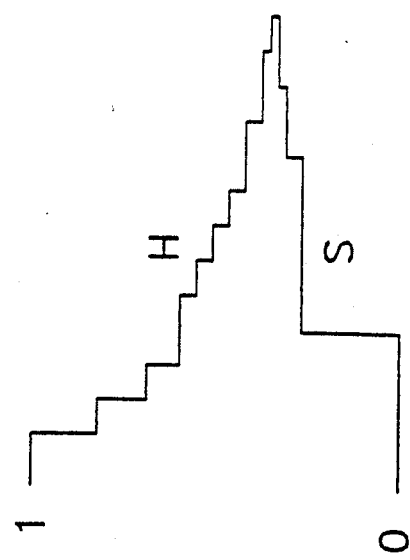
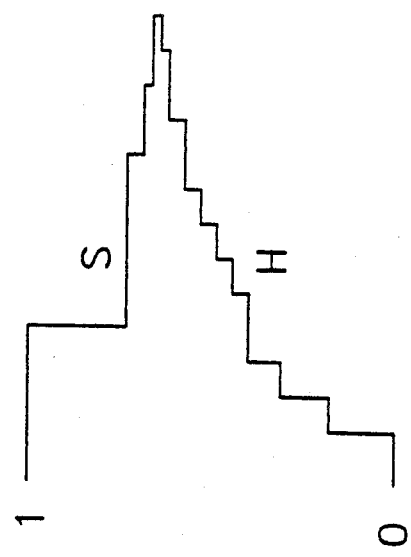

FIG.9 ffffffff, 00 , c, bbbbbbbs, .xxxxxxxxxxxx
31 – 24, 23–22, 21, 20 – 12, 11 – 0
—300

FIG.10

0000.xxxxxxxxxx, nnnnnnnn, ffffffff        (FULL WORD)
31 – 16           , 15 – 8  , 7 – 0
xc                , xnew    (HALF WORDS)
                  , xflag   (BYTE)
400—

ENCODER UNIT

A-LOGIC

C-LOGIC

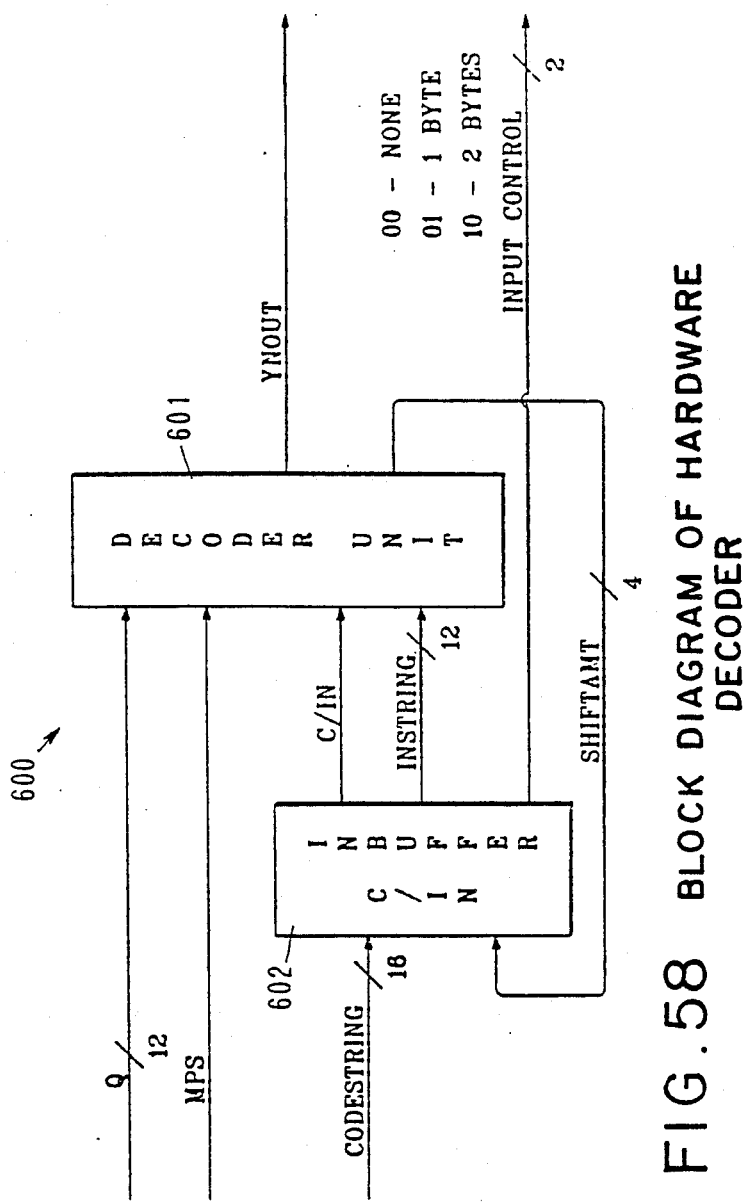
FIG. 58 BLOCK DIAGRAM OF HARDWARE DECODER

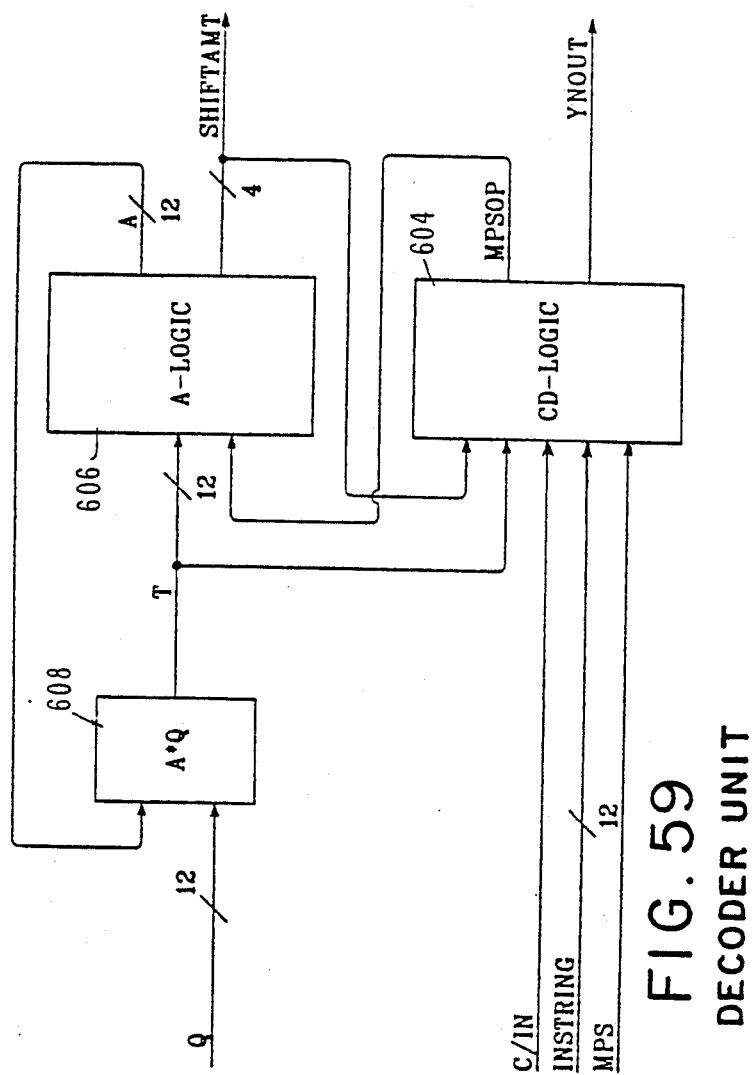
FIG. 59 DECODER UNIT

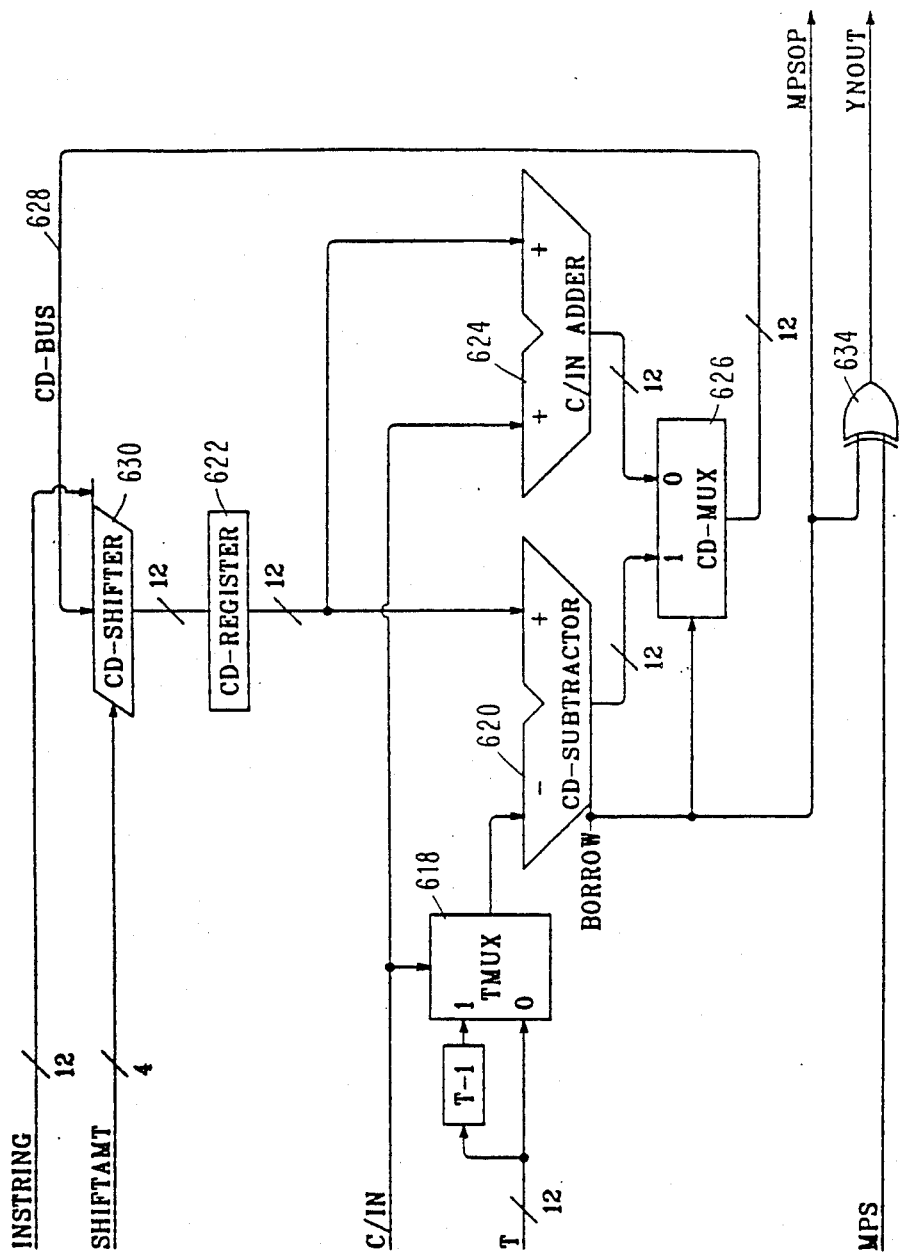
FIG. 60 DECODER CD-LOGIC

ARITHMETIC CODING DATA COMPRESSION/DE-COMPRESSION BY SELECTIVELY EMPLOYED, DIVERSE ARITHMETIC CODING ENCODERS AND DECODERS

BACKGROUND OF THE INVENTION

1. Field of the Invention

The present invention relates to data compression/decompression by means of arithmetic coding.

2. Description of the Problem

One technique of compressing and de-compressing data is known as arithmetic coding. A general discussion of arithmetic coding is found in an article by G. Langdon, "An Introduction to Arithmetic Coding", IBM J. Res. Develop. Vol 28, No 2, pages 135-149 (March, 1984), which is incorporated herein by reference.

As discussed in the Langdon article, arithmetic coding maps successively encoded decisions to a code point along a number line. Arithmetic coding may be applied to decisions having two or more possible outcomes (referred to as "events") in which each outcome for a given decision has a probability associated therewith. Each outcome is represented in data by a corresponding "symbol". The number line represents an interval which is partitioned into segments, each segment corresponding to the entering of a respective symbol as input to an encoder. For a decision having four possible outcomes there would be four segments, for example segments a, b, c, and d. The relative length of each segment would reflect the probability of the corresponding event occurring. If the decision corresponds to a "d" event, the "d" segment is selected as a current interval which is then, in turn, partitioned into segments a, b, c, and d. In this way, successively smaller, lesser-included intervals on a number line are derived. Significantly, each interval is arrived at by following a unique sequence of events. The generating of a code stream which points to a particular number line interval in response to a given string of decision events is known as arithmetic coding "encoding".

From a particular interval and information regarding the ordering and respective lengths of the segments of each interval, an associated string of decision events can be retrieved. This process, which undoes the arithmetic coding encoding, is labelled as arithmetic coding "decoding".

Binary arithmetic coding is a special case in which each decision results in one of two exclusive events. In the binary coding environment, one of the two events involves a less probable symbol (LPS) which has a probability of Q and the second event involves a more probable symbol (MPS) which has a probability of P. In binary arithmetic coding, an interval along the number line is divided into two segments—one corresponding to the occurrence of an LPS event (or outcome) and the other segment corresponding to the occurrence of an MPS event (or outcome). The length of each segment preferably reflects the probabilities Q and P, respectively, of the two events.

In a binary arithmetic encoder, a number line extends between 0 and 1 to define an initial interval. In a hardware scheme described in the Langdon article, a first segment extending along the lower values of the interval corresponds to the LPS probability. A second segment, extending along the higher values of the interval, corresponds to the MPS probability. A code point is initially set to point at the low end of the interval (that is, at 0) and a code stream corresponding thereto is also initialized at 000... It is important to note that although the number line extends from 0-to-1, only one of the two boundary values is included in the corresponding interval. For example, the initial hardware interval includes the 0 and all points up to but not including 1. Similarly, for each successive interval in the hardware scheme, the lower bound is included but the upper bound is not.

For the above-discussed hardware scheme, in the event of an LPS, the code point remains fixed and the code stream remains the same in value (although its length increases). A new current interval after an LPS event is defined as the LPS (or Q) segment of the predecessor interval. Also for the abovediscussed hardware scheme, in the event that an MPS occurs with the 0-to-1 bounds in place, the code point increments by the value of Q and the new current interval becomes that associated with the MPS event, i.e. the P segment of the previous interval. It has been observed for hardware encoders that movement of the code point on each MPS event is far superior to movement on LPS events.

In a novel software approach to encoding (disclosed herein), the upper bound may be included in the interval but the lower bound is not. That is, for the number line extending from 0-to-1, the interval includes 1 and all points extending down to but not including 0. According to this software scheme, the value of the code stream has a value corresponding to the upper bound of the current interval and is decremented with each LPS event. It has been found by the present inventors that moving the code stream on LPS events in a software scheme is more efficient than movement on MPS events.

In some instances it is desired or necessary to determine (or encode) the code point value in hardware while in other instances the code point value is preferably encoded with software. Similarly, in retrieving the original decision data from a given code stream (indicative of a corresponding code point in an interval), a hardware decoder may be appropriate or required in some instances whereas a software decoder may be appropriate or required in other instances. Hence, it would be highly desirable for a hardware encoder and a software encoder to generate the same code stream or at least code streams pointing to the same interval for a given set of decisions, and for a hardware decoder and a software decoder to retrieve the same set of decision data given such code streams. In this way, data could be encoded by means of hardware or software to generate a code stream, and the code stream could be decoded by software or hardware to recover the initial data.

To date, however, it has not been suggested that code streams generated by optimized hardware and optimized software might be interchangeable. Observing the respective conventions outlined above for the discussed hardware and software schemes, it is noted that the hardware code stream and software code stream do not point to the same code point on the number line. (In the initial condition, for example, the hardware code stream points to while the software code stream points to 1.) By pointing to different code points, the code streams are not identical. Furthermore, the two code streams—as suggested hereinabove—do not point to the same interval along the number line. By pointing to different intervals, the code streams are not even compatible, i.e., decodable by the same decoder. In this regard, it is observed that a decoder can retrieve the same set of decision events from various code points in a given interval. Hence, two encoders which encode different code points in the same final interval will be decoded to produce the same original decision data. Two encoders that produce code streams that do not point to the same final interval are not compatible.

The above-described compatibility problem is compounded because encoding is performed with "finite precision". With finite precision, the code stream increases in length without any prescribed limit as each decision event is encoded; however, only a finite portion of the code stream is retained in storage. That is, the code stream is stored in a shift register or other fixed length memory. As an event is encoded, new contents enter the code stream memory. At some time, earlier stored contents of the memory are "shipped out" from the fixed length memory. The contents which are shipped out can no longer be altered.

The fact that the shipped out contents cannot be altered can lead to difficulties. The first difficulty is called "carry propagation". In an encoding scheme in which the code stream either remains constant or is incremented—as in the aforementioned hardware scheme—there is a possibility that the current code stream C may be of the form 011111111111. If the fixed length memory stores only the least significant eight bits and the value of C is incremented by, for example, 0000000001, the new value for C should be 1000[00000000]. If the left four bits have already been shipped out and cannot be altered, there is a discrepancy; the bits as shipped were 0111 whereas the actual value—after carry propagation—should be 1000. If only the least significant (bracketed) 8 bits are retained, the carry cannot reach its destination. The carry propagation difficulty has been recognized in the prior art. In the *IBM Journal of Research and Development*, 28, 135, (1984), G. G. Langdon, Jr. describes the general concept of bit stuffing to block carry propagation—such bit stuffing being unlinked to data bytes.

A second difficulty attaching to finite precision involves those arithmetic coding encoders in which the upper bound is contained within the interval and in which code point movement is achieved by subtracting a value from the current code stream. Such a scheme is suggested by the aforementioned software encoder. Therein, the current code stream C points to the upper bound of an interval. In response to an LPS event, the P interval is subtracted from C to yield a new value for the code stream. (See FIG. 4) If the code stream includes a string of 0 bits after a 1 (e.g., 1000000000000) and there is finite precision, the leading bits which include the 1 bit may have already been shipped out so that a future borrow could not be accounted for. In the above example, for an 8-bit register, the leading bits 10000 would have already been shipped and would no longer be subject to change. A subtraction of 00000001 from the eight 0's stored in the shift register or other memory results in a borrow propagation which is unable to reach a 1 bit whereat a borrow may be effected. Such borrow propagation presents a notable difficulty resulting from finite precision processing.

In addition to creating difficulties within a given encoder, the discrepancies resulting from finite precision processing have hampered compatibility between encoders. That is, the discrepancies have made it difficult to obtain the same or a compatible code stream for (a) an encoder that involves incrementing the code stream value in response to a prescribed event and (b) an encoder that involves decrementing the code stream value in response to a prescribed event.

The problem of generating an identical or at least a compatible code stream with an incrementing encoder and with a decrementing encoder is highlighted when one considers the optimal conventions ascribed to a hardware encoder and to a software encoder.

For optimal operation, the hardware encoder moves the code point on an MPS event which, in a convenient embodiment, results in an incrementation in code stream value. Optimal operation for the software scheme involves moving the code point on an LPS event and, in a convenient embodiment, results in decrementing the code stream value. To make the two code streams decodable by a single decoder, the finite precision difficulties as well as the disparity in pointing of the respective code streams must be resolved.

At this time, it is noted that the present inventors have alternatively proposed that the probability segments of an interval may be "inverted". For example, instead of having the P segment at the high (in value) end of an interval, the P segment may occupy the lower end of the interval. A shorthand notation for the former convention is "P/Q" whereas the latter convention is "Q/P". An example of an inverted Q/P encoder would point the current code stream at the lower boundary of an interval (which point is included in the interval). The Q segment is at the high end of the current interval and the P segment occupies the lower end of the interval. For an inverted software encoder, in the event of an MPS, the code point is unmoved. On each LPS event, the Q/P inverted software encoder increments the value of C by the P segment value starting from the lower boundary of the current interval. The inverted software encoder operates as a mirror image of the above-described P/Q software encoder. It is noted that the Q/P inverted software encoder value for the code stream $C_I$ is related to the P/Q software encoder value $C_S$ by the expression: $C_I = 1 - C_S$. Because the length of $C_S$ is not fixed, the value of 1 is indeterminate in length. Again, borrow propagation difficulties may result in attempting to employ the inverted code encoder to generate a code stream compatible or identical with a code stream generated by an optimal P/Q hardware or an optimal P/Q software encoder.

A number of problems preclude an optimal hardware encoder and an optimal software encoder (whether following P/Q or Q/P symbol ordering) from being interchangeable—from producing the same or at least compatible code streams. Similarly, there are a number of problems precluding the interchangeable use of an optimal software decoder and an optimal hardware decoder in retrieving an original set of decision events from a code stream generated by an optimal hardware encoder or an optimal software encoder. The present invention involves configuring the various software and hardware encoders to be interchangeable and for either an optimal hardware decoder or an optimal software decoder to similarly decode a code stream from any of the interchangeable encoders.

SUMMARY OF THE INVENTION

In accordance with the present invention, an optimal software encoder and an optimal hardware encoder are configured to generate respective code streams which can be decoded by a single decoder, in a finite precision context.

It is also an object of the invention to provide an optimal hardware decoder and an optimal software decoder, each of which is configured to retrieve the same set of decision data after processing respective code streams generated by an optimal hardware encoder or an optimal software encoder.

In addition, it is an object of the invention to provide binary arithmetic coding encoding in which the ordering of segments along a number line interval may be reversed; and wherein the code stream generated by the inverted encoder may be simply processed for decoding by either an optimal hardware ware decoder or an optimal software decoder.

Accordingly, it is an object of the present invention to provide an optimal hardware encoder having either P/Q or Q/P ordering of interval segments and an optimal software encoder having either P/Q or Q/P ordering of interval segments, wherein a set of event decisions encoded as a code stream by any of the four encoders may be retrieved by either an optimal hardware decoder or an optimal software decoder.

Moreover, the present invention contemplates an optimal finite precision hardware encoder and an optimal finite precision software encoder, wherein the respective code points therefor converge with the processing of successive decisions.

Also, the present invention accounts for a difference between code point values for different encoders by adjusting at least one code point value to account for a "final range" factor, to bring the two disparate code points into consonance.

Further, the present invention involves methodology whereby carry propagation and borrow propagation problems are overcome. In particular, carry propagation is solved by bit stuffing and borrow propagation is resolved by appropriate pre-borrows. Pre-borrowing is applied (a) when a code stream is derived by inverting another code stream and (b) when a code stream ending with a byte of zeros represents a minuend that is to be decremented in a prescribed manner.

The latter instance of pre-borrow avoids borrow propagation and enables the decrementing code stream to be identical or at least compatible with an incrementing code stream according to respective sets of rules. According to a first set of rules, a pre-borrow is applied whenever a byte of encoded data to be shipped has all 0's, thereby transforming the hexadecimal '00 ' (for an eight bit byte) to hexadecimal 'FF' plus a carry bit. It is noted that Hexadecimal values are hereinafter represented by values enclosed by single quotes (e.g., 'A1') or by values preceded by an X and enclosed by single quotes (e.g., X'A1' which represents 10100001 in binary notation.) Employing the first set of rules results in code streams for an incrementing code stream scheme and a decrementing code stream scheme which are compatible. That is, the first set of rules provides code streams for the various encoders which point to the same interval and, hence, can be decoded by a single decoder.

In a second set of rules, the portion of encoded data which is to be applied to a current code stream is compared to the current interval value A(i). If the current interval value is greater, a pre-borrow is applied; otherwise there is no pre-borrow. The condition for pre-borrow according to the second set of rules is used in forming identical code streams for an incrementing (hardware) scheme and a decrementing (software) scheme.

The comparison indicates whether the hardware code stream value is in the 00 interval to which the software points or to the lesser FF interval. In the former case, there is no borrow propagation problem and pre-borrow is not required whereas in the latter case pre-borrow is provided. That is, if the optimal software code stream has a '00' byte and the corresponding optimal hardware code stream must be 'FF', the pre-borrow procedure converts the software '00 ' to 'FF' and identical code streams are produced for the two configurations.

Also in accordance with the invention, encoded data is output as bytes with CARRY's and BORROW's being limited to only the most recent byte to be shipped out. The limiting of CARRY's and BORROW's to byte boundaries achieves the object of precluding carry and borrow propagation. Further, where the byte to be shipped out and previously shipped out bytes are stored in a buffer, the permitting of CARRY's and BORROW's to affect only the byte to be shipped out enables the buffer pointer to move sequentially through the buffer without back up.

Yet further, the present invention avoids infinite precision in an inverted version of a decoder wherein the code stream $C_I$ is equated to $1 - C_s$ in the encoding step by always preborrowing $\epsilon$ from 1 to direct the inverted code stream into the interval defined by $C_s$.

The foregoing and other objects, features and advantages of the invention will be apparent from the more particular description of the preferred embodiments of the invention, as illustrated in the accompanying drawing.

BRIEF DESCRIPTION OF THE DRAWINGS

FIG. 6.1 and and FIG. 6.2 is a diagram illustrating how each encoder of FIG. 5 operates in response to decision events.

FIG. 7 is a diagram showing the convergence of two code streams generated by two different encoders, each of which is characterized by having the same event ordering convention.

FIG. 8 is a diagram showing the convergence of two code streams generated by two different encoders, each of which is characterized by having the same event ordering convention that is the reverse of that shown in FIG. 7.

FIG. 9 is an illustration showing the bit allocation in an encoder shift register according to the present invention.

FIG. 10 is an illustration showing the bit allocation in a decoder shift register according to the present invention.

FIG. 58 through FIG. 60 are each block diagrams depicting a hardware decoder or portions thereof.

DESCRIPTION OF THE INVENTION

I. GENERATING IDENTICAL AND COMPATIBLE CODE STREAMS WITH ENCODERS HAVING DIFFERING ENCODING CONVENTIONS

Figure 1:
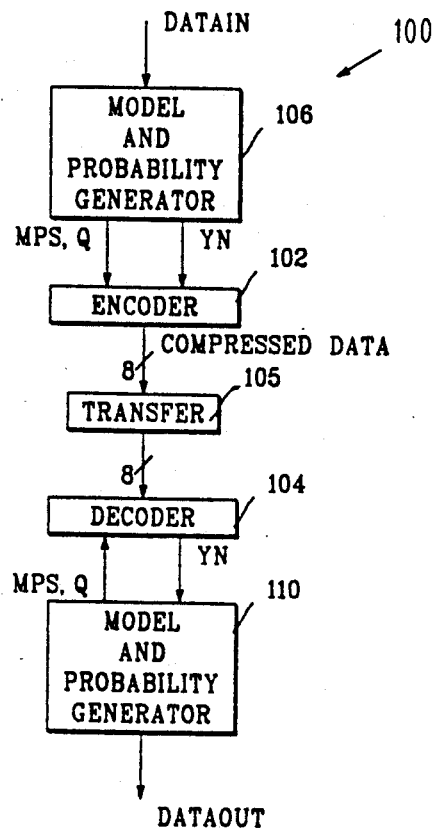
FIG. 1 is a general block diagram of a data compression/decompression system.

Referring to FIG. 1, a general apparatus 100 for compressing and de-compressing data is shown including an arithmetic encoder 102 and a corresponding arithmetic decoder 104. In compressing data, the apparatus 100 takes incoming data (DATAIN) which may be expressed as a series of binary decisions (YN)—wherein each outcome or event has a respective probability——and characterizes the series by an encoded sequence of bits. By encoding the series of decisions with probability information imbedded therein, the compressed sequence of bits may be transferred more quickly than the original incoming data. Moreover, the compressed data may be stored in less space than the original information being transferred.

In applications where large portions of data are to be transferred by some transfer device or medium (e.g., element 105) at high baud rates or where large portions of data are to be stored in limited memory (or where large portions of data are to be stored and thereafter transferred at a low baud rate), the use of compressed data is of tremendous value. One particular environment in which such compression is of notable value is in the field of video data processing and, more particularly, in teleconferencing. In teleconferencing, vast amounts of information must be rapidly communicated from one location to another to convey picture and other information.

After encoded data is transferred to its desired destination, it is de-compressed. That is, the original data or some related representation thereof is retrieved by means of the decoder 104. The decoder 104, in effect, undoes the procedure of the encoder 102.

In FIG. 1, the incoming data DATAIN is initially processed by a model and probability generator 106. The model and probability generator 106 provides context to the data. For example, in facsimile, pieces of incoming data may correspond to whether a given pixel is black or not-black. One condition or event is generally more likely. For a particular pixel, a determination is made whether it conforms to the more likely condition or less like condition. As successive pieces of data are processed, the relative probabilities between the more probable condition (labelled the "MPS") and the less likely condition (labelled the "LPS") may change in value or even switch. That is, if the more probable condition is black and numerous instances of not-black occur, the not-black condition may become more probable. The MPS would then change from the black condition to the not-black condition. The model which determines how the incoming data DATAIN is to be evaluated and the probability generator which up-dates the relative probability values is included in element 106. Various types of models are discussed in the prior technology. A particular approach to probability adaptation is included in a co-pending patent application entitled "Probability Adaptation for Arithmetic Coders", invented by J. L. Mitchell and W. B. Pennebaker, U.S. Ser. No. 06/805,163, filed on Dec. 4, 1985 which is incorporated herein by reference. Another approach to probability estimation is set forth in a copending application filed on even date herewith entitled "Probability Estimation for Arithmetic Coding" invented by J. L. Mitchell and W. B. Pennebaker which is incorporated herein by reference to the extent required to set forth the environment of the present invention. A suitable probability generator is also set forth in U.S. Pat. No. 4,633,490 of G. Goertzel and J. L. Mitchell entitled "Symmetrical Adaptive Data Compression/Decompression System".

Additional information regarding probability adaptation and arithmetic coding is set forth in a further co-pending application filed on even date herewith entitled "Arithmetic Coding Encoder and Decoder" invented by G. G. Langdon, Jr., J. L. Mitchell, W. Pennebaker, and J. J. Rissanen, all coworkers. at the IBM Corporation. This co-pending application is incorporated herein by reference.

The model and probability generator 106 provides three items of data to the encoder 102. First, there is an indication as to which condition is the more probable event (i.e., which condition is an MPS event). Second, a value Q—corresponding to the probability for the less likely event (the LPS event)—is provided. And third, a YN value indicates the decision event being entered.

Figure 2:
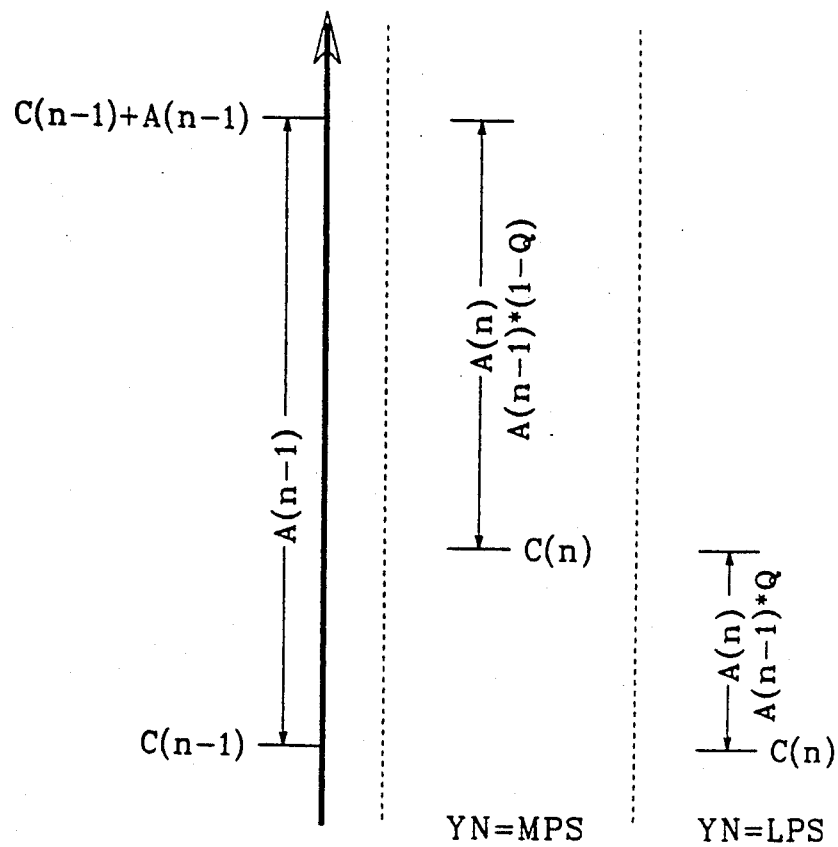
FIG. 2 is a drawing of a number line along which arithmetic coding operations for a first type of encoder/decoder are shown.
Figure 3:
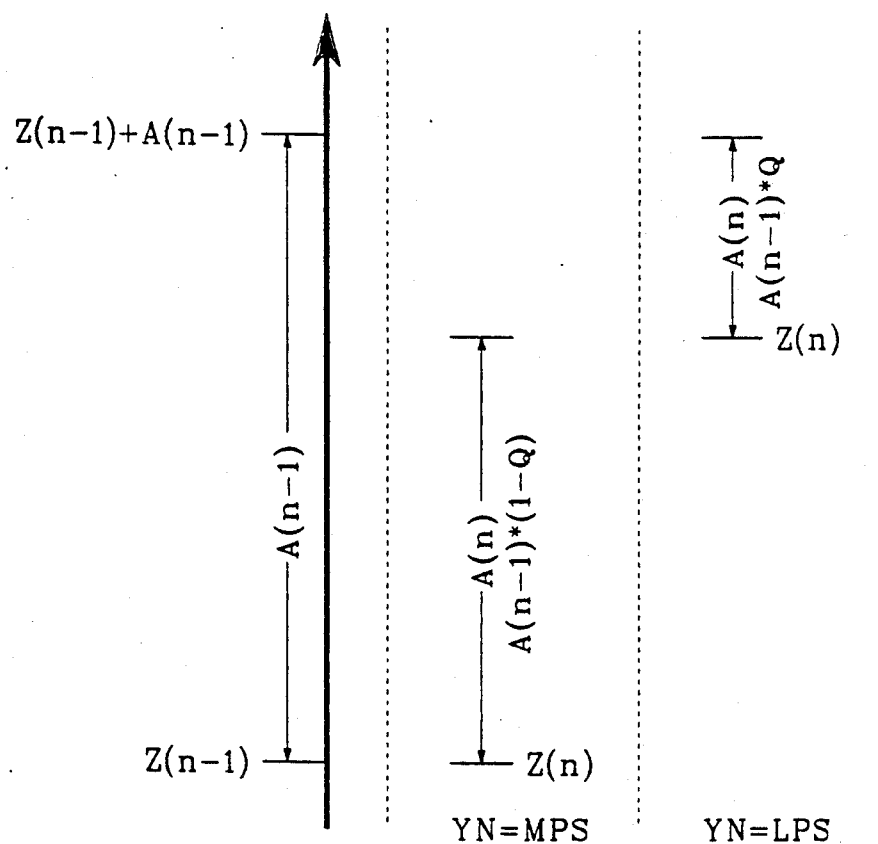
FIG. 3 is a drawing of a number line along which arithmetic coding operations for a second type of encoder/decoder are shown.
Figure 4:
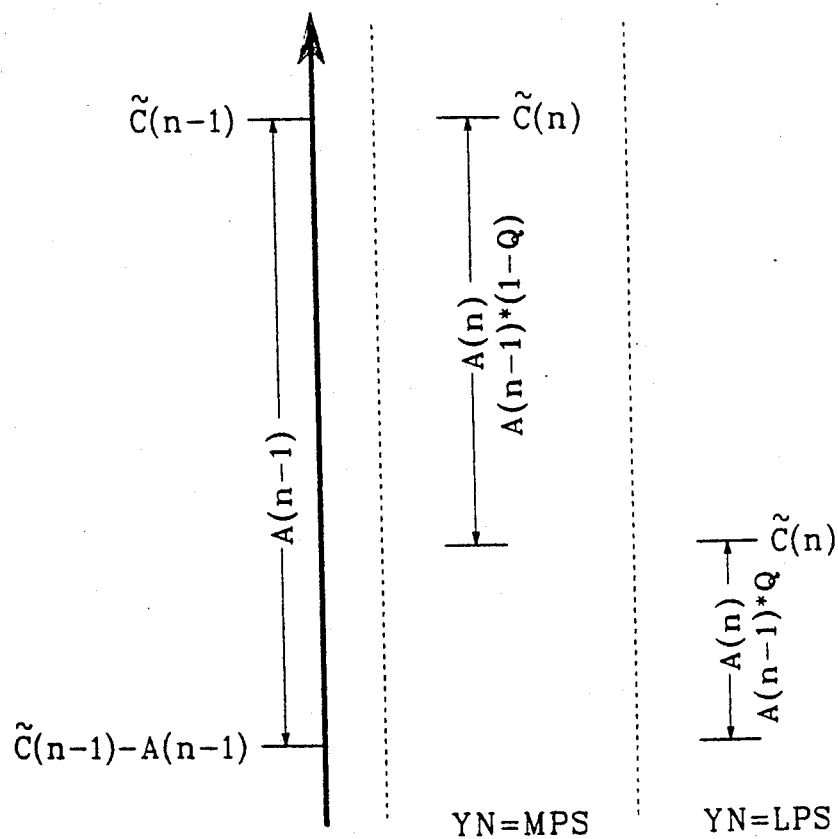
FIG. 4 is a drawing of a number line along which arithmetic coding operations for a third type of encoder/decoder are shown.

The encoder 102 converts the three items of information from the model and probability generator 106 into compressed data by means of arithmetic coding. FIG. 2, FIG. 3, and FIG. 4 each represent an encoding scheme. FIG. 2 represents an optional hardware encoder/decoder FIG. 3 represents an optional software encoder. FIG. 4 illustrates a software encoder/decoder referred to as an inverted code encoder.

In FIG. 2, the code point is initially positioned at the "lower" (in value) boundary of a given interval. The Q segment associated with the occurrence of an LPS event is also at the lower end of the interval. The P segment associated with an MPS event is at the upper end of the interval C(n) corresponds to a code stream value at a time n. A(n) corresponds to the value of the current interval at time n. For each decision, an optimal hardware encoder follows the conventions:

When the decision event (illustrated in the figures as YN) is an MPS event $$C(n) \leftarrow C(n-1) + [A(n-1) \times Q] \quad \text{(a)}$$

$$A(n) \leftarrow [A(n-1) \times (1-Q)] \quad \text{(6)}$$

When the event is an LPS event $$C(n) \leftarrow C(n-1) \quad \text{(a)}$$

$$A(n) \leftarrow [A(n-1) \times Q] \quad \text{(b)}$$

Whether there is an MPS event or an LPS event, the hardware spends a processing cycle re-specifying the value of A, the interval (or range). Moreover, when there is an MPS, the code point is incremented (i.e., moved) by the value of $[A(n-1) \times Q]$. Because the hardware can process the up-dating of A and C in parallel, such hardware need expend only one processing cycle for any decision. On the other hand, if the hardware were configured to move the code point on each LPS event, two processing cycles—in determining $C \leftarrow C - (A*Q)$—would be required each time the code point was to be moved. In that limiting the number of processing cycles is critical in hardware operation and in that code point movement on LPS events results in the use of more cycle times, code point movement on MPS events has been found optimal for hardware.

Referring now to FIG. 3, a second implementation is set forth. This implementation has been proposed by the present inventors in an experimental encoder at the IBM Corp. Thomas J. Watson Research Center. The code point Z is directly located at the "low" end of the interval. The P segment is also at the low end of the interval, with the Q segment lying along the upper end of the segment. In this implementation, the following rules apply:

When the event is an MPS event $$Z(n) \leftarrow Z(n-1) \quad \text{(a)}$$

$$A(n) \leftarrow [A(n-1) \times (1-Q)] \quad \text{(b)}$$

When the event is an LPS event $$Z(n) \leftarrow Z(n-1) + [A(n-1) \times (1-Q)] \quad \text{(a)}$$

$$A(n) \leftarrow [A(n-1) \times Q] \quad \text{(b)}$$

It is observed that the above conventions corresponding to FIG. 3 are optimal for software. Software does not process in parallel. Hence, were software tasked with up-dating Z and A according to the rules for FIG. 2, both Z and A would have to be altered serially and, because the up-dating is performed on the presumably more likely MPS events, such serial updating would be required frequently. This would require considerable processing time. In FIG. 3, contrarily, Z should be rarely up-dated (especially where $Q << P$).

The encoding process of FIG. 4 is a mirror image of the process of the inverted software scheme shown in FIG. 3, with the ordering of the P and Q segments reversed relative thereto. Also compared to FIG. 3, the code point in FIG. 4 moves in an opposite direction in response to an LPS event. That is, according to the inverted scheme of FIG. 3, the code stream is incremented in value with each LPS event; whereas with the inverted encoder of FIG. 4 the code stream is decremented with each LPS event.

By way of simple example, suppose $A(n-1)$ is equal to 0.100 in binary and Q is equal to 0.001. Also suppose that the current value for $C(n-1)$ of FIG. 2 is 0.100 and for $C(n-1)$ of FIG. 3 is equal to 1.000. In the event of an LPS, the code point remains unchanged in the hardware embodiment of FIG. 2; $C(n) \leftarrow C(n-1)$. The value of A(n) in FIG. 2 is equal to $A(n-1)*Q$ which, in the present example, is $(0.100)*(0.001)=0.0001$. The value of C(n) (as noted above) remains at 0.100 and the value of A(n) is 0.0001. The sum of C(n) and A(n) is therefore 0.1001. For the software embodiment of FIG. 4, however, C(n) is determined by reducing $C(n-1)$ by the value $A(n-1)*(1-Q)$—that is, $(0.100)*(1-0.001)=0.0111$. The C value is then $(1.000-0.0111)$, or 0.1001. $C(n)+A(n)$ is the same as C(n). A single decoder can decode $C(n)+A(n)$ or C(n) to retrieve the same set of input decision events. That is, given a first input to a decoder (see decoder 104 of FIG. 1) indicating which condition corresponds to an MPS event and a second input indicating the current value of Q for the piece of the code stream being decoded, the decoder can process C(n) plus the final interval A(n) or C(n) to produce a sequence of YN outputs which correspond to the sequence of YN inputs to the encoder 102. The YN decisions enter a model and probability generator 110—which matches the model and probability generator 106—and provides the original data or a replica thereof as a DATAOUT output.

In that the schemes of FIG. 3 and FIG. 4 provide for code point movement on an LPS event, the number of cycles required for software processing is kept low. These two schemes are intended to be optimal for software embodiments. (At this time, it should be noted for completeness that an inverted encoder which optimizes hardware by inverting the P/Q order of FIG. 2 is also contemplated according to the invention.)

Figure 5:
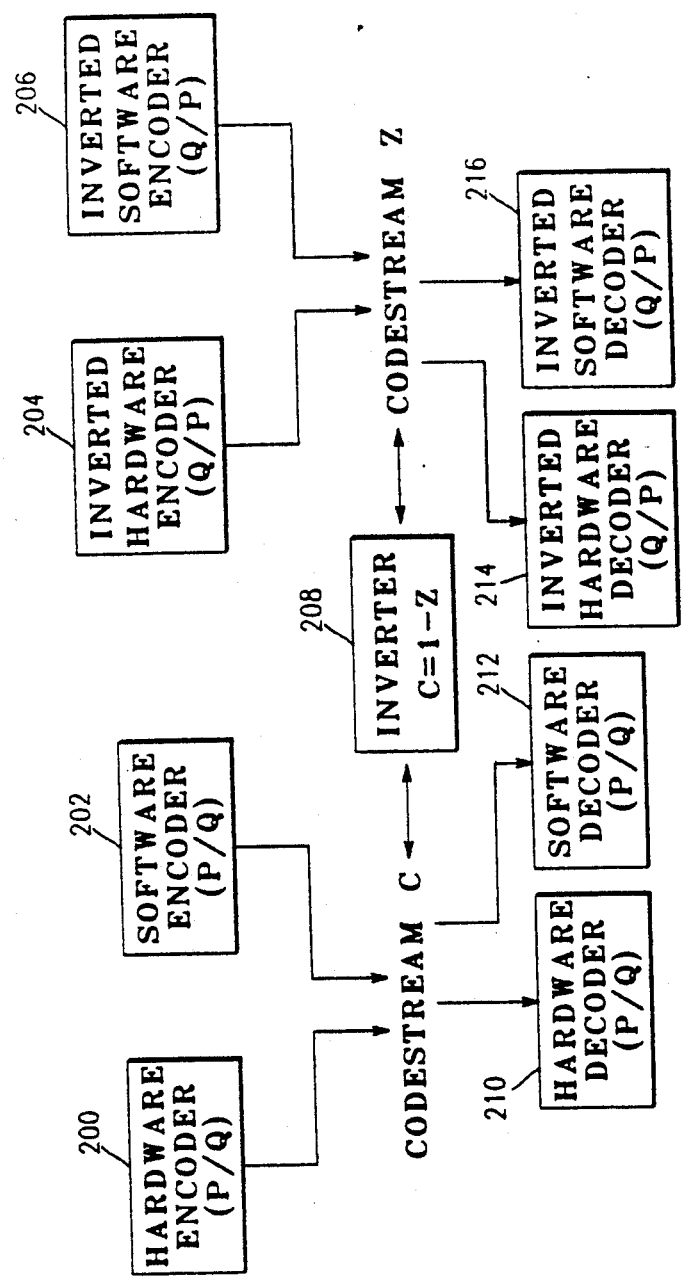
FIG. 5 is a diagram showing a plurality of disparate arithmetic coding encoders, each of which can be used in conjunction with each of a plurality of arithmetic coding decoders.

Referring to FIG. 5, a major object of the invention is illustrated. Four encoders 200 through 206 are shown. Encoders 200 and 204 encode according to the optimal hardware rule that the code point moves on each MPS event, the former being implemented with P/Q symbol ordering and the latter being implemented with Q/P (inverted) symbol ordering. Encoders 202 and 206 encode according to the optimal software rule that the code point moves on each LPS event, the former being implemented with P/Q symbol ordering and the latter being implemented with Q/P (inverted) symbol ordering. According to the invention, the code streams generated by the encoders 200 and 202 can be made the same (or at least compatible) and are represented as C. According to the invention, the code streams generated by the encoders 204 and 206 can be made the same (or at least compatible) and are represented as Z. Z and C can be derived from each other in accordance with the expression: $C = 1 - Z$, which calculation is performed by an inverter 208. Code stream C is directly decodable by a decoder 210 which is based on optimal hardware considerations (e.g., unawkward calculations). Code stream Z is directly decodable by a decoder 216 which is based on optimal software considerations. It is observed that either decoder 210 or 216 may be used in decoding a code stream generated by any of the four encoders 200 through 206, some of the code streams being processed en route to the decoder by the inverter 208.

For completeness, it is noted that two other decoders—a Q/P hardware decoder 214 and a P/Q software decoder 212 can also be implemented according to the invention. A P/Q software decoder is, in fact, described briefly hereinbelow in Section II(B).

The interrelationship between the four encoders 200 through 206 of FIG. 5 is shown in FIG. 6. In the left portion of FIG. 6, a hardware encoder (e.g., encoder 200) and a software encoder (e.g., encoder 202) having P/Q symbol ordering are shown responding to an MPS and an LPS event, respectively. For an MPS event, the P/Q hardware encoder (symbolized by H) increments the code stream value by amount Q, with the interval size A(n) being set equal to $[A(n-1)x(1-Q)]$. For an MPS event, the P/Q software encoder maintains the code point position with the interval size being set to $[A(n-1)x(1-Q)]$. For an LPS event, the P/Q hardware encoder maintains the code point position whereas the P/Q software encoder decrements the code point value by $[A(n-1)x(1-Q)]$. For an LPS event, both P/Q encoders set the new interval size equal to AxQ.

In the right portion of FIG. 6, a Q/P hardware encoder is shown decrementing its code point Z in response to an MPS event, with the interval size being adjusted to equal $[A(n-1)x(1-Q).]$. For an MPS event, the Q/P software encoder maintains the code point position and sets the interval size to $[A(n-1)x(1-Q).]$. For an LPS event, the Q/P hardware encoder maintains its code point position whereas the Q/P software encoder increments its code point position Z by $[A(n-1)x(1-Q)]$. For both Q/P encoders, the current interval $A(n-1)Q$ for an LPS event is set equal to Q.

Based on the conventions illustrated in FIG. 6, the encoding of a set of decision events is shown in FIG. 7 for each encoder. In particular, the following series of events is encoded: MPS, MPS, MPS, LPS, MPS, MPS, MPS, MPS, LPS, MPS, LPS, MPS. FIG. 7 illustrates the P/Q hardware (H) and software (S) code point movements. FIG. 8 illustrates the Q/P hardware (H) and software (S) code point movements for the same series of events as in FIG. 7. From FIG. 7 and FIG. 8 it is observed that, for a particular symbol ordering, the hardware code point and the software code point differ by the value of the current (final) interval A(n). It is also observed that the two code points converge with successive decision events.

Comparing FIG. 7 with FIG. 8, it is observed that two code points generated with inverted symbol ordering are readily related by the expression:

$$Z = (1 - \epsilon) - C - (Ax\delta - \epsilon)$$

where $\epsilon$ represents a possible pre-borrow and the $\delta$ represents a decision as to whether the final interval must be factored in. If pre-borrow is not required and the final interval need not be factored in, the expression simplifies to $$Z = 1 - C.$$

which is an alternate expression for the operation of inverter 208 (of FIG. 5). In general operation, inverter 208 applies the more detailed approach which accounts for possible final interval and pre-borrow factors.

II. ENCODING AND DECODING SUCCESSIVE EVENTS WITH FINITE PRECISION

To facilitate the description in this section, the following definitions are provided. Variable names, for the most part, have the same meaning.

Definitions

C = code stream; the pointer (i.e., code point) to the current interval.
$C_d$ = decoder code stream with base line adjusted.
X = the part of the code stream in the register and not shipped out.
Q(i) = estimated probability for an LPS event for the ith symbol coded.
$P_e(i)$ = estimated probability for an MPS event for the ith symbol coded.
A(i) = augend (or interval) for ith symbol.
$S_i$ = ith symbol
n(i) = cumulative renormalization count up to the coding of symbol $S_i$.
R(i) = renormalization factor for ith symbol.
$\epsilon_{condition}$ = equivalent of Kronecker delta function. (1 if condition true, 0 if false)
$\epsilon$ = smallest change possible for the current value of Q Given the above definitions, the following relationships apply:

$$P_e(i) = A(i) - (A(i)xQ_e(i))$$

$$R(i) = \frac{1}{2^{n(i)}}$$

$$\epsilon = R(i)2^{-12} \text{ for 12 bit precision.}$$

A. P/0 Hardware Encoder and Decoder

For P/Q symbol ordering, an optimal hardware encoder points to the bottom of the current interval and the code stream C is represented by the equation:

$$C = \sum_i R(i)A(i)Q_e(i)\delta_{S_i = M}$$

In words, the value of C is determined by examining each successive decision event (or symbol). If a subject symbol corresponds to an LPS event, the $Q_e$ value at the time of the subject symbol is multiplied by a renormalization factor. The renormalization factor relates to the fact that the interval size is maintained between prescribed limits, for example 0.5 and 1.0. That is, the interval size is represented by an "augend" (referred to as "A") which is adjusted in value to remain between pre-defined limits. When the augend value at an ith symbol—i.e., $A(i)$—falls below 0.5, it is doubled as often as necessary to bring it back into the prescribed limits. Reference to an interval A, or $A(i)$, takes into account the renormalization factor.

Each time a symbol is encoded, a renormalization is possible. To be sure, each time the interval size is set equal to $AxQ_e$ (which by definition is less than or equal to $A*P_e$ and hence less than or equal to $A*0.5$), the value of $A(i)$ is renormalized (multiplied by at least 2) to bring it within the limits.

In response to an MPS event, the size for the current interval $A(i)$ is initially set equal to $[A(i-1) \times (1-Q_e,)]$ which may or may not be less than 0.5; thus renormalization may or may not be required in the event of an MPS. The total number of times the current interval is renormalized is tallied and represented as $R(i)$, or as noted above $$R(i) = \frac{1}{2^{n(i)}}.$$

The renormalization factor ensures that C is changed in value (e.g., is doubled the same number of times) as is the interval. The value of C when symbol $S_i$ is coded is thus incremented for the P/Q hardware in the event of an MPS event, and the increment is determined by $Q_e$ values and the renormalization factors for all previous symbols.

The P/Q hardware decoder undoes the above process according to the equation:

$$C_c = C - \sum_i R(i) A(i) Q_e(i) \delta_{S_i = M}$$

$C_d$ is the code stream value after the effect of an event is removed.

The P/Q hardware decoder decodes an LPS if $C_d < A(i) Q_e(i)$.

B. P/Q Software Encoder and Decoder

The P/Q software encoder points to the top of each current interval. The software code stream C is determined by the equation:

$$C = A(0) - \sum_i R(i) A(i) P_e(i) \delta_{S_i = L}$$

The evaluation of C starts with an $A(0)$ value from which a sum is subtracted. Each addend of the sum corresponds to the product of A times the current P value times a renormalization factor for a previous LPS event.

Subtracting the final interval value $A(f)$ from C results in the value C derived as the P/Q hardware code stream.

A P/Q software decoder would follow the equation:

$$C_d = C + \sum_i R(i) A(i) P_e(i) \delta_{S_i = L}$$

However, the comparison needed to decode the LPS symbol is awkward:

$$C_d < A(0) - A(i) + A(i) \times Q_e(i)$$

Or, subtracting $A(0)$ from both sides of the relationship $$C_d - A(0) < -A(i) + A(i) \times Q_e(i)$$

Letting $C'_d = C_d - A(0)$, it is observed that:

$$C'_d < [-A(i) \times (1 - Q_e(i))]$$

Both $C_d$ and $-A(i) \times (1 - Q_e(i))$ are negative, but are always within $|A(i)|$ of 0. Therefore, the arithmetic for the decoder is fixed precision arithmetic. The software decoder is thus:
$T \leftarrow A \times Q_e$
$A \leftarrow A - T$
If $C'_d < A$
  (LPS decoded)
  $C_d \leftarrow C'_d - A$
  $A \leftarrow T$
  renormalize A and $C'_d$ else
(MPS decoded)
  renormalize A and $C_d$ if needed.
endif

C. Q/P Software Decoder

A preferred structure for decoding the code stream generated by P/Q software is set forth hereinbelow and corresponds to decoder 212 of FIG. 5. A code stream C is processed by the encoder 202 to form code stream C. The code stream C is inverted by inverter 208 to form Z according to the following expression which, it is noted, is analogous to the expressions previously noted for code inverting:

$$Z = A(0) - C - \epsilon$$

The code stream for the decoder 212 is then:

$$Z_d = Z - \sum_i R(i) A \times P_e(i) \delta_{S_i = L}.$$

$Z_d$ represents the code stream before an ith symbol was encoded. That is, the decoder subtracts a value from a current code stream Z to determine what the ith symbol was and what the code stream value $Z_d$ was before the encoding of the ith symbol.

The decoder decodes an MPS if $Z_d < A(i) - A(i) \times Q_e(i)$ and otherwise decodes the ith symbol as an LPS.

Stated otherwise, the decoding follows the process:
$T \leftarrow A \times Q_e$
$A \leftarrow A \times (1 Q_e)$
if $Z < A$
  (LPS decoded)
  $Z \leftarrow Z - A$
  $A \leftarrow T$
  renormalize A and Z else
(MPS decoded)
  renormalize A and Z if needed.
endif
It is noted that $A(0)$ is initialized to 1.00000 ...

When subtracting from 1, infinite precision is avoided by changing the 0 bits to 1 bits plus an addend:

$$\text{binary } 1.000000 \ldots = 0.111111 \ldots + \epsilon$$

In effect, a pre-borrow is applied. The significance of this pre-borrow is recognized in the following example. Suppose the $A(0)$ value is 1.00000 ... (binary). In making the subtraction $A(0)-C$ it is noted that the length of C is not fixed. If the length of C exceeds the fixed length of A(0), the subtraction will entail subtracting C from a register of 0 bits and a borrow would propagate that would not reach a 1 bit. Converting 1000 ... to 111...+, precludes the problem.

In addition, the pre-borrow moves the P/Q software code stream $\epsilon$ into the current interval for a P/Q hardware encoder. The $\epsilon$ in effect accounts for the fact that in the P/Q hardware encoder intervals extend from the lower bound of the interval up to but not including the upper bound of the interval whereas, for the P/Q software encoder, the interval is defined to include the upper bound but not the lower bound. For an interval of 0 to 1, the P/Q hardware encoder interval would extend from 0 to $1^-$ whereas the interval for the software encoder would be $0^+$ to 1. The P/Q hardware encoder points to 0 and the P/Q software encoder points to 1. To bring the two points into the same interval some value must be subtracted from the software code stream or added to the hardware code stream (or both). In this instance, $\epsilon$ is subtracted from the software results.

It is noted that the code inversion may be viewed as either part of the encoding process or part of the decoding process 1. or as a separate intermediate step. As shown in FIG. 7, the software encoding may proceed along a decrementing path with the final code stream value being inverted and then decoded by the Q/P (software) decoder. Or, equivalently, the software encoding may proceed along the incrementing path in FIG. 8 and may thereafter be decoded by the Q/P software decoder. These alternative paths are suggested in FIG. 5.

The interrelationship between the code stream $C^{alt}$ generated by either P/Q encoder as represented in FIG. 7 and the code stream $Z^{alt}$ of either Q/P encoder as represented in FIG. 8 is:

$$Z^{alt} = (1 - \epsilon) - C^{alt} - (A(f) \times \delta - \epsilon)$$

where $\epsilon$ pertains to a pre-borrow which converts 1.000 ... to 0.1111 ... $+\epsilon$ and where $\delta$ indicates whether or not the final range must be factored in.

III ENCODER AND DECODER REGISTERS

Referring to FIG. 9, a preferred memory register 300 for storing code stream information is shown. The register 300 includes 32 bits which are allocated as follows. Bits 31-24 represent 8 flag bits, the 31st bit representing a "sign" bit. Bits 23 and 22 are unassigned. Bit 21 is a receiver for a carry which may propagate. Bits 20 through 13 (identified as bbbbbbbb) represent the most recent previous 8-bit byte of code stream data. Every 8 shifts, bits 20 through 13 represent a byte that is about to be shipped to a buffer memory. In bit position 12 is a spacer bit which is provided for carry propagation. Bits 11 through 0 represent the most recent portion of code stream data. Bits 11 through 0 are referred to as the "fractional portion" of the code stream and bits 20 through 12 correspond to the "integer portion" of the code stream. The register 300 is referred to as the X register, and contains the latest coded portion of the code stream CS. Before the bits in the X register were encoded, thousands of bits may have previously been encoded. Those earlier bits moved through the fractional portion of the X register into the integer portion of the register, and from there into a buffer memory which stores up to a finite number of previous bytes. As desired, bytes from the buffer memory may be transferred to storage or may be transferred to another location at which decoding is performed.

In accordance with the invention, data is structured as bytes and is shipped as bytes. This is achieved by means of the flag bits. By initializing the 8 flag bits to 00000001 it is noted that the 1 bit shifts left as successive b bits shift into the integer portion of the register 300. When the leftmost flag bit becomes 1, the contents of the X register are considered "negative". On the next shift, the integer portion of the X register 300 is entered into buffer memory.

Preferably, buffer memory (not shown) is a memory which stores, for example, 256 bytes. A buffer pointer BP identifies the byte most recently entered into the buffer memory.

In addition to the X register, there is also an A register for storing the value of the current interval. As noted hereinabove, the current interval is maintained between prescribed limits, for example 0.5 and 1. The A register includes a twelve-bit "fractional" portion which is aligned with the fractional portion of the X register and also includes an integer portion.

The alignment of the fractional portions of the X register and the A register facilitates the various computations performed in up-dating the code stream. It is also again noted that each time the interval is renormalized to bring it back into limits, the code stream is similarly renormalized to retain the relative values thereof. The renormalization, it is recalled, simply involves some left shifts (i.e., multiplies by 2) if the interval size limits are set at 0.5 and 1.

After a code byte is set (and absent a CARRY), the contents of the X register 300 are ANDed with '1FFF' (in Hexadecimal notation) to remove code byte bits. Also, the X register is set to XOR '1 00 00 00' (Hexadecimal notation), ensuring that bit 24 (of the flag bits) is set to 1.

In FIG. 10, a 32-bit decoder register 400 used with a P/Q hardware implementation is shown. The bit allocations include: four leading zero bits followed by 12 "fraction" bits which are in turn followed by 8 new data bits. The least significant 8 bits correspond to flag bits. The register 400 may be segmented in various ways as a full word, half words, and bytes. The 12 bits of the fractional portion are aligned with the fractional bits of the augend stored in a decoder A register.

After a new data byte has been shifted into XC (bits 31 through 16), the new data is inverted into the higher bits of XNEW (bit 15 through bit 0) and XFLAG is reset to 1 unless a carry has occurred. That is, XNEW = −hex 'FF00' SLL B 8

XFLAG = 1

The above specification for XNEW results in a subtracting of the new byte from 'FF' bits.

When XFLAG the low order byte, becomes zero, a new compressed data byte is needed.

D. CARRY and BORROW

In the above review of encoders and decoders, it is observed that the only place where the code streams might differ is where a CARRY or BORROW occurs for a given P,Q convention.

At this point it is noted that CARRY's and BORROW's are provided at byte boundaries. The effect of any CARRY or BORROW thus does not propagate beyond the last shipped byte. Hence, the buffer pointer need never back up to earlier bytes, but may instead advance to point at successive bytes as each enters the buffer memory.

The problem of CARRY propagation arises when the code stream is up-dated by incrementing the value thereof and when one or more successive bytes of encoded data each comprise a sequence of 1 bits. In this event, an addition will result in a CARRY propagation. To avoid this situation, the present invention provides that a bit be stuffed in a byte to receive a CARRY that might be generated. For example, let there be a sequence of bytes $B_{n-1}$, $B_n$, $B_{n+1}$ where $B_{n-1}$ is in buffer memory, with the buffer pointer identifying byte $B_{n-1}$. Byte $B_n$ is in the integer portion of the X register and $B_{n+1}$ is in the fractional portion of the X register.

If the value of byte $B_n$ is 'FF' (in Hexadecimal notation), the next byte $B_{n+1}$ gets a stuffed bit at its leading (most significant bit) position. If $B_n$ and $B_{n+1}$ resulted respectively in 11111111 ('FF') and 11111111 ('FF'), the present invention would stuff a bit at the beginning of $B_{n+1}$ so that the new sequence of encoded data would be 11111111, 01111111, 1 . . . wherein the 0 bit is a stuffed bit for receiving a carry if required. When the decoder detects a byte of all 1 bits, it recognizes the next less significant bit as a stuffed bit and processes it accordingly to produce the proper code stream value. In the current embodiment two bits are stuffed. So the new sequence would be 11111111, 00 111111, 11 . . .

The problem of BORROW propagation arises when the code stream which can be decremented includes a byte of all 0 bits. For example, suppose that there are three sequential bytes $B_{n-1}$, $B_n$, $B_{n+1}$ wherein the middle byte is all 0's.

According to a first set of rules, a pre-borrow would be applied to byte $B_{n-1}$ reducing it by one. $B_n$ is converted to eight 1 bits. The remainder is included by inserting a stuffed bit at the 2nd leading bit position of byte $B_{n+1}$ so that the eight bits following $B_n$ include a zero (for control word purposes), and a stuffed bit plus 6 bits of encoded data. The data stream as transferred by the encoder is then:

$B_{n-1}-1$, 1111 1111 ,0b[leading six bits of $B_{n+1}$]

Any bits dropped off the $B_{n+1}$ byte segment are picked up in the next byte segment of data. The BORROW in effect has been changed to a CARRY by means of a The decoder, in any event, detects the stuffed bits as such and processes the stuffed bits as a CARRY.

Since the goal is to create a P/Q software code stream which is compatible with a P/Q hardware code stream that includes bit stuffing, the code stream must be generated subject to two constraints. First, any hexadecimal 'FF' must be followed by a stuffed bit. Otherwise, byte patterns which are illegal for the hardware decoder will be generated. Second, the code stream must be constructed such that whenever a borrow is needed from the present byte, it can —by definition—be taken. (The present byte is the byte which was transferred from the code register to the code buffer on the previous code byte cycle.) Since only one unit is borrowed, the only byte value which cannot be borrowed from is zero.

In general, the need for a borrow from the present byte is detected by setting a high order "preborrow" bit in the code register at the start of a new byte. For convenience, it is set in a bit position, P, which will become the sign bit when the next byte is ready to be written.

For example, with a 32-bit Code (X) register—see section III below—suppose the register contents are:

X register:
    00000000,P0000000, xxxxxxxx,xxxxxxxx
A register:
    000aaaaa,aaaaaaaa When the next byte is complete, the contents become:

X register:
    P0000000,nnnnnnnn, xxxxxxxx,xxxxxxxx
A register:
    000aaaaa,aaaaaaaa If the code register is positive (P=0), the preborrow has been used and a borrow is needed from the present byte. The borrow is therefore taken from the present byte before the new byte, nnnnnnnn, is transferred from the code register to the buffer. When the preborrow is used, the value in the code register is always larger than the A register and future borrows can be taken from the code register contents. If the code register is negative (P=1), no borrow is needed from the current byte and the unused preborrow, P, is removed.

The code (X) register is compared to the A register. If the code register is smaller, two things have been detected. First, the next byte to be shipped (nnnnnnnn) is zero. Second, a borrow from the current byte might be needed. A borrow is therefore taken from the current byte and propagated through the zero byte in the register. This converts the zero byte to 'FF'. After shipping this 'FF' to the code buffer and shifting the contents of the code register, two preborrows are set—one in the position which will become the sign bit, and the other in the 'carry' bit position for the next byte. Thus, if the code register is smaller than the A register, X register:
    00000000,P0000000,00Px,xxxx,xxxxxxxx
A register:
    000aaaaa,aaaaaaaa
and when the next byte is complete,
X register:
    P0000000,Pnnnnnnn,xxxxxxxx,xxxxxxxx
A register:
    00aaaaa,aaaaaaaa The hex 'FF' in the buffer triggers bit stuffing, so the preborrow bit is written into the stuff bit (carry receiver) position. An unused preborrow is thus equivalent to a hardware code stream carry.

If the code register is not smaller than the A register, the current contents of the code register are large enough to satisfy any borrow requirements. The current byte is checked, and if it is 'FF', bit stuffing is triggered. In this case, since no preborrow was required, the stuffed carry bit is always clear.

The sequence above satisfies all requirements; it creates a code stream which blocks borrow propagation, and which is compatible with hardware. If all zero bytes were simply converted to 'FF', a hardware decoder could decode the resulting code stream. However, the look-ahead to see if a borrow might be needed when the byte to be shipped is zero makes the resulting code stream identical to the hardware code stream. In effect, this look-ahead detects the existence of the 'FF' in the hardware code stream.

If it were desired, an entirely equivalent inverse bit stuffing following zero bytes could be effected, with hardware doing the look-ahead for the 'FF' pattern to see if an overflow to '00' might be possible. Such an operation would provide borrow blocking in a manner analogous to carry blocking described hereinabove.

IV. DESCRIPTION OF FLOWCHARTS

In the following flowcharts Q is defined, for convenience, as a fixed point fraction with 12 significant bits.

Other definitions applicable to the flowcharts are supplied below.

"A" is a 16 bit integer, but can be considered a binary fraction with the binary point positioned to provide 12 fractional bits and 4 integer bits. The three leading integer bits are always zero. The least significant integer bit is only non-zero at initialization for this embodiment.

$A \times Q_e$ represents the new LPS range. For a skew coder as described in the aforementioned Langdon article it would be $2^{**}-k$. Other characterizations may also be used in conformance with the present invention. In the flowcharts, the product $A \times Q_e$ is assumed to be a 32-bit precision multiply. The result is then shifted right 12 bits and the least significant 16 bits are used for the new LPS range.

LEN is the length of the buffer for the code stream. It is set to 256 bytes (an arbitrary but convenient choice). LEN could be set to 1.

BPST points to the start of the compressed data buffer.

BE points to the first byte beyond the compressed data buffer.

BP is the pointer to the current byte of compressed data.

B is the byte of compressed data pointed to by BP.

AMIN determines when renormalization is needed. For this disclosure AMIN is set to X'0800' (which is equivalent to 0.5). When A drops below 0.5, renormalization occurs.

BRW is the borrow flag in the inverted software version.

T is a temporary variable to save the newly calculated LPS range.

The variables X, XC, XNEW, and XFLAG conform to the definitions set forth hereinabove.

Figure 11:
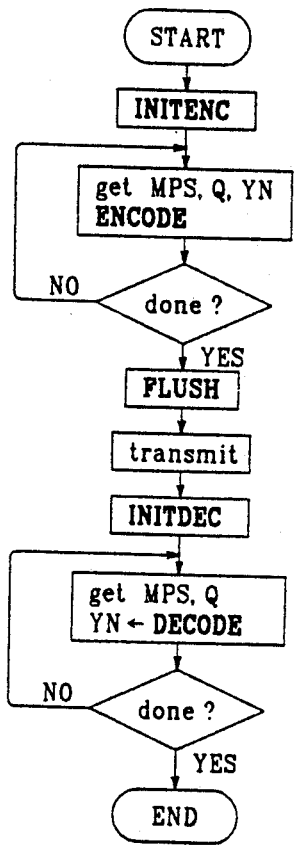
FIG. 11 is a flowchart showing the general operations performed according to a data compression/decompression system according to the present invention.

Referring to FIG. 11, a basic flowchart 500 of the present data compression-decompression invention is shown. After the START, the encoder is initialized according to the steps of INITENC. In INITENC, variables from the above listing are assigned initial values. From a model and probability generator (such as 106 of FIG. 1), MPS, Q, and YN data is received for encoding according to an ENCODE procedure. As long as incoming data is received, the encoding operation continues. When encoding is complete, a FLUSH program is invoked. The encoded data is transmitted (or transferred). Sometime after the transfer, the encoded data is normally to be decoded. The decoder is initialized by INITDEC and, given MPS and Q input data from a model and probability generator (see element 110 of FIG. 1), YN events are decoded with a DECODE procedure. Decoding continues until all YN events have been retrieved.

The component procedures of the general flowchart are divided into encoding-related procedures and decoding-related procedures and are discussed separately hereinbelow.

A. Encoder-Related Procedures

Figure 12:
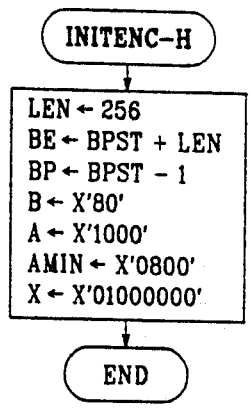
FIG. 12, FIG. 13 and FIG. 14 are flowcharts showing the initialization procedures for each of three different types of encoders.
Figure 13:
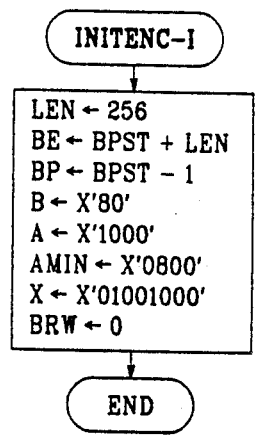
Figure 14:
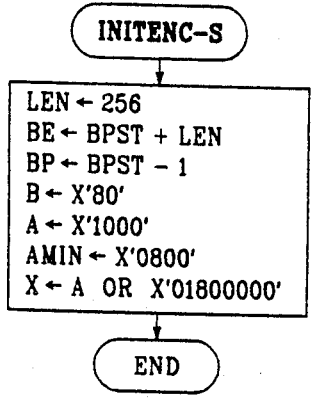

INITENC (FIG. 12, FIG. 13 and FIG. 14) does the initialization for the encoder.

Three versions of INITENC have been implemented according to whether the hardware version (−H) shown in FIG. 2, the inverted version (−I) shown in FIG. 4, or the software version (−S) shown in FIG. 3 is implemented. All versions initialize LEN to 256 bytes, point BE to the end of the compressed data buffer, and point BP to 1 byte before BPST, the actual start of the buffer to be sent. The pointer is updated before a byte is written; hence an offset of 1 is necessary. The byte B (addressed by BP) is initialized to '80' to guarantee that the special cases of B=0 or B='FF' will not be triggered for the first byte in the compressed data stream. The range A is initialized to '1000' and AMIN is initialized to half that value ('0800').

The differences between the versions appear in the initialization of X. All versions have the 8th msb set to 1 to flag when 8 compressed bits are ready. The inverted version has a pre-borrow in the 20th most significant bit, while the software version inserts it just after the flag. For the inverted version the borrow flag BRW is zeroed.

Figure 15:
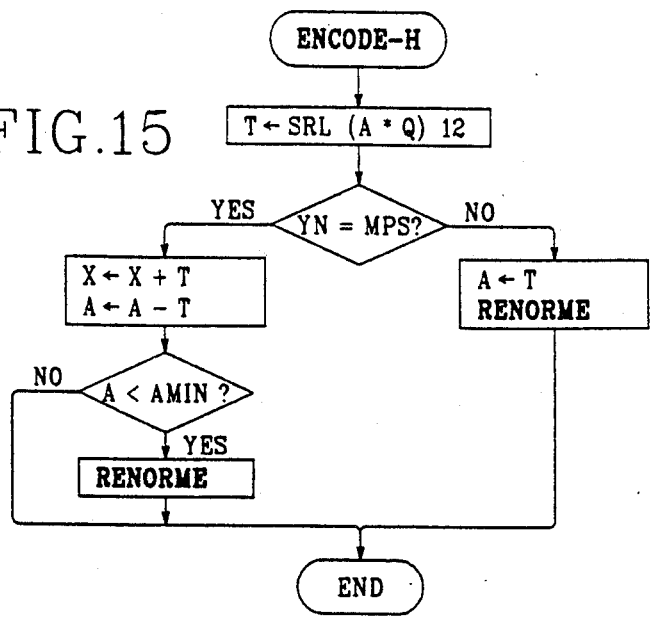
FIG. 15, FIG. 16 and FIG. 17 are each an illustration of encoding procedures for three disparate types of encoders.
Figure 16:
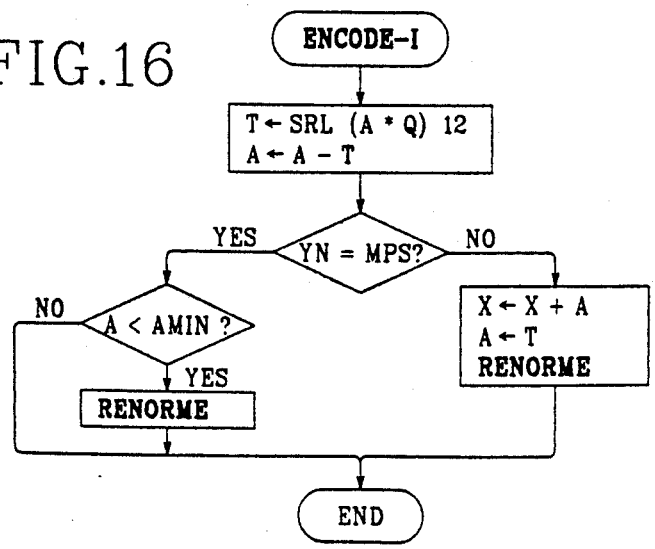
Figure 17:
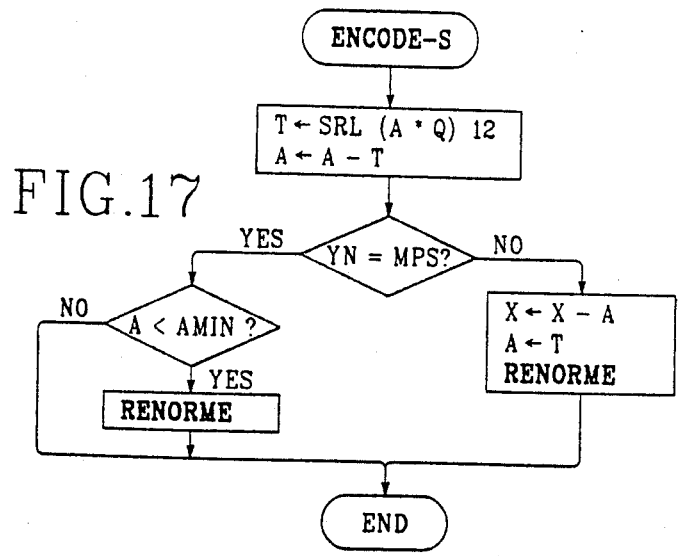

ENCODE (FIG. 15, FIG. 16 and FIG. 17) codes a yes/no decision for given MPS and Q inputs. The new LPS range is always calculated and temporarily saved in T. For these embodiments A and Q are fixed precision numbers with twelve bits beyond the binary point. After the multiplication, the result is truncated to 12 bits of precision.

Figure 18:
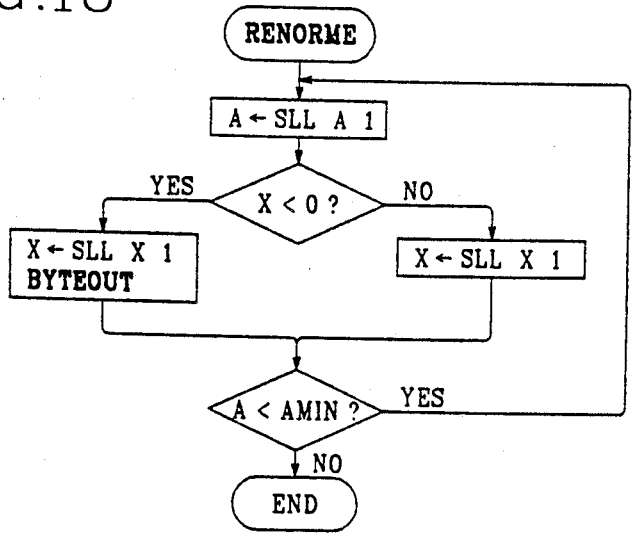
FIG. 18 is a flowchart showing how values for the current interval and the current code stream are similarly renormalized to hold the interval size for each decision above a minimum value AMIN.

On the MPS path, the hardware version will increase X by T and decrease A by T. The other two versions will only need to decrease A by T before the MPS test because the new MPS range is needed on both the MPS and the LPS path. A renormalization of A and X done in RENORME (FIG. 18) is necessary on the MPS path only if A is less than AMIN. The I and S versions must move X by the amount of the MPS range, although in different directions, on the LPS path. All versions reset A with the new LPS range before renormalization. Since A*Q is always less than AMIN, RENORME is always necessary on the LPS path. RENORME (FIG. 18) normalizes the A and X values one bit at a time. A is shifted first and then X is tested to see if the most significant bit is set. If so, the next shift of X removes that flag bit and a byte is output by BYTEOUT (see FIG. 19, FIG. 20 and FIG. 21). Otherwise X is just shifted one bit. This process is continued as long as A is less than AMIN.

BYTEOUT (FIG. 19, FIG. 20 and FIG. 21): The decoder expects every 'FF' byte to be followed immediately by two leading stuffed bits in the next byte. The leading bit will always be zero for compressed data. The second most significant bit will be the carry bit. A key part of this invention is for all three encoder versions to generate identical compressed data streams and therefore allow the hardware and software implementations to chose different, minimum-computation versions.

Figure 19:
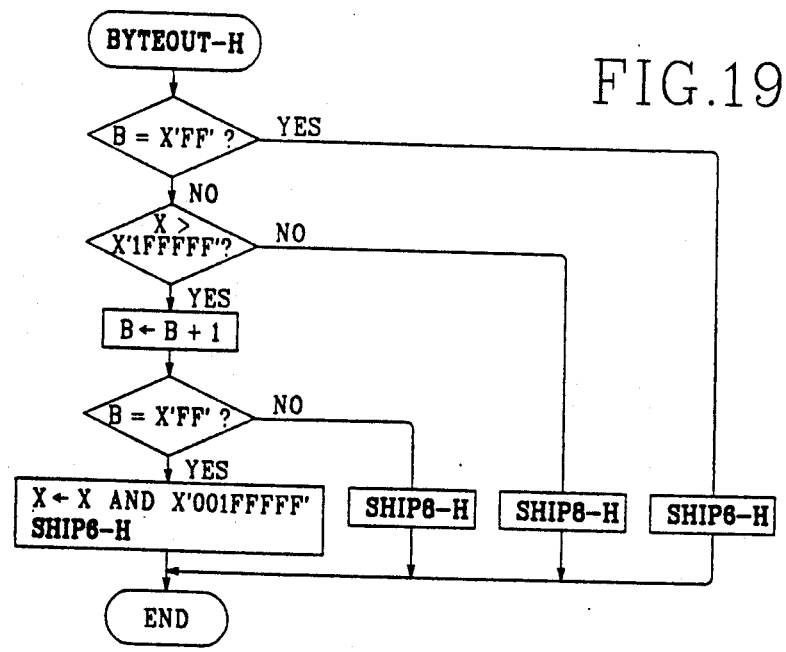
FIG. 19, FIG. 20 and FIG. 21 are each flowcharts of a BYTEOUT operation in which the number of data bits to be shipped out with each byte of data is determined based on possible CARRY or BORROW considerations.
Figure 22:
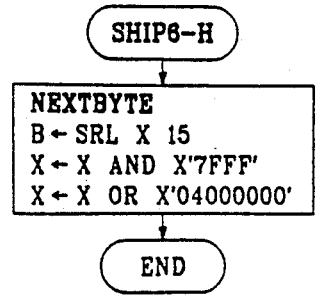
FIG. 22 through FIG. 29 are each flowcharts illustrating how bytes are to be shipped with 6 bits or 8 bits of data for a byte. The various figures reflect the differing types of encoders.
Figure 25:
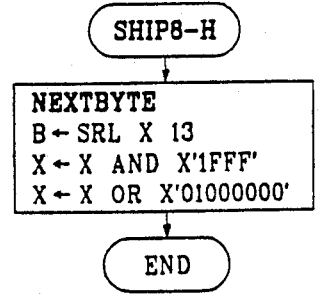

In FIG. 19 the hardware version first looks at the last byte B and immediately outputs only 6 data bits in SHIP6-H (FIG. 22) if B is 'FF'. Any carry will appear in the second most significant bit of the new byte. If B is less than 'FF', X is tested for a carry. That is, referring to FIG. 9, is the carry bit in position 21 set. If there is no carry, 8 bits can be output in SHIP8-H (FIG. 25). If there is a carry, the last byte B needs to be incremented by 1 and the result tested to see if it is now 'FF'. If so, the carry in X which has already been added to B must be cleared before outputting the next 6 bits. Otherwise, 8 bits may be output into the new byte.

Figure 20:
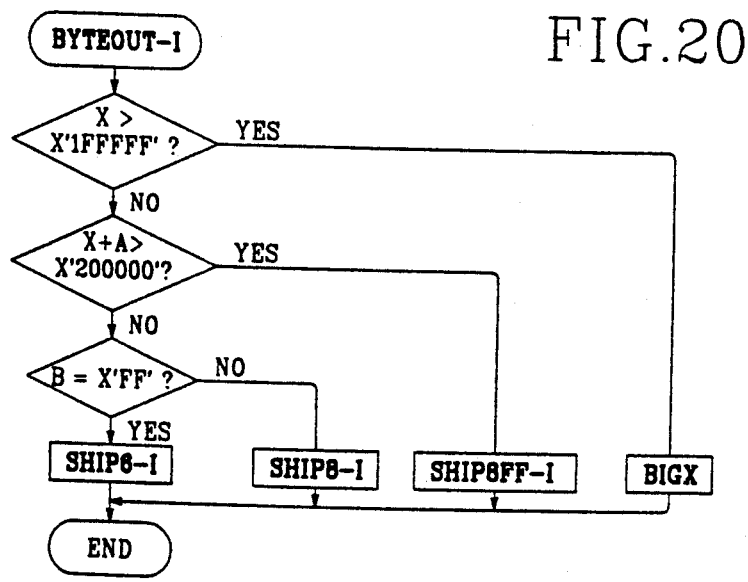
Figure 21:
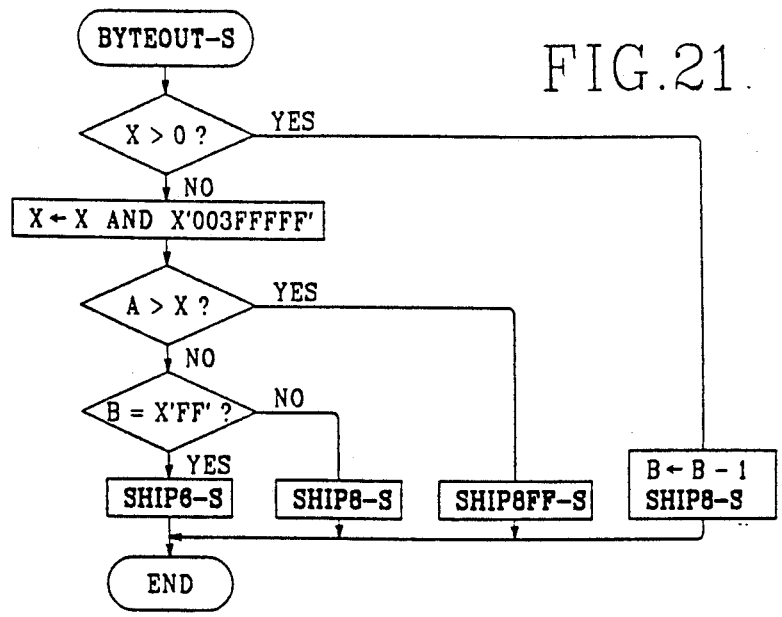
Figure 28:
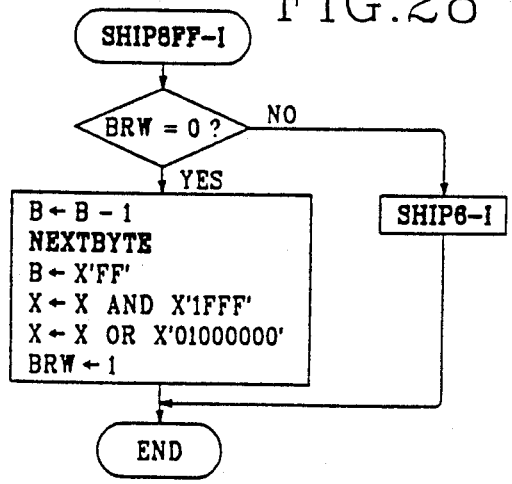
Figure 30:
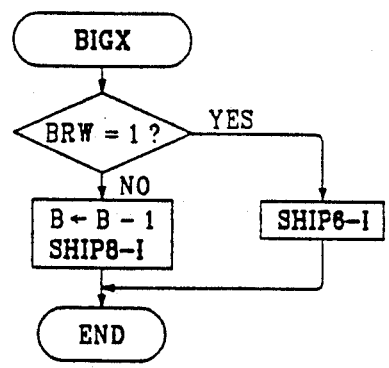
FIG. 30 is a flowchart illustrating a procedure to be followed when a specific type of BORROW situation arises.

In FIG. 20 the version of BYTEOUT for the inverted encoder first tests whether X is large enough to require a borrow from B. If so, it is handled in BIGX (FIG. 30). Otherwise, the sum of X and A is compared to the threshold for possible future borrowing to determine if SHIP8FF-I (FIG. 28) is the appropriate path. If not, then the current B determines whether 6 or 8 bits should be output.

Figure 24:
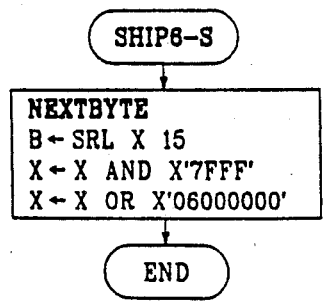
Figure 29:
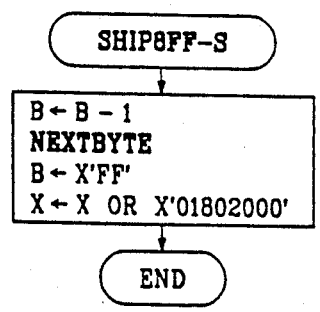

The software version BYTEOUT-S (FIG. 21) tests whether the X is positive. If X is positive, the borrow bit has been used and B must be decremented by 1 before outputting 8 bits. If the borrow bit is still set, it is cleared from X before A is compared to X. If X is smaller than A, a borrow could be needed in the future that would not be available if the new byte were output as zero. (A is at most '1FFF' so X has only zeros in the 8 output bits). SHIP8FF-S (FIG. 29) does the pre-borrow, converts the new byte to 'FF', and saves the borrowed bit into X. If B is 'FF', then only 6 bits are shipped by SHIP6-S (FIG. 24) instead of the 8 bits by SHIP8-S (FIG. 27).

Figure 31:
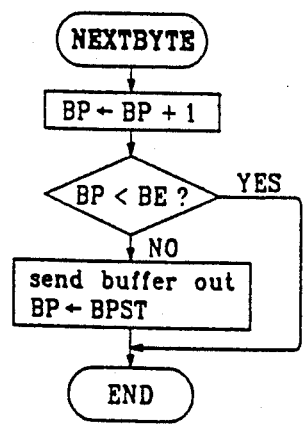
FIG. 31 is a flowchart showing how bites are entered into a buffer memory, with the buffer pointer moving with the storing of a new byte.

SHIP6-H (FIG. 22) increments the output byte pointer in NEXTBYTE (FIG. 31) and stores in the new B bits 22 to 15 from X. The leading bit is guaranteed to be zero. The second bit contains any carry. Only the trailing 15 bits are left in X before the flag is inserted at the 6th most significant bit. This causes the new byte to be output when 6 new bits are ready because 2 have been left in X. SHIP6-S (FIG. 24) is the same as SHIP6-H except that the borrow bit is set to immediately follow the flag bit.

Figure 23:
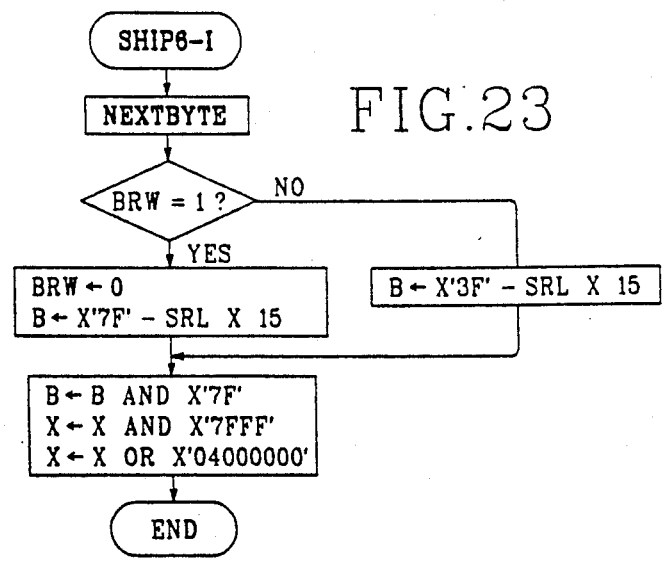

The inverted encoder has a more complicated process to output 6 bits as shown in SHIP6-I (FIG. 23) because the bits in X must be inverted. The output pointer is incremented by NEXTBYTE. If BRW is set, a borrow created the preceeding 'FF'. The 6 bits plus possible carry are then subtracted from 7 '1' bits and the BRW reset. If not, then only 6 '1' bits are used to invert the 6 bits as there can be no carry in X when the preceeding byte is 'FF'. The most significant bit in B is cleared and all but the 15 least significant bits of X cleared. The flag is then inserted in the 6th most significant position.

Figure 26:
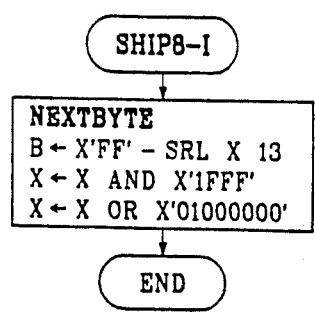
Figure 27:
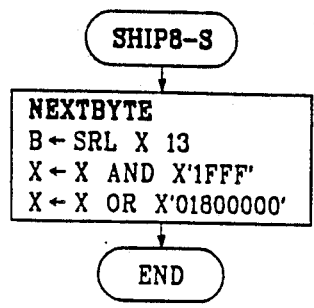

SHIP8 (as shown in FIG. 25, FIG. 26, and FIG. 27) is similar for all versions. After incrementing the pointer to the next output byte B, the 8 bits in X at bits 20–13 are stored at B. The inverted version first inverts these bits by subtracting from 'FF'. All but the 13 least significant bits are cleared in X and the flag is inserted at the 8th most significant bit. The software version also inserts a borrow bit after the flag.

The inverted encoder and software encoder versions have to guarantee than B can be decremented if necessary. So in SHIP8FF-I (FIG. 28) if the borrow bit is set (i.e. B is 'FF'), then 6 bits must be shipped. If BRW is 0, then B is decremented before incrementing the output pointer, the next byte is set to 'FF' and the BRW bit is set to be used for the next byte.

The software version SHIP8FF-S (FIG. 29) always decrements B before storing 'FF' in the next byte. The extra borrow is inserted into X where it will be output in the next byte as a carry if it is not needed.

BIGX (FIG. 30) is only needed for the inverted version. If the borrow bit is set, then 6 bits are shipped. Otherwise it is safe to decrement B and ship 8 bits.

NEXTBYTE (FIG. 31) moves BP to address the next byte in the compressed data buffer. If, after it is incremented, BP is not less than the end of the buffer, the buffer must be transferred and BP reset to the start of the buffer. It is assumed that BPST and BE will be appropriately changed if necessary.

Figure 32:
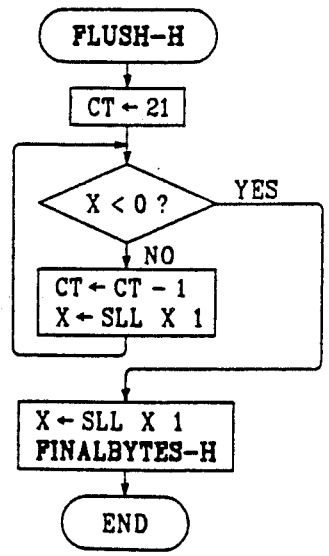
FIG. 32, FIG. 33 and FIG. 34 are each flowcharts showing how the X register containing data not yet shipped to the buffer memory is "flushed" after the last symbol has been encoded.
Figure 35:
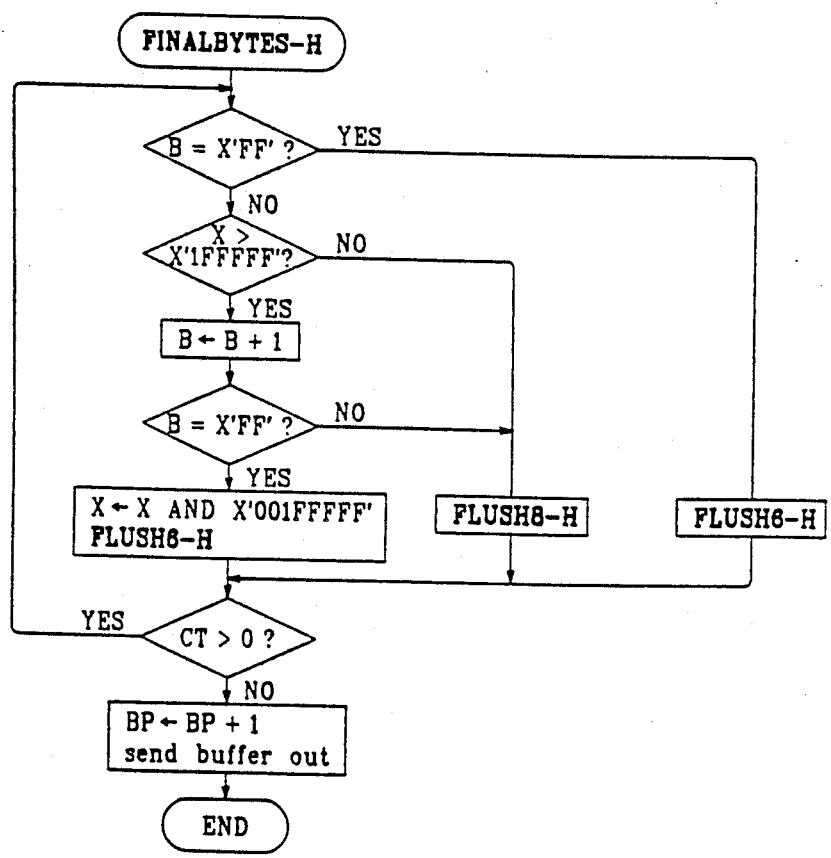
FIG. 35, FIG. 36 and FIG. 37 are each FINALBYTES flowcharts showing the latter portion of flushing out the bits from the X register.

After the final symbol has been coded, the 21 compressed data bits still in X needed to be flushed out. In FLUSH-H (FIG. 32) CT is initialized to 21 and decremented for each shift in X until the flag is in the most significant bit (making the sign of X negative). One more shift puts the output bits on a byte boundary. Then FINALBYTES-H (FIG. 35) can output these last bytes.

Figure 33:
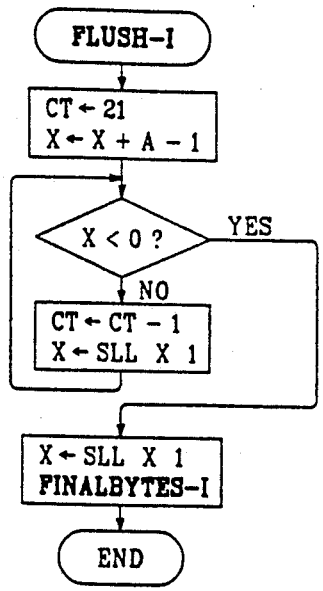
Figure 36:
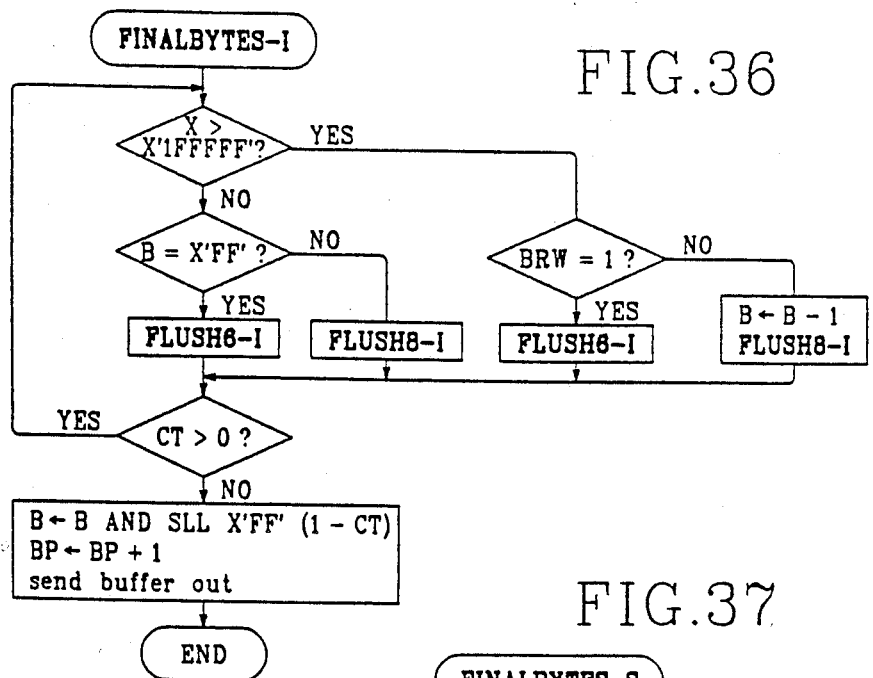

FLUSH-I (FIG. 33) must first add to X the final augend A range minus 1. The subtracted 1 corresponds to the ϵ subtraction described hereinabove. The bits are then byte aligned so that FINALBYTES-I (FIG. 36) can flush out the remaining bytes.

Figure 34:
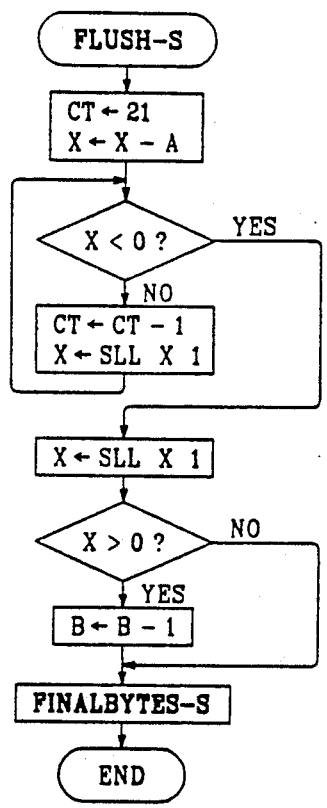
Figure 37:
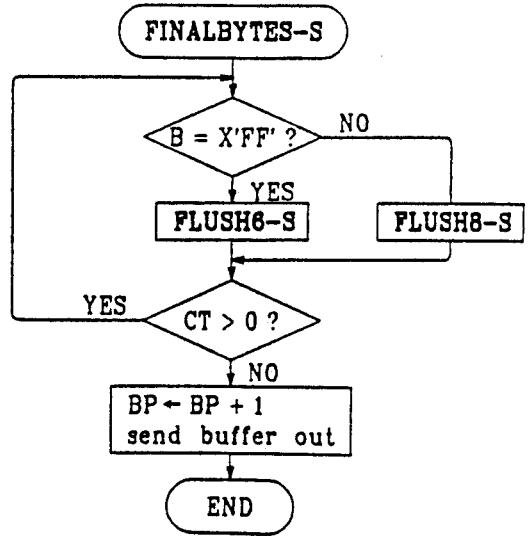

FLUSH-S (FIG. 34) moves X to the bottom of the interval which then positions it precisely to the value generated by the hardware version. After byte aligning the bits, if the borrow has been used the last byte must be decremented before outputting the final bytes in FINALBYTES-S (FIG. 37).

FINALBYTES-H (FIG. 35) goes through the same type of operations as BYTEOUT-H (FIG. 19) within a loop until all bits have been flushed out. The blocks FLUSH6-H and FLUSH8-H include an appropriate decrements of CT by 6 or 8 bits. When completed, BP is incremented past the last byte stored and the final buffer can be sent out.

FINALBYTES-I (FIG. 36) is similar to BYTEOUT-I except that X+A>'200000' cannot occur since A has been subtracted from X which was less than '200000'. The final byte may have extra trailing '1's due to the inversion process. These must be removed if identical code streams are desired.

The software version of FINALBYTES-S (FIG. 37) involves shipping 6 or 8 bits according to whether the preceding byte is 'FF'. The preborrow was already handled in FLUSH-S. Since X was moved to the bottom of the interval, the test with A in BYTEOUT-S is irrelevant.

Figure 38:
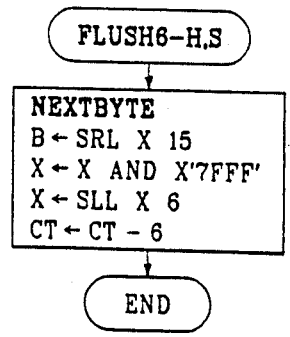
FIG. 38, FIG. 39, FIG. 40 and FIG. 41 are each flowcharts depicting further flushing steps taken in the FINALBYTES operation.
Figure 39:
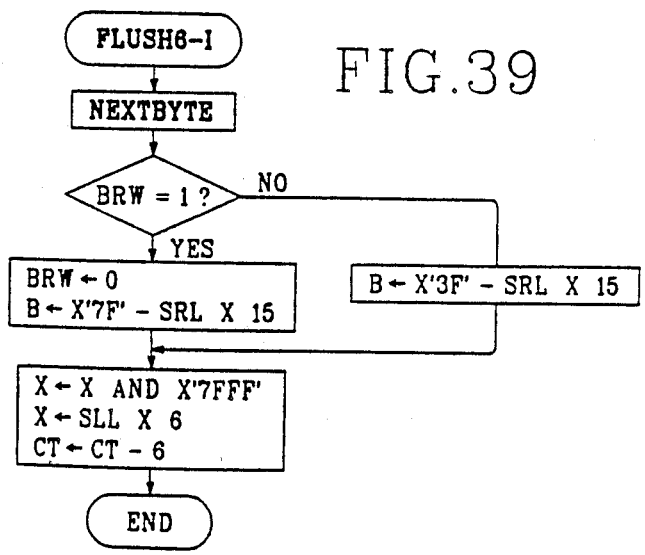

In FLUSH6-H,S (FIG. 38) 6 bits are output for both the hardware and software versions by pointing to the new byte, storing bits 22–15, saving only the 15 least significant bits of X, shifting X by 6, and decrementing CT by 6. In FLUSH6-I (FIG. 39) the inverted version also needs to invert those bits in X while handling the borrow appropriately.

Figure 40:
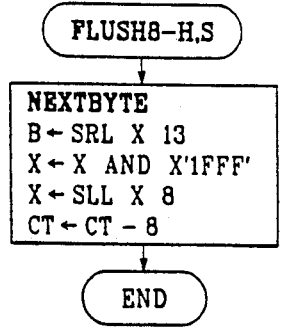
Figure 41:
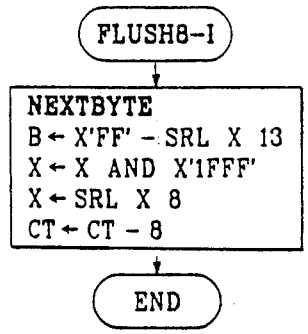

In FLUSH8-H,S (FIG. 40) 8 bits are output for both the hardware and software versions by pointing to the new byte, storing bits 20–13, saving only the 13 least significant bits of X, shifting X by 8 bits, and decrementing CT by 8. In FLUSH8-I (FIG. 41) the inverted version also needs to invert those 8 bits.

B Decoder-Related Procedures

Figure 42:
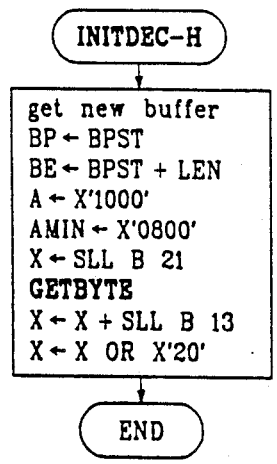
FIG. 42, FIG. 43 and FIG. 44 are flowcharts showing the initialization procedures for each of three different types of decoders.
Figure 43:
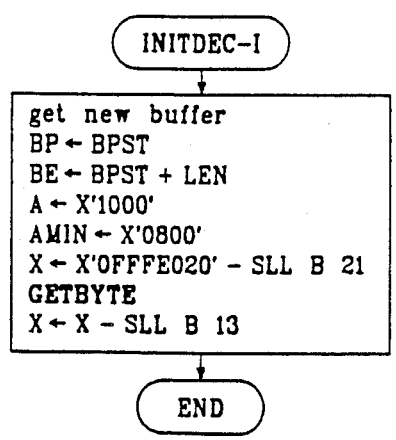

INITDEC (FIG. 42, FIG. 43, FIG. 44) does the initialization for the decoder. Three versions of INITDEC have been implemented according to whether the decoder relates to optimal hardware (H) or optimal software (S) or involves inverted symbol ordering (I). (See FIG. 5 decoders 210 through 216.) All decoder versions start by getting a new buffer of compressed data. This is assumed to initialize BPST and LEN. BE is pointed to the byte beyond the end of the compressed buffer and BP is initialized to point at the start of the buffer. The range A is initialized to '1000' for S-'1000'. AMIN is initialized to '0800', for hardware (H) and inverted (I) versions. For the software (S) version, AMIN is initially set to '0800'.

Figure 44:
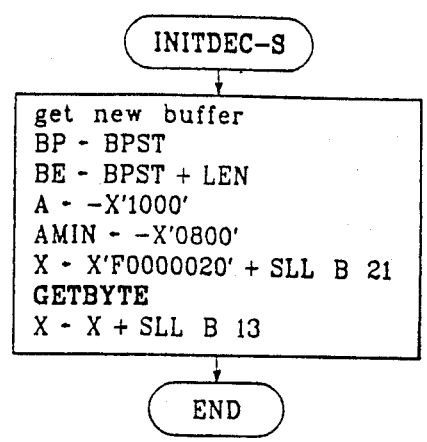

Differences between the versions also appear in the initialization of X. For INITDEC-H the first two bytes are positioned in bits 28-13. The leading bit of the compressed data stream is 0 so it is shifted into bit 28. The first byte is shifted into positions 28-21, the pointer BP is incremented in GETBYTE (FIG. 50) and then the second byte added into bits 20-13. The leading byte is guaranteed not to be 'FF' so no testing is needed. The decoding process only looks at the bits in XC, the high two bytes of X (bits 31-16). The flag indicating that a new byte is needed is positioned at bit 5 because of the leading 0 in the code stream. In INITDEC-I (FIG. 43) X is initialized with 15 '1' bits in positions 27-13 and bit 5 is set (which is the new byte needed flag). Then the first two bytes can be subtracted from bits 28-13. In FIG. 44 the software decoder INITDEC-S works in the interval from −1 to 0. A is initialized to −1. (−X'1000') the renormalization point is −0.5 represented as −X'8000'. The initial A is subtracted from 0 to set XC to 'F000'. The flag bit is set at the 5th bit and the first byte is added into bits 28 to 21. After incrementing the pointer to the next byte in GETBYTE, the second byte is added to X in bits 20 to 13.

Figure 45:
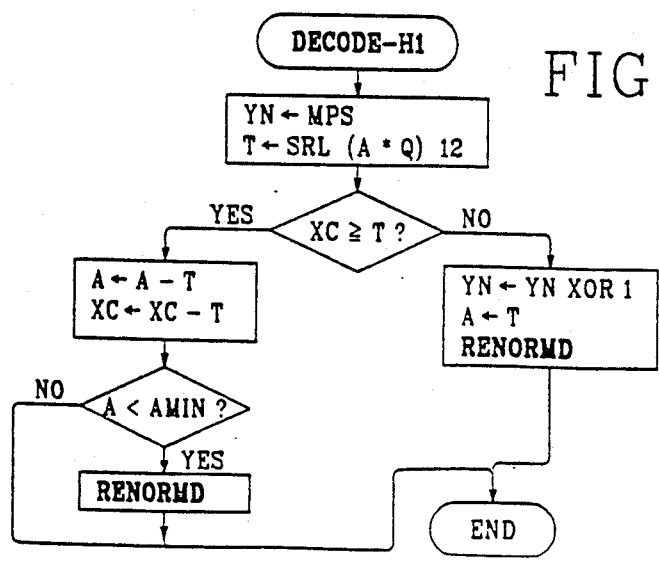
FIG. 45, FIG. 46, FIG. 47 and FIG. 48 are each an illustration of decoding procedures.
Figure 46:
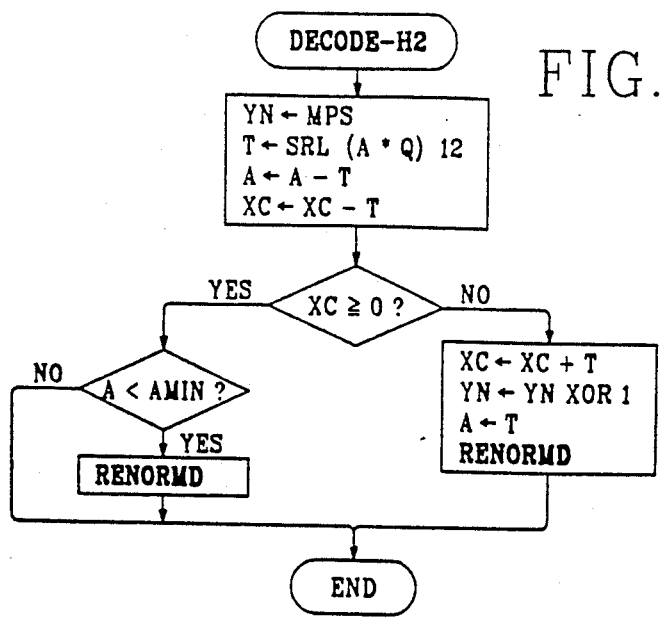
Figure 47:
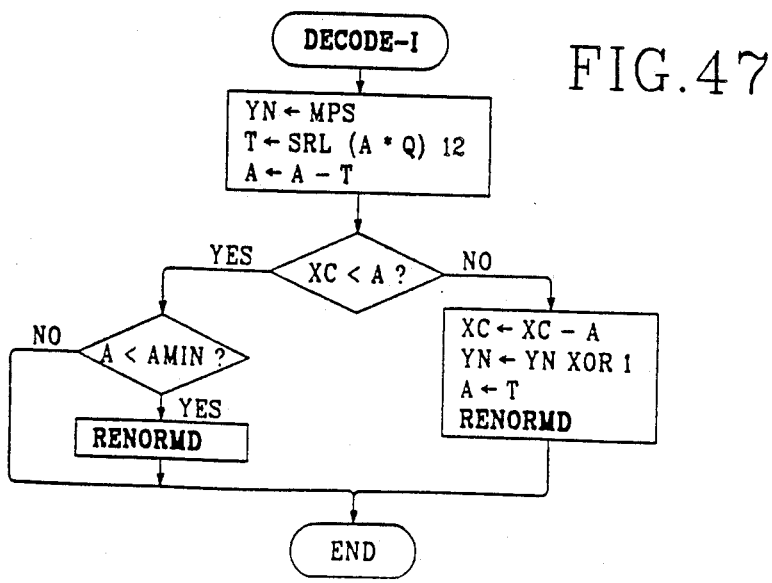
Figure 48:
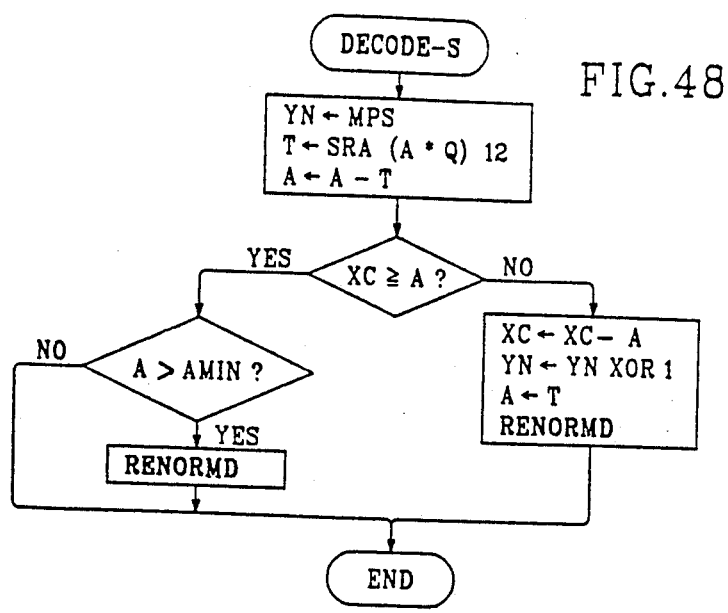
Figure 49:
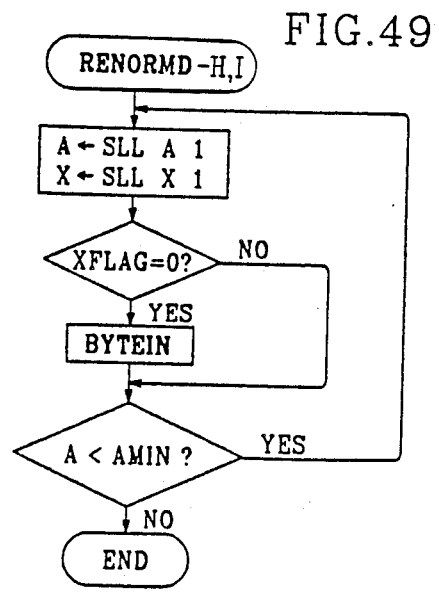
FIG. 49 and FIG. 50 are each a flowchart showing renormalization in the decoder.
Figure 50:
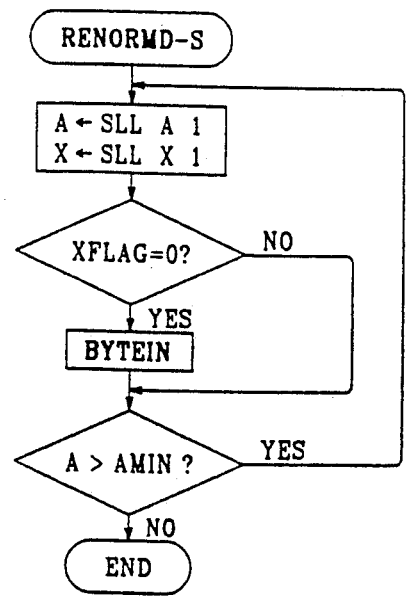

DECODE (FIG. 45, FIG. 46, FIG. 47, and FIG. 48) shows four implementations. FIG. 45 and FIG. 46 are alternate approaches for the hardware version (labeled −H1 and −H2) while FIG. 47 gives the inverted version (−I). In all cases YN is first set to the MPS symbol and the new LPS range calculated and temporarily saved in T. In DECODE-H1 (FIG. 45) if X is at least as big as T, this hardware version follows the MPS path and decrements both XC and A by T. The inverted version in DECODE-I (FIG. 47) decreases A by T before the test because this new MPS range is also needed on the LPS path. Similarly, the second hardware version DECODE-H2 (FIG. 46) predecrements both A and XC as if the MPS occurred. In many processors the subtract sets condition codes so that the following test against 0 for XC is preferred to a comparison with T. However, for DECODE-H2 the LPS path must restore XC before the inverting of YN, setting A to the LPS range (T), and renormalizing in RENORMD (FIG. 49). A renormalization is necessary on the MPS path only if A is less than AMIN. The inverted version must also decrease XC by the new MPS range A if XC is at least as big as A, indicative that an LPS had occurred. In FIG. 48, the decode procedure for software DECODE-S sets YN to the MPS value. Then the negative A is multiplied by $Q_e$ and arithmetically shifted right 12 bits before being saved in T. The negative T is subtracted from the negative A to decrease its magnitude. If XC is greater than or equal to A (i.e., the magnitude of XC is less than the magnitude of A),then an MPS was decoded. In that case, if negative A is greater or equal to the negative AMIN (i.e., the magnitude of A is less than the magnitude of AMIN), renormalization is done RENORMD (FIG. 50). If an LPS was decoded, then XC is moved toward negative 1 by adding the negative A. The YN value is converted to the LPS value and A is set to the LPS interval size. A renormalization is always needed. RENORMD (FIG. 49 and FIG. 50) normalizes the A and X values one bit at a time. In FIG. 49, both A and X are shifted and then XFLAG, the least significant byte of X is tested to see if any bits are set. If not, it is time to get a new byte. This process is continued as long as A is less than AMIN. In FIG. 50, The decoder renormalization process for the software version RENORMD-S is the same as for the hardware and inverted version except that the test for A compared to AMIN is reversed.

Figure 51:
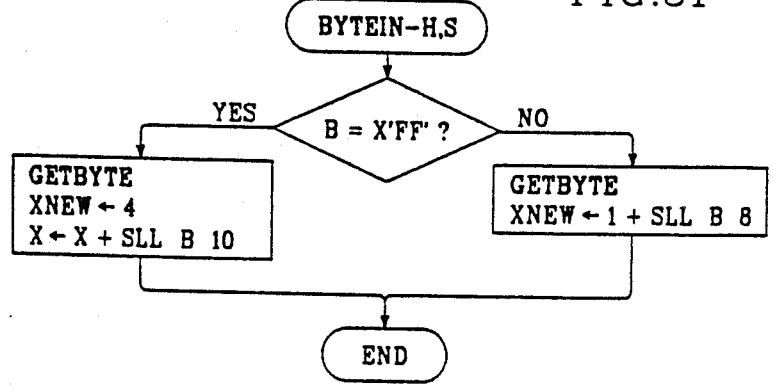
FIG. 51 and FIG. 52 are each flowcharts showing how respective types of decoders receive encoded bytes as input.
Figure 52:
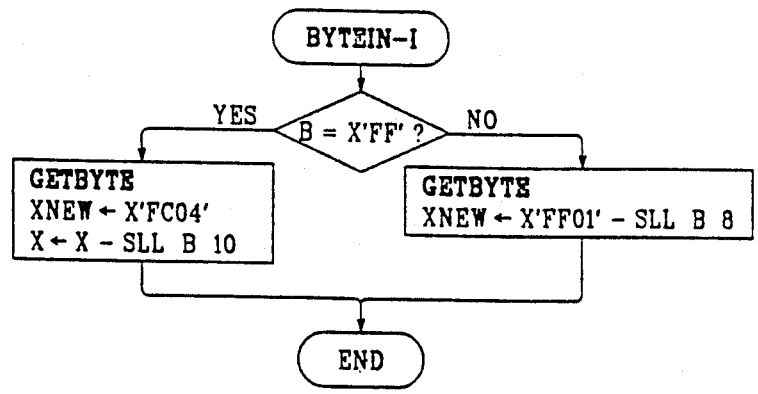
Figure 53:
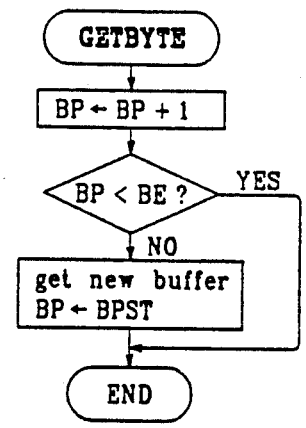
FIG. 53 is a flowchart showing the movement of a buffer pointer as bytes enter the buffer.

During the process of moving a new byte into X as shown in BYTEIN (FIG. 51 and FIG. 52) both versions have to test the last byte B to see if it was an 'FF' byte before GETBYTE (FIG. 53) moves to the next byte. The leading 2 bits in every byte following an 'FF' were inserted during encoding and must be appropriately accounted for during decoding. BYTEIN is the same for hardware and software decoding. In BYTEIN-H,S (FIG. 51), if there was an 'FF' XNEW—the two least significant bytes of X—is set to the value 4 to position the flag in XFLAG with a 2 bit shift. In this way, the flag recognizes that only 6 bits are in the data stream and 2 are included for CARRY purposes. The next byte which would normally be placed in the second least significant byte is shifted up an extra two bits and added to X. If there was no 'FF', XNEW is set as shown in the right path. The inverted version BYTEIN-I (FIG. 52) needs to preset six or eight '1' bits in the leading bits of XNEW in order to correctly invert the compressed data. The flag bit is set in the low order byte at the same time. The properly shifted new data is then subtracted from X or XNEW.

GETBYTE (FIG. 53) moves BP to address the next byte in the compressed data buffer. If, after it is incremented, BP is not less than the end of the buffer, a new buffer must be obtained and BP reset to the start of the buffer. It is assumed that BPST and BE will be appropriately changed if necessary.

The above-described procedures for a software encoder are implementable on a conventional mainframe computer, for example an IBM 3370, or in personal computers such as the IBM PC-XT or PC-AT. The procedures can be implemented in high level languages such as the Program Development System Language which uses forward Polish notation as specified hereinabove.

V. DESCRIPTION OF HARDWARE EMBODIMENT

Figure 54:
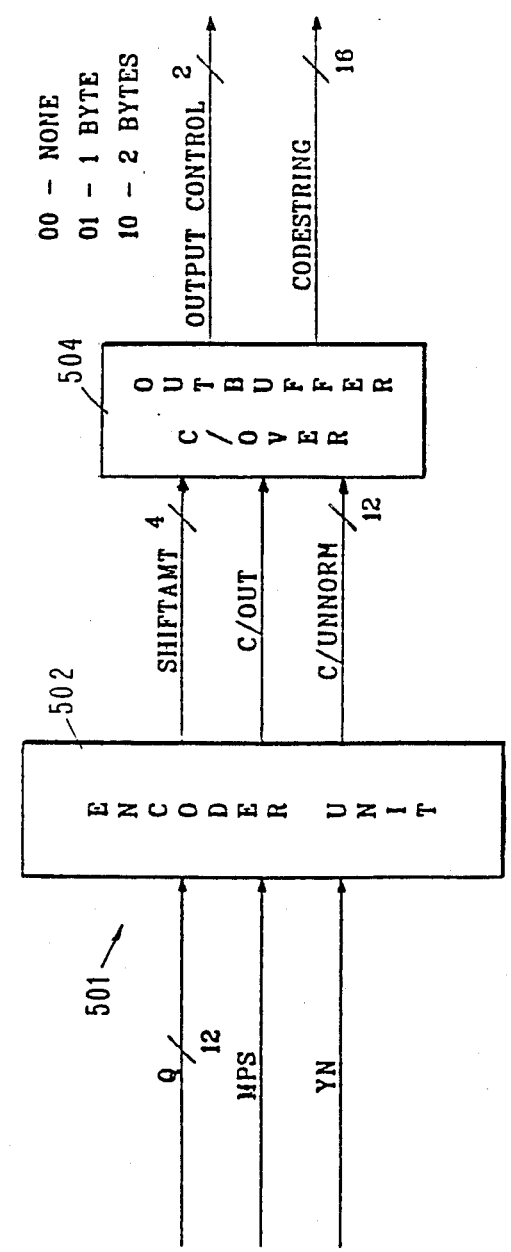
FIG. 54 through FIG. 57 are each block diagrams depicting a hardware encoder or portions thereof.

Referring to FIG. 54, a hardware encoder 501 is shown including an encoder unit 502 and a c/over (carry-over) outbuffer 504. The encoder unit 502 receives as input a Q value, an MPS sense bit, and a YN decision event input. In response, the encoder unit 502 generates a SHIFTAMT output which indicates how much to shift the code stream, a C/OUT output which represents a binary carry out value, and a C/UNNORM output which corresponds to a 13-bit unnormalized code stream. The outputs from the encoder unit 502 enter the c/over outbuffer 504 which provides as one output a compressed CODESTRING and provides, as another output, an OUTPUT CONTROL that specifies whether zero, one, or two bytes of compressed data are ready.

Figure 55:
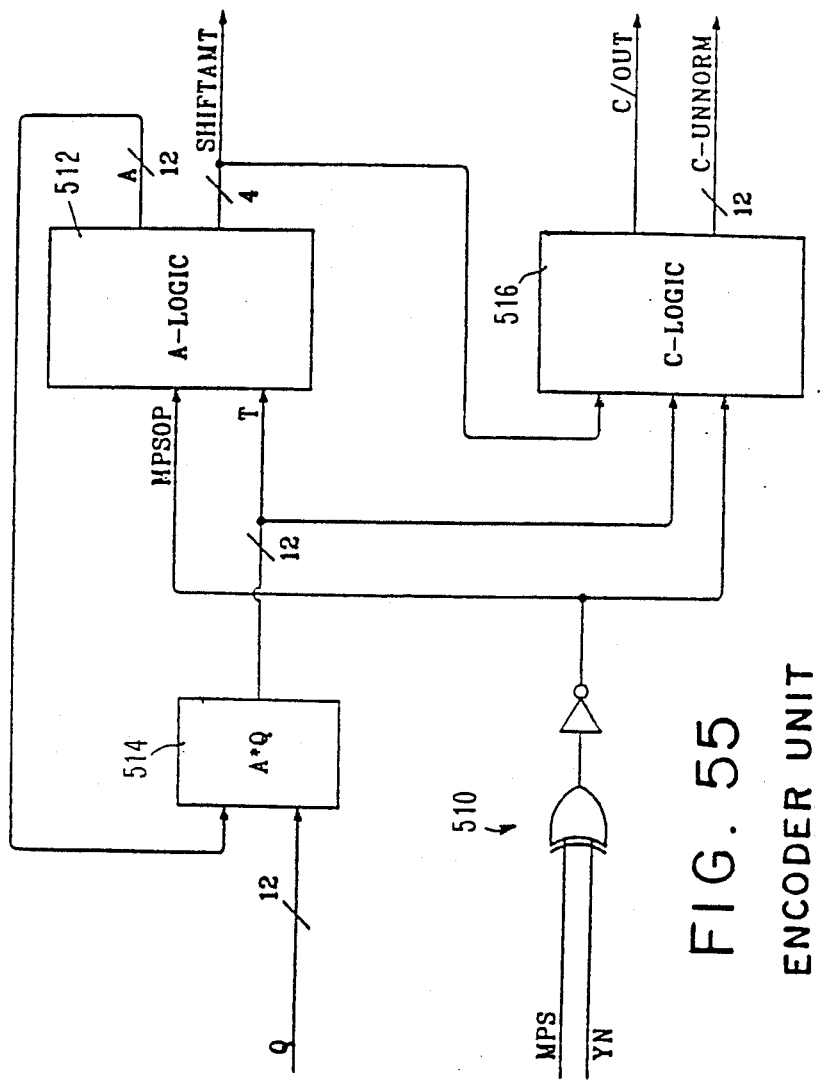

The encoder unit 502 is shown in detail in FIG. 55. The MPS and YN inputs pass through gates 510 and 512, the output therefrom entering A-LOGIC 512 which generates an appropriate A value for the current interval and the SHIFTAMT output. The A value is multiplied by Q in multiplier 514 to produce a value A*Q which stored as a temporary value T. (A*Q is used in determining the next value for A.) The gate output also enters C-LOGIC 516 which generates C/OUT and C/UNNORM.

Figure 56:
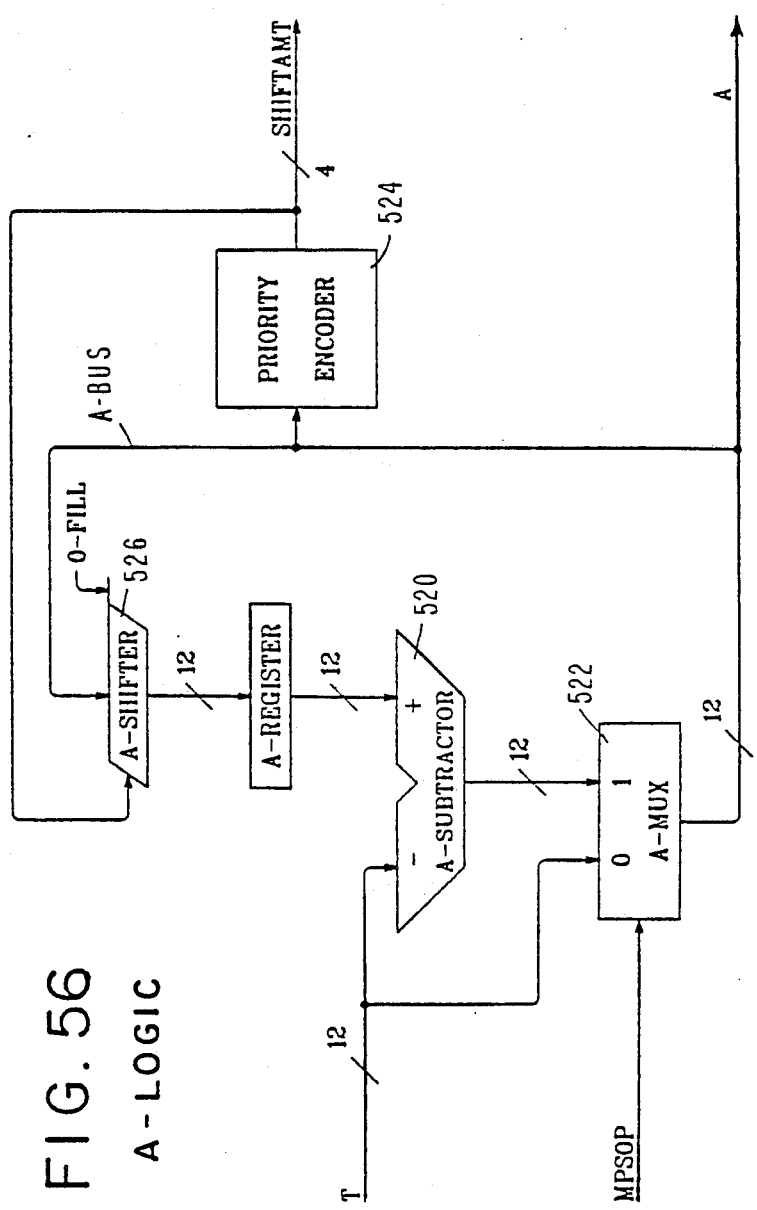

The A-logic 514 is shown in detail in FIG. 56. In accordance with FIG. 56, T (or A*Q) enters a subtractor 520 as a subtrahend and the current A value enters as the minuend. If there is an MPS being encoded according to an MPSOP input, the new value for A(new) is to be derived from A(old)-A*Q. If there is an LPS, A*Q exits the multiplexer 522. The multiplexer output enters a priority encoder 524. The priority encoder 524 counts the number of leading zeroes on the A-Bus and generates the amount of shift needed to restore a 1 to most significant bit of the A-Bus. When the A-Bus requires no re-normalization a SHIFTAMT output is zero. The SHIFTAMT output is transferred to an A-Shifter 526 which accomplishes the shift. The shifter output is then entered into the A-Register 528 which contains a value which serves as the next minuend value for subtractor 520.

Figure 57:
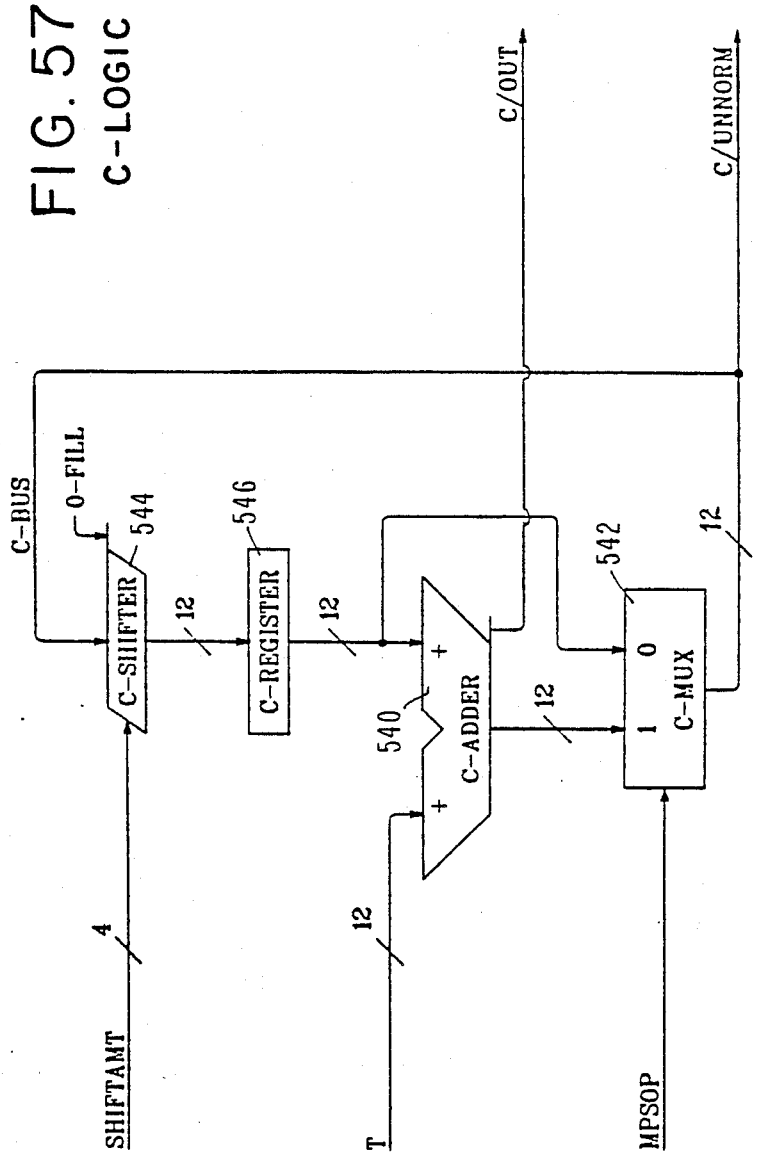

A detailed showing of the C-Logic 516 is found in FIG. 57. The value T (or A*Q) is one input and the previous value for the codestream is a second input to an adder 540. If there is an MPS event, the sum becomes C/UNNORM. If there is an LPS event, the codestream value remains unchanged (see multiplexer 542). The multiplexer output enters a C-Shifter 544 together with the SHIFTAMT value. The up-dated values for A and C are thus shifted by the same amount as appropriate. The output of the C-Shifter 544 enters the C-Register 546 which stores a most recent portion of the codestream. Zeroes are filled into the least significant bits during the shifting process as needed. The adder 540, it is noted, provides a C/OUT output indicative of a carry when one is produced.

FIG. 58 shows a general diagram of the decoder portion of a P/Q optimal hardware embodiment. Q and MPS enter a decoder unit 600 and the CODESTRING enters a C/IN input buffer 602.

The c/in inbuffer 602 accepts one or two bytes of compressed data and serializes that data so that the next 12 bits are available as INSTRING to the decoder unit 600. The extra carry bit C/IN is a further input to the decoder unit 600 and is normally 0 except when sometimes following an 'FF' byte (as discussed hereinabove).

The output of the decoder unit 600 is a YNOUT and SHIFTAMT which is fed back to the inbuffer 602. The detailed operation of the decoder unit 600 is illustrated in FIG. 59. In particular, C/IN, INSTRING, and MPS enter CD-Logic 604 which provides a first output indicating whether an MPS or LPS event is being decoded. The MPSOP output enters A-Logic 606 together with a T (or current A*Q) value from multiplier 608. As described above the appropriate new A value for a respective MPS or LPS event is generated and provided as input to the multiplier 608. In addition, a SHIFTAMT output is produced by the A-Logic 606 for input to the CD-Logic 604. The current T value also enters the CD-Logic 604. The CD-Logic 604 produces the YNOUT for the various entered inputs.

FIG. 60 details the operation of the CD-Logic 604. First, depending on whether there is a C/IN value or not, a T or T-1 value is multiplexed (see element 618) as a subtrahend to a subtractor 620. The minuend is the contents of a CD-Register 622. The subtractor 620 provides a difference value output and a borrow output as appropriate. The borrow suggests an MPS operation (MPSOP). C/IN is also an addend to an adder 624 with the CD-Register contents being the other addend. The sum from the adder 624 is multiplexed with the difference output from the subtractor 620, the former being the output of a multiplexer 626 if there is no borrow and the latter being output if there is a borrow. The multiplexed output is carried on a CD-Bus 628 and enters a CD-Shifter 630. The shift amount SHIFTAMT determines how much the CD-BUS value must be shifted before it will be ready to be stored in the CD-REGISTER. The least significant bits are filled with the most significant bits of INSTRING during shifting.

The decoder unit uses up to twelve bits from IN-STRING plus the carry input C/IN signal to decompress the data and retrieve the original YN data. In particular, the borrow output and the MPS sense value are inputs to a gate 634, the output from which indicates whether a YES or NO decision is to be decoded.

The hardware shown in FIG. 54 through FIG. 60 operates, in sum, according to requirements set forth in the above flowcharts and description. Further details of the hardware encoder 501 and decoder 600 are set forth in a patent application filed on even date herewith entitled an "Arithmetic Coding Encoder and Decoder System", invented by G. G. Langdon Jr., J. L. Mitchell, W. Pennebaker, and J. Rissanen.

While the invention has been described with reference to preferred embodiments thereof, it will be understood by those skilled in the art that various changes in form and details may be made without departing from the scope of the invention. For example, although the described embodiment is directed to a binary arithmetic coding environment, it is within the scope of the invention to provide arithmetic coding encoding and decoding—in either hardware or software-in a multisymbol environment in which decisions have more than two possible outcomes. That is, the present invention contemplates intervals being partitioned into more than two segments—e.g., an a, b, c, and d segment—wherein a first encoder would set the code point at the bottom of the current interval and would be subject only to incrementing (but not decrementing in value) whereas a second encoder would set the code point at the top of the current interval and would be subject only to decrementing (but not incrementing in value).

In such an environment, the determination of the augend value A and the code point value C (or Z) would be analogous to the binary coding environment. For example, suppose events a/b/c/d were positioned in descending order along a probability line interval where the respective probabilities are 0.5, 0.125, 0.25, and 0.125.

The decision events are rank-ordered—like the P/Q with binary symbols—to form segments along the number line Pa/Pb/Pc/Pd where $Pa \geq Pb \geq Pc \geq Pd$. The Q/P type encoder would code from the bottom, requiring many additions to generate a new code stream value. In particular, the code stream for a "hardware" Q/P type of encoder is represented by:

$$C_h = \sum_i R(i) A(i) \sum_j Q_c(j)$$

where N(i) is the event selected when coding the ith set of M events.

For a "software" type encoder which has an opposite rank ordering —i.e., $P_a \leq P_b \leq P_c \leq P_d$—the encoding follows the formula:

$$C_s = A(0) - \sum_i R(i)A(i) \sum_{j=N(i)+1} Q_e(j)$$

For the latter type of ordering, calculation of $C_s$ will on average involve fewer additions than does calculation of $C_h$. If, however, the $\Sigma Q_e(j)$ is already known, the two schemes become quite similar computationally.

Appendix I

Test Sequence for a small data set

A test file was generated using a random number generator such that the probability of 0's in the binary sequence was 0.1875. The actual number of zeros in the file was 48, as expected. The Q value was fixed at '0300' (0.1875 to 12 bit precision). The MPS value was fixed at 1. Therefore, when the symbol was a 1, an MPS was being coded.

In the following encoder tests, the event counter ec is followed by the YN symbol. The A and X values are given at the end of each coding cycle. The total number of renormalizations is listed under 'bits'. The "codebytes" are listed as they are output. Two bytes in that column list both a changed preceding byte along with the new byte.

Test data (in hexadecimal form):

EBB7FAFEBFEFD6C7F7FFF-
DFE7FFBDFF3FDFFFF97F6F5F-
7FEB97BDF76EDD7E7FF

For this file the coded bit count is 192, including the overhead to flush the final data. The actual compressed data stream for all three encoders is (in Hexadecimal form):

3EBE5A084D54-
CDAD9D6D187C8C022272CB2C72F0-
E5693D88

| ec | sym | a | x | bits | codebytes |
|---|---|---|---|---|---|
| Hardware encoder | | | | | |
| 0 | | 00001000 | 01000000 | 0 | |
| 1 | 1 | 00000d00 | 01000300 | 0 | |
| 2 | 1 | 00000a90 | 01000570 | 0 | |
| 3 | 1 | 00000895 | 0100076b | 0 | |
| 4 | 0 | 00000cd8 | 08003b58 | 3 | |
| 5 | 1 | 00000a70 | 08003dc0 | 3 | |
| 6 | 0 | 00000fa8 | 4001ee00 | 6 | |
| 7 | 1 | 00000cb9 | 4001f0ef | 6 | |
| 8 | 1 | 00000a57 | 4001f351 | 6 | |
| 9 | 1 | 00000867 | 4001f541 | 6 | |
| 10 | 0 | 00000c98 | 02002a08 | 9 | 3e |
| 11 | 1 | 00000a3c | 02002c64 | 9 | |
| 12 | 1 | 00000851 | 02002e4f | 9 | |
| 13 | 0 | 00000c78 | 10017278 | 12 | |
| 14 | 1 | 00000a22 | 100174ce | 12 | |
| 15 | 1 | 0000083c | 100176b4 | 12 | |
| 16 | 1 | 00000d62 | 2002f07e | 13 | |
| 17 | 1 | 00000ae0 | 2002f300 | 13 | |
| 18 | 1 | 000008d6 | 2002f50a | 13 | |
| 19 | 1 | 00000e5c | 4005ed64 | 14 | |
| 20 | 1 | 00000bab | 4005f015 | 14 | |
| 21 | 1 | 0000097b | 4005f245 | 14 | |
| 22 | 0 | 00000e38 | 02001228 | 17 | be |
| 23 | 1 | 00000b8e | 020014d2 | 17 | |
| 24 | 0 | 000008a8 | 08005348 | 19 | |
| 25 | 1 | 00000e12 | 1000a9ce | 20 | |
| 26 | 1 | 00000b6f | 1000ac71 | 20 | |
| 27 | 1 | 0000094b | 1000ae95 | 20 | |
| 28 | 1 | 00000f1a | 200160a6 | 21 | |
| 29 | 1 | 00000c46 | 2001637a | 21 | |
| 30 | 1 | 000009f9 | 200165c7 | 21 | |
| 31 | 1 | 0000081b | 200167a5 | 21 | |
| 32 | 0 | 00000c28 | 01001d28 | 24 | 59 |
| 33 | 1 | 000009e1 | 01001f6f | 24 | |
| 34 | 0 | 00000ed0 | 080ffb78 | 27 | |
| 35 | 1 | 00000c09 | 0800fe3f | 27 | |
| 36 | 1 | 000009c8 | 08010080 | 27 | |
| 37 | 1 | 00000fe6 | 100204aa | 28 | |
| 38 | 1 | 00000ceb | 100207a5 | 28 | |
| 39 | 1 | 00000a7f | 10020a11 | 28 | |
| 40 | 1 | 00000888 | 10020c08 | 28 | |
| 41 | 1 | 00000dde | 20041b42 | 29 | |
| 42 | 1 | 00000b45 | 20041ddb | 29 | |
| 43 | 1 | 0000029 | 20041ff7 | 29 | |
| 44 | 0 | 00000db8 | 01001fb8 | 32 | 5a 07 |
| 45 | 1 | 00000b26 | 0100224a | 32 | |
| 46 | 1 | 0000090f | 01002461 | 32 | |
| 47 | 1 | 00000eba | 02004c26 | 33 | |
| 48 | 1 | 00000bf8 | 02004ee8 | 33 | |
| 49 | 1 | 000009ba | 02005126 | 33 | |
| 50 | 1 | 00000fd0 | 0400a5f0 | 34 | |
| 51 | 0 | 00000bdc | 100297c0 | 36 | |
| 52 | 1 | 000009a3 | 100299f9 | 36 | |
| 53 | 0 | 00000e70 | 8014cfc8 | 39 | |
| 54 | 1 | 00000bbb | 8014d27d | 39 | |
| 55 | 1 | 00000988 | 8014d4b0 | 39 | |
| 56 | 0 | 00000e48 | 04002580 | 42 | 08 4d |
| 57 | 1 | 00000b9b | 0400282d | 42 | |
| 58 | 1 | 0000096e | 04002a5a | 42 | |
| 59 | 0 | 00000e20 | 200152d0 | 45 | |
| 60 | 0 | 00000a98 | 80054b40 | 47 | |
| 61 | 0 | 00000fe0 | 04005a00 | 50 | 54 |
| 62 | 1 | 00000ce6 | 04005cfa | 50 | |
| 63 | 1 | 00000a7b | 04005f65 | 50 | |
| 64 | 1 | 00000884 | 0400615c | 50 | |
| 65 | 1 | 00000dd8 | 0800c5e8 | 51 | |
| 66 | 1 | 00000b40 | 0800c880 | 51 | |
| 67 | 1 | 00000924 | 0800ca9c | 51 | |
| 68 | 1 | 00000edc | 100198a4 | 52 | |
| 69 | 0 | 00000b24 | 40066290 | 54 | |
| 70 | 1 | 0000090e | 400664a6 | 54 | |
| 71 | 1 | 00000eb8 | 800cccb0 | 55 | |
| 72 | 1 | 00000bf6 | 800ccf72 | 55 | |
| 73 | 1 | 000009b8 | 800cd1b0 | 55 | |
| 74 | 1 | 00000fcc | 01000704 | 56 | cd |
| 75 | 1 | 00000cd6 | 010009fa | 56 | |
| 76 | 1 | 00000a6e | 01000c62 | 56 | |
| 77 | 1 | 0000087a | 01000e56 | 56 | |
| 78 | 1 | 00000dc8 | 02001fd8 | 57 | |
| 79 | 1 | 00000b33 | 0200226d | 57 | |
| 80 | 1 | 0000091a | 02002486 | 57 | |
| 81 | 1 | 00000ecc | 04004c74 | 58 | |
| 82 | 1 | 00000c06 | 04004f3a | 58 | |
| 83 | 1 | 000009c5 | 0400517b | 58 | |
| 84 | 1 | 00000fe2 | 0800a69e | 59 | |
| 85 | 1 | 00000ce8 | 0800a998 | 59 | |
| 86 | 1 | 00000a7d | 0800ac03 | 59 | |
| 87 | 0 | 00000fb8 | 40056018 | 62 | |
| 88 | 1 | 00000cc6 | 4005630a | 62 | |
| 89 | 1 | 00000a61 | 4005656f | 62 | |
| 90 | 1 | 0000086f | 40056761 | 62 | |
| 91 | 1 | 00000db6 | 800ad1ea | 63 | |
| 92 | 1 | 00000b24 | 800ad47c | 63 | |
| 93 | 1 | 0000090e | 800ad692 | 63 | |
| 94 | 1 | 00000eb8 | 01001088 | 64 | ad |
| 95 | 1 | 00000bf6 | 0100134a | 64 | |
| 96 | 0 | 000008f8 | 04004d28 | 66 | |
| 97 | 0 | 00000d70 | 20026940 | 69 | |
| 98 | 1 | 00000aeb | 20026bc5 | 69 | |
| 99 | 1 | 000008df | 20026dd1 | 69 | |
| 100 | 1 | 0000ee6c | 4004def4 | 70 | |
| 101 | 1 | 00000bb8 | 4004e1a8 | 70 | |
| 102 | 1 | 00000986 | 4004e3da | 70 | |
| 103 | 1 | 00000f7a | 8009cb46 | 71 | |
| 104 | 1 | 00000c94 | 8009ce2c | 71 | |
| 105 | 1 | 00000a39 | 8009d087 | 71 | |
| 106 | 1 | 0000084f | 8009d271 | 71 | |
| 107 | 0 | 00000d82 | 010007fe | 72 | 9d |
| 108 | 1 | 00000afa | 01000a86 | 72 | |

| ec | sym | a | x | bits | codebytes | ec | sym | a | x | bits | codebytes |
|---|---|---|---|---|---|---|---|---|---|---|---|
| 109 | 1 | 000008ec | 01000c94 | 72 | | 190 | 1 | 00000a8e | 1000e332 | 124 | |
| 110 | 0 | 00000d60 | 080064a0 | 75 | | 191 | 1 | 00000894 | 1000e52c | 124 | |
| 111 | 1 | 00000ade | 08006722 | 75 | 5 | 192 | 0 | 00000cd8 | 80072960 | 127 | |
| 112 | 1 | 000008d5 | 0800692b | 75 | | 193 | 1 | 00000a70 | 80072bc8 | 127 | |
| 113 | 1 | 00000e5c | 1000d5a4 | 76 | | 194 | 0 | 00000fa8 | 04005e40 | 130 | 72 |
| 114 | 1 | 00000bab | 1000d885 | 76 | | 195 | 1 | 00000cb9 | 0400612f | 130 | |
| 115 | 0 | 000008c0 | 40036154 | 78 | | 196 | 1 | 00000a57 | 04006391 | 130 | |
| 116 | 1 | 00000e38 | 8006c5f0 | 79 | 10 | 197 | 1 | 00000867 | 04006651 | 130 | |
| 117 | 1 | 00000b8e | 8006c89a | 79 | | 198 | 0 | 00000c98 | 20032c08 | 133 | |
| 118 | 1 | 00000964 | 8006cac4 | 79 | | 199 | 0 | 00000970 | 800cb020 | 135 | |
| 119 | 1 | 00000f44 | 0100190c | 80 | 6c | 200 | 1 | 00000f56 | 010003ca | 136 | cb |
| 120 | 1 | 00000c68 | 01001be8 | 80 | | 201 | 0 | 00000b80 | 04000f28 | 138 | |
| 121 | 1 | 00000a15 | 01001e3b | 80 | | 202 | 1 | 00000958 | 04001150 | 138 | |
| 122 | 1 | 00000832 | 0100201e | 80 | 15 | 203 | 1 | 00000f30 | 08002620 | 139 | |
| 123 | 1 | 00000d52 | 0200434e | 81 | | 204 | 1 | 00000c57 | 080028f9 | 139 | |
| 124 | 1 | 00000ad3 | 020045cd | 81 | | 205 | 1 | 00000a07 | 08002b49 | 139 | |
| 125 | 0 | 0000081c | 08011734 | 83 | | 206 | 0 | 00000f08 | 40015a48 | 142 | |
| 126 | 0 | 00000c28 | 4008b9a0 | 86 | | 207 | 1 | 00000c37 | 40015d19 | 142 | |
| 127 | 1 | 000009e1 | 4008bbe7 | 86 | | 208 | 1 | 000009ed | 40015f63 | 142 | |
| 128 | 1 | 00000807 | 4008bdc1 | 86 | 20 | 209 | 1 | 00000811 | 4001613f | 142 | |
| 129 | 1 | 00000d0c | 80117e84 | 87 | | 210 | 1 | 00000dcc | 8002c584 | 143 | |
| 130 | 1 | 00000a9a | 801180f6 | 87 | | 211 | 0 | 000009d4 | 02001610 | 145 | 2c |
| 131 | 1 | 0000089e | 801182f2 | 87 | | 212 | 1 | 00000ffa | 04002fce | 146 | |
| 132 | 1 | 00000e02 | 0100091e | 88 | 6d 18 | 213 | 1 | 00000cfc | 040032cc | 146 | |
| 133 | 1 | 00000b62 | 01000bbe | 88 | | 214 | 1 | 00000a8d | 0400353b | 146 | |
| 134 | 1 | 00000940 | 01000de0 | 88 | | 215 | 1 | 00000893 | 04003735 | 146 | |
| 135 | 0 | 00000de0 | 08006f00 | 91 | 25 | 216 | 1 | 00000df0 | 080071a0 | 147 | |
| 136 | 1 | 00000b46 | 0800719a | 91 | | 217 | 0 | 00000a74 | 2001c680 | 149 | |
| 137 | 1 | 00000929 | 080073b7 | 91 | | 218 | 1 | 0000087f | 2001c875 | 149 | |
| 138 | 1 | 00000ee4 | 1000eadc | 92 | | 219 | 1 | 00000dd0 | 40039418 | 150 | |
| 139 | 1 | 00000c1a | 1000eda6 | 92 | | 220 | 1 | 00000b39 | 400396af | 150 | |
| 140 | 1 | 000009d6 | 1000efea | 92 | | 221 | 0 | 00000868 | 01001abc | 152 | 72 |
| 141 | 1 | 00000ffc | 2001e384 | 93 | 30 | 222 | 1 | 00000daa | 0200389e | 153 | |
| 142 | 1 | 00000cfd | 2001e683 | 93 | | 223 | 1 | 00000b1b | 02003b2d | 153 | |
| 143 | 1 | 00000a8e | 2001e8f2 | 93 | | 224 | 0 | 00000854 | 0800ecb4 | 155 | |
| 144 | 1 | 00000894 | 2001eaec | 93 | | 225 | 1 | 00000d8a | 1001dc86 | 156 | |
| 145 | 1 | 00000df2 | 4003d90e | 94 | | 226 | 1 | 00000b01 | 1001df0f | 156 | |
| 146 | 1 | 00000b55 | 4003dbab | 94 | | 227 | 1 | 000008f1 | 1001e11f | 156 | |
| 147 | 1 | 00000936 | 4003ddca | 94 | | 228 | 0 | 00000d68 | 800f08f8 | 159 | |
| 148 | 1 | 00000ef8 | 8007bf08 | 95 | 35 | 229 | 1 | 00000ae5 | 800f0b7b | 159 | |
| 149 | 1 | 00000c2a | 8007c1d6 | 95 | | 230 | 1 | 000008db | 800f0d85 | 159 | |
| 150 | 1 | 000009e3 | 8007c41d | 95 | | 231 | 0 | 00000d48 | 04006c28 | 162 | f0 |
| 151 | 1 | 00000809 | 8007c5f7 | 95 | | 232 | 1 | 00000acb | 04006ea5 | 162 | |
| 152 | 1 | 00000d10 | 01000ef0 | 96 | 7c | 233 | 1 | 000008c5 | 040070ab | 162 | |
| 153 | 1 | 00000a9d | 01001163 | 96 | | 234 | 1 | 00000e42 | 0800e49e | 163 | |
| 154 | 0 | 00000fe8 | 08008b18 | 99 | 40 | 235 | 0 | 00000ab0 | 20039278 | 165 | |
| 155 | 0 | 00000bec | 20022c60 | 101 | | 236 | 1 | 000008af | 20039479 | 165 | |
| 156 | 1 | 000009b0 | 20022e9c | 101 | | 237 | 0 | 00000d00 | 010003c8 | 168 | e5 |
| 157 | 0 | 00000c88 | 010014e0 | 104 | 8b | 238 | 1 | 00000a90 | 01000638 | 168 | |
| 158 | 1 | 00000bcf | 01001799 | 104 | | 239 | 1 | 00000895 | 01000833 | 168 | |
| 159 | 1 | 00000999 | 010019cf | 104 | | 240 | 1 | 00000df4 | 0200139c | 169 | |
| 160 | 1 | 00000f9a | 02003736 | 105 | 45 | 241 | 1 | 00000b57 | 02001639 | 169 | |
| 161 | 1 | 00000cae | 02003a22 | 105 | | 242 | 1 | 00000937 | 02001859 | 169 | |
| 162 | 1 | 00000a4e | 02003c82 | 105 | | 243 | 1 | 00000efa | 04003426 | 170 | |
| 163 | 1 | 00000860 | 02003e70 | 105 | | 244 | 0 | 00000b38 | 1000d098 | 172 | |
| 164 | 1 | 00000d9c | 04008004 | 106 | | 245 | 0 | 00000868 | 40034260 | 174 | |
| 165 | 0 | 00000a34 | 10020010 | 108 | | 246 | 1 | 00000daa | 800687e6 | 175 | |
| 166 | 1 | 0000084b | 100201f9 | 108 | 50 | 247 | 1 | 00000b1b | 80068a75 | 175 | |
| 167 | 1 | 00000d7a | 2004070e | 109 | | 248 | 1 | 00000906 | 80068c8a | 175 | |
| 168 | 0 | 00000a18 | 80101c38 | 111 | | 249 | 1 | 00000eaa | 01001c76 | 176 | 68 |
| 169 | 1 | 00000834 | 80101e1c | 111 | | 250 | 1 | 00000beb | 01001f35 | 176 | |
| 170 | 1 | 00000d56 | 01001f4a | 112 | 8c 01 | 251 | 1 | 000009af | 01002171 | 176 | |
| 171 | 1 | 00000ad6 | 010021ca | 112 | | 252 | 1 | 00000fbe | 00004682 | 177 | |
| 172 | 1 | 000008ce | 010023d2 | 112 | | 253 | 1 | 00000ccb | 02004975 | 177 | |
| 173 | 0 | 00000d30 | 08011e90 | 115 | 55 | 254 | 1 | 00000a65 | 02004bdb | 177 | |
| 174 | 1 | 00000ab7 | 08012109 | 115 | | 255 | 1 | 00000873 | 02004dcd | 177 | |
| 175 | 0 | 00000808 | 20048424 | 117 | | 256 | 1 | 00000dbc | 04009ec4 | 178 | |
| 176 | 1 | 00000d0e | 40090b4a | 118 | | | | Inverted encoder: | | | |
| 177 | 1 | 00000a9c | 40090dbc | 118 | | 0 | | 00001000 | 01001000 | 0 | |
| 178 | 1 | 0000089f | 40090fb9 | 118 | | 1 | 1 | 00000d00 | 01001000 | 0 | |
| 179 | 1 | 00000e04 | 801222ac | 119 | 60 | 2 | 1 | 00000a90 | 01001000 | 0 | |
| 180 | 1 | 00000b64 | 8012254c | 119 | | 3 | 1 | 00000895 | 01001000 | 0 | |
| 181 | 0 | 00000888 | 02001530 | 121 | 02 22 | 4 | 0 | 00000cd8 | 0800b7d0 | 3 | |
| 182 | 1 | 00000dde | 04002d92 | 122 | | 5 | 1 | 00000a70 | 0800b7d0 | 3 | |
| 183 | 1 | 00000b45 | 0400302b | 122 | | 6 | 0 | 00000fa8 | 40060258 | 6 | |
| 184 | 1 | 00000529 | 04003247 | 122 | | 7 | 1 | 00000cb9 | 40060258 | 6 | |
| 185 | 1 | 00000ee4 | 080067fc | 123 | 65 | 8 | 1 | 00000a57 | 40060258 | 6 | |
| 186 | 1 | 00000c1a | 08006ac6 | 123 | | 9 | 1 | 00000867 | 40060258 | 6 | |
| 187 | 1 | 000009d6 | 08006d0a | 123 | | 10 | 0 | 00000c98 | 02000960 | 9 | 3e |
| 188 | 1 | 00000ffc | 1000ddc4 | 124 | | 11 | 1 | 00000a3c | 02000960 | 9 | |
| 189 | 1 | 00000cfd | 1000e0c3 | 124 | | | | | | | |

-continued

| ec | sym | a | x | bits | codebytes |
|---|---|---|---|---|---|
| 12 | 1 | 00000851 | 02000960 | 9 | |
| 13 | 0 | 00000c78 | 10008110 | 12 | |
| 14 | 1 | 00000a22 | 10008110 | 12 | |
| 15 | 1 | 0000083c | 10008110 | 12 | |
| 16 | 1 | 00000d62 | 20010220 | 13 | |
| 17 | 1 | 00000ae0 | 20010220 | 13 | |
| 18 | 1 | 000008d6 | 20010220 | 13 | |
| 19 | 1 | 00000e5c | 40020440 | 14 | |
| 20 | 1 | 00000bab | 40020440 | 14 | |
| 21 | 1 | 0000097b | 40020440 | 14 | |
| 22 | 0 | 00000e38 | 02001fa0 | 17 | be |
| 23 | 1 | 00000b8e | 02001fa0 | 17 | |
| 24 | 0 | 000008a8 | 0800a410 | 19 | |
| 25 | 1 | 00000e12 | 10014820 | 20 | |
| 26 | 1 | 00000b6f | 10014820 | 20 | |
| 27 | 1 | 0000094b | 10014820 | 20 | |
| 28 | 1 | 00000f1a | 20029040 | 21 | |
| 29 | 1 | 00000c46 | 20029040 | 21 | |
| 30 | 1 | 000009f9 | 20029040 | 21 | |
| 31 | 1 | 0000081b | 20029040 | 21 | |
| 32 | 0 | 00000c28 | 010016b0 | 24 | 5a |
| 33 | 1 | 000009e1 | 010016b0 | 24 | |
| 34 | 0 | 00000ed0 | 0800f5b8 | 27 | |
| 35 | 1 | 00000c09 | 0800f5b8 | 27 | |
| 36 | 1 | 000009c8 | 0800f5b8 | 27 | |
| 37 | 1 | 00000fe6 | 1001eb70 | 28 | |
| 38 | 1 | 00000ceb | 1001eb70 | 28 | |
| 39 | 1 | 00000a7f | 1001eb70 | 28 | |
| 40 | 1 | 00000888 | 1001eb70 | 28 | |
| 41 | 1 | 00000dde | 2003d6e0 | 29 | |
| 42 | 1 | 00000b45 | 2003d6e0 | 29 | |
| 43 | 1 | 00000929 | 2003d6e0 | 29 | |
| 44 | 0 | 00000db8 | 01001290 | 32 | 08 |
| 45 | 1 | 00000b26 | 01001290 | 32 | |
| 46 | 1 | 0000090f | 01001290 | 32 | |
| 47 | 1 | 00000eba | 0200220 | 33 | |
| 48 | 1 | 00000bf8 | 02002520 | 33 | |
| 49 | 1 | 000009ba | 02002520 | 33 | |
| 50 | 1 | 00000fd0 | 04004a40 | 34 | |
| 51 | 0 | 00000bdc | 10015c64 | 36 | |
| 52 | 1 | 000009a3 | 10015c64 | 66 | |
| 53 | 0 | 00000e70 | 800b21c8 | 39 | |
| 54 | 1 | 00000bbb | 800b21c8 | 39 | |
| 55 | 1 | 00000988 | 800b21c8 | 39 | |
| 56 | 0 | 00000e48 | 04004c38 | 42 | 4d |
| 57 | 1 | 00000b9b | 04004c38 | 42 | |
| 58 | 1 | 0000096e | 04004c38 | 42 | |
| 59 | 0 | 00000e20 | 20029f10 | 45 | |
| 60 | 0 | 00000a98 | 800aaa28 | 47 | |
| 61 | 0 | 00000fe0 | 04001620 | 50 | 54 |
| 62 | 1 | 00000ce6 | 04001620 | 50 | |
| 63 | 1 | 00000a7b | 04001620 | 50 | |
| 64 | 1 | 00000884 | 04001620 | 50 | |
| 65 | 1 | 00000dd8 | 08002c40 | 51 | |
| 66 | 1 | 00000b40 | 08002c40 | 51 | |
| 67 | 1 | 00000924 | 08002c40 | 51 | |
| 68 | 1 | 00000edc | 10005880 | 52 | |
| 69 | 0 | 00000b24 | 4001924c | 54 | |
| 70 | 1 | 00000090e | 4001924c | 54 | |
| 71 | 1 | 00000eb8 | 80032498 | 55 | |
| 72 | 1 | 00000bf6 | 80032498 | 55 | |
| 73 | 1 | 000009b8 | 80032498 | 55 | |
| 74 | 1 | 00000fcc | 01000930 | 56 | cd |
| 75 | 1 | 00000cd6 | 01000930 | 56 | |
| 76 | 1 | 00000a6e | 01000930 | 56 | |
| 77 | 1 | 0000087a | 01000930 | 56 | |
| 78 | 1 | 00000dc8 | 02001260 | 57 | |
| 79 | 1 | 00000b33 | 02001260 | 57 | |
| 80 | 1 | 0000091a | 02001260 | 57 | |
| 81 | 1 | 00000ecc | 040024c0 | 58 | |
| 82 | 1 | 00000c06 | 040024c0 | 58 | |
| 83 | 1 | 000009c5 | 040024c0 | 58 | |
| 84 | 1 | 00000fe2 | 08004980 | 59 | |
| 85 | 1 | 00000ce8 | 08004980 | 59 | |
| 86 | 1 | 00000a7d | 08004980 | 59 | |
| 87 | 0 | 00000fb8 | 40029030 | 62 | |
| 88 | 1 | 00000cc6 | 40029030 | 62 | |
| 89 | 1 | 00000a61 | 40029030 | 62 | |
| 90 | 1 | 0000086f | 40029030 | 62 | |
| 91 | 1 | 00000db6 | 80052060 | 63 | |
| 92 | 1 | 00000b24 | 80052060 | 63 | |
| 93 | 1 | 0000090e | 80052060 | 63 | |
| 94 | 1 | 00000eb8 | 010000c0 | 64 | ad |
| 95 | 1 | 00000bf6 | 010000c0 | 64 | |
| 96 | 0 | 000008f8 | 040029e0 | 66 | |
| 97 | 0 | 00000d70 | 20018950 | 69 | |
| 98 | 1 | 00000aeb | 20018950 | 69 | |
| 99 | 1 | 000008df | 20018950 | 69 | |
| 100 | 1 | 00000e6c | 400312a0 | 70 | |
| 101 | 1 | 00000bb8 | 400312a0 | 70 | |
| 102 | 1 | 00000986 | 400312a0 | 70 | |
| 103 | 1 | 00000f7a | 80062540 | 71 | |
| 104 | 1 | 00000c94 | 80062540 | 71 | |
| 105 | 1 | 00000a39 | 80062540 | 71 | |
| 106 | 1 | 0000084f | 80062540 | 71 | |
| 107 | 1 | 00000d82 | 01000a80 | 72 | 9d |
| 108 | 1 | 00000afa | 01000a80 | 72 | |
| 109 | 1 | 000008ec | 01000a80 | 72 | |
| 110 | 0 | 00000d60 | 08008e00 | 75 | |
| 111 | 1 | 00000ade | 08008e00 | 75 | |
| 112 | 1 | 000008d5 | 08008e00 | 75 | |
| 113 | 1 | 00000e5c | 10011c00 | 76 | |
| 114 | 1 | 00000bab | 10011c00 | 76 | |
| 115 | 0 | 000008c0 | 400495ec | 78 | |
| 116 | 1 | 00000e38 | 80092bd8 | 79 | |
| 117 | 1 | 00000b8e | 80092bd8 | 79 | |
| 118 | 1 | 00000964 | 80092bd8 | 79 | |
| 119 | 1 | 00000f44 | 010017b0 | 80 | 6d |
| 120 | 1 | 00000c68 | 010017b0 | 80 | |
| 121 | 1 | 00000a15 | 010017b0 | 80 | |
| 122 | 1 | 00000832 | 010017b0 | 80 | |
| 123 | 1 | 00000d52 | 02002f60 | 81 | |
| 124 | 1 | 00000ad3 | 02002f60 | 81 | |
| 125 | 0 | 0000081c | 0800e0b0 | 83 | |
| 126 | 0 | 00000c28 | 40073a38 | 86 | |
| 127 | 1 | 000009e1 | 40073a38 | 86 | |
| 128 | 1 | 00000807 | 40073a38 | 86 | |
| 129 | 1 | 00000d0c | 800e7470 | 87 | |
| 130 | 1 | 00000a9a | 800e7470 | 87 | |
| 131 | 1 | 0000089e | 800e7470 | 87 | |
| 132 | 1 | 00000e02 | 010008e0 | 88 | 18 |
| 133 | 1 | 00000b62 | 010008e0 | 88 | |
| 134 | 1 | 00000940 | 010008e0 | 88 | |
| 135 | 0 | 00000de0 | 08008320 | 91 | |
| 136 | 1 | 00000b46 | 08008320 | 91 | |
| 137 | 1 | 00000929 | 08008320 | 91 | |
| 138 | 1 | 00000ee4 | 10010640 | 92 | |
| 139 | 1 | 00000c1a | 10010640 | 92 | |
| 140 | 1 | 000009d6 | 10010640 | 92 | |
| 141 | 1 | 00000ffc | 20020c80 | 93 | |
| 142 | 1 | 00000ffd | 20020c80 | 93 | |
| 143 | 1 | 00000a8e | 20020c80 | 93 | |
| 144 | 1 | 00000894 | 20020c80 | 93 | |
| 145 | 1 | 00000df2 | 40041900 | 94 | |
| 146 | 1 | 00000b55 | 40041900 | 94 | |
| 147 | 1 | 00000936 | 40041900 | 94 | |
| 148 | 1 | 00000ef8 | 80083200 | 95 | |
| 149 | 1 | 00000c2a | 80083200 | 95 | |
| 150 | 1 | 000009e3 | 80083200 | 95 | |
| 151 | 1 | 00000809 | 80083200 | 95 | |
| 152 | 1 | 00000d10 | 01000400 | 96 | 7c |
| 153 | 1 | 00000a9d | 01000400 | 96 | |
| 154 | 0 | 00000fe8 | 08006500 | 99 | |
| 155 | 0 | 00000bec | 2001c7b4 | 101 | |
| 156 | 1 | 000009b0 | 2001c7b4 | 101 | |
| 157 | 0 | 00000e88 | 01001c98 | 104 | 8c |
| 158 | 1 | 00000bcf | 01001c98 | 104 | |
| 159 | 1 | 00000999 | 01001c98 | 104 | |
| 160 | 1 | 00000f9a | 02003930 | 105 | |
| 161 | 1 | 00000cae | 02003930 | 105 | |
| 162 | 1 | 00000a4e | 02003930 | 105 | |
| 163 | 1 | 00000860 | 02033930 | 105 | |
| 164 | 1 | 00000d9c | 04007260 | 106 | |
| 165 | 0 | 00000a34 | 1001f5bc | 108 | |
| 166 | 1 | 0000084b | 1001f5bc | 108 | |
| 167 | 1 | 00000d7a | 2003eb78 | 109 | |
| 168 | 0 | 00000a18 | 800fd9b0 | 111 | |
| 169 | 1 | 00000834 | 800fd9b0 | 111 | |
| 170 | 1 | 00000d56 | 01001360 | 112 | 02 |
| 171 | 1 | 00000ad6 | 01001360 | 112 | |
| 172 | 1 | 000008ce | 01001360 | 112 | |
| 173 | 0 | 00000d30 | 0800d440 | 115 | |

-continued

| ec | sym | a | x | bits | codebytes |
|---|---|---|---|---|---|
| 174 | 1 | 00000ab7 | 0800d440 | 115 | |
| 175 | 0 | 00000808 | 200373d4 | 117 | |
| 176 | 1 | 00000d0e | 4006e7a8 | 118 | |
| 177 | 1 | 00000a9c | 4006e7a8 | 118 | |
| 178 | 1 | 0000089f | 4006e7a8 | 118 | |
| 179 | 1 | 00000e04 | 800dcf50 | 119 | |
| 180 | 1 | 00000e64 | 800dcf50 | 119 | |
| 181 | 0 | 00000888 | 02002248 | 121 | 22 |
| 182 | 1 | 00000dde | 04004490 | 122 | |
| 183 | 1 | 00000b45 | 04004490 | 122 | |
| 184 | 1 | 00000929 | 04004490 | 122 | |
| 185 | 1 | 00000ee4 | 08008920 | 123 | |
| 186 | 1 | 00000c1a | 08008920 | 123 | |
| 187 | 1 | 000009d6 | 08008920 | 123 | |
| 188 | 1 | 00000ffc | 10011240 | 124 | |
| 189 | 1 | 00000cfd | 10011240 | 124 | |
| 190 | 1 | 00000a8e | 10011240 | 124 | |
| 191 | 1 | 00000894 | 10011240 | 124 | |
| 192 | 0 | 00000cd8 | 8008c9c8 | 127 | |
| 193 | 1 | 00000a70 | 8008c9c8 | 127 | |
| 194 | 0 | 00000fa8 | 04001218 | 130 | 72 |
| 195 | 1 | 00000cb9 | 04001218 | 130 | |
| 196 | 1 | 00000a57 | 04001218 | 130 | |
| 197 | 1 | 00000867 | 04001218 | 130 | |
| 198 | 0 | 00000c98 | 2000c760 | 133 | |
| 199 | 0 | 00000970 | 80034670 | 135 | |
| 200 | 1 | 00000f56 | 01000ce0 | 136 | cb |
| 201 | 0 | 00000b80 | 04006558 | 138 | |
| 202 | 1 | 00000958 | 04006558 | 138 | |
| 203 | 1 | 00000f30 | 0800cab0 | 139 | |
| 204 | 1 | 00000c57 | 0800cab0 | 139 | |
| 205 | 1 | 00000a07 | 0800cab0 | 139 | |
| 206 | 0 | 00000f08 | 400696b0 | 142 | |
| 207 | 1 | 00000c37 | 400696b0 | 142 | |
| 208 | 1 | 000009ed | 400696b0 | 142 | |
| 209 | 1 | 00000811 | 400696b0 | 142 | |
| 210 | 1 | 00000d1c | 800d2d60 | 143 | |
| 211 | 0 | 000009d4 | 0200201c | 145 | 2c |
| 212 | 1 | 00000ffa | 04004038 | 146 | |
| 213 | 1 | 00000cfc | 04004038 | 146 | |
| 214 | 1 | 00000a8d | 04004038 | 146 | |
| 215 | 1 | 00000893 | 04004038 | 146 | |
| 216 | 1 | 00000df0 | 08008070 | 147 | |
| 217 | 0 | 00000a74 | 20022f0c | 149 | |
| 218 | 1 | 0000087f | 20022f0c | 149 | |
| 219 | 1 | 00000dd0 | 40045e18 | 150 | |
| 220 | 1 | 00000b39 | 40045e18 | 150 | |
| 221 | 0 | 00000868 | 01001cdc | 152 | 73 |
| 222 | 1 | 00000daa | 020039b8 | 153 | |
| 223 | 1 | 00000b1b | 020039b8 | 153 | |
| 224 | 0 | 00000854 | 08010af8 | 155 | |
| 225 | 1 | 00000d8a | 100215f0 | 156 | |
| 226 | 1 | 00000b01 | 100215f0 | 156 | |
| 227 | 1 | 000008f1 | 100215f0 | 156 | |
| 228 | 0 | 00000d68 | 8010e9a0 | 159 | |
| 229 | 1 | 00000ae5 | 8010e9a0 | 159 | |
| 230 | 1 | 000008db | 8010e9a0 | 159 | |
| 231 | 0 | 00000d48 | 04000690 | 162 | 72 f0 |
| 232 | 1 | 00000acb | 04000690 | 162 | |
| 233 | 1 | 000008c5 | 04000690 | 162 | |
| 234 | 1 | 00000e42 | 08000d20 | 163 | |
| 235 | 0 | 00000ab0 | 200062d8 | 165 | |
| 236 | 1 | 000008af | 200062d8 | 165 | |
| 237 | 0 | 00000d00 | 01000f38 | 168 | e5 |
| 238 | 1 | 00000a90 | 01000f38 | 168 | |
| 239 | 1 | 00000895 | 01000f38 | 168 | |
| 240 | 1 | 00000df4 | 02001e70 | 169 | |
| 241 | 1 | 00000b57 | 02001e70 | 169 | |
| 242 | 1 | 00000937 | 02001e70 | 169 | |
| 243 | 1 | 00000efa | 04003ce0 | 170 | |
| 244 | 0 | 00000b38 | 10012430 | 172 | |
| 245 | 0 | 00000868 | 4004b538 | 174 | |
| 246 | 1 | 00000daa | 80096a70 | 175 | |
| 247 | 1 | 00000b1b | 80096a70 | 175 | |
| 248 | 1 | 00000906 | 80096a70 | 175 | |
| 249 | 1 | 00000eaa | 010014e0 | 176 | 69 |
| 250 | 1 | 00000beb | 010014e0 | 176 | |
| 251 | 1 | 000009af | 010014e0 | 176 | |
| 252 | 1 | 00000fbe | 020029c0 | 177 | |
| 253 | 1 | 00000ccb | 020029c0 | 177 | |
| 254 | 1 | 00000a65 | 020029c0 | 177 | |
| 255 | 1 | 00000873 | 020029c0 | 177 | |
| 256 | 1 | 00000dbc | 04005380 | 178 | |
| x+a−1 | | | 0400613b | | |
| Software encoder: | | | | | |
| 0 | | 00001000 | 01801000 | 0 | |
| 1 | 1 | 00000d00 | 01801000 | 0 | |
| 2 | 1 | 00000a90 | 01801000 | 0 | |
| 3 | 1 | 00000895 | 01801000 | 0 | |
| 4 | 0 | 00000cd8 | 0c004830 | 3 | |
| 5 | 1 | 00000a70 | 0c004830 | 3 | |
| 6 | 0 | 00000fa8 | 6001fda8 | 6 | |
| 7 | 1 | 00000cb9 | 6001fda8 | 6 | |
| 8 | 1 | 00000a57 | 6001fda8 | 6 | |
| 9 | 1 | 00000867 | 6001fda8 | 6 | |
| 10 | 0 | 00000c98 | 030036a0 | 9 | 3e |
| 11 | 1 | 00000a3c | 030036a0 | 9 | |
| 12 | 1 | 00000851 | 030036a0 | 9 | |
| 13 | 0 | 00000c78 | 18017ef0 | 12 | |
| 14 | 1 | 00000a22 | 18017ef0 | 12 | |
| 15 | 1 | 0000083c | 18017ef0 | 12 | |
| 16 | 1 | 00000d62 | 3002fde0 | 13 | |
| 17 | 1 | 00000ae0 | 3002fde0 | 13 | |
| 18 | 1 | 000008d6 | 3002fde0 | 13 | |
| 19 | 1 | 00000e5c | 6005fbc0 | 14 | |
| 20 | 1 | 00000bab | 6005fbc0 | 14 | |
| 21 | 1 | 0000097b | 6005fbc0 | 14 | |
| 22 | 0 | 00000e38 | 03002060 | 17 | be |
| 23 | 1 | 00000b8e | 03002060 | 17 | |
| 24 | 0 | 000008a8 | 0c005bf0 | 19 | |
| 25 | 1 | 00000e12 | 1800b7e0 | 20 | |
| 26 | 1 | 00000b6f | 1800b7e0 | 20 | |
| 27 | 1 | 0000094b | 1800b7e0 | 20 | |
| 28 | 1 | 00000f1a | 30016fc0 | 21 | |
| 29 | 1 | 00000c46 | 30016fc0 | 21 | |
| 30 | 1 | 000009f9 | 30016fc0 | 21 | |
| 31 | 1 | 0000081b | 30016fc0 | 21 | |
| 32 | 0 | 00000c28 | 01800950 | 24 | 5a |
| 33 | 1 | 000009e1 | 01800950 | 24 | |
| 34 | 0 | 00000ed0 | 0c000a48 | 27 | |
| 35 | 1 | 00000c09 | 0c000a48 | 27 | |
| 36 | 1 | 000009c8 | 0c000a48 | 27 | |
| 37 | 1 | 00000fe6 | 18001490 | 28 | |
| 38 | 1 | 00000ceb | 18001490 | 28 | |
| 39 | 1 | 00000a7f | 18001490 | 28 | |
| 40 | 1 | 00000888 | 18001490 | 28 | |
| 41 | 1 | 00000dde | 30002920 | 29 | |
| 42 | 1 | 00000b45 | 30002920 | 29 | |
| 43 | 1 | 00000929 | 30002920 | 29 | |
| 44 | 0 | 00000db8 | 01800d70 | 32 | 08 |
| 45 | 1 | 00000b26 | 01800d70 | 32 | |
| 46 | 1 | 0000090f | 01800d70 | 32 | |
| 47 | 1 | 00000eba | 03001ae0 | 33 | |
| 48 | 1 | 00000bf8 | 03001ae0 | 33 | |
| 49 | 1 | 000009ba | 03001ae0 | 33 | |
| 50 | 1 | 00000fd0 | 060035c0 | 34 | |
| 51 | 0 | 00000bdc | 1800a39c | 36 | |
| 52 | 1 | 000009a3 | 1800a39c | 36 | |
| 53 | 0 | 00000e70 | c004de38 | 39 | |
| 54 | 1 | 00000bbb | c004de38 | 39 | |
| 55 | 1 | 00000988 | c004de38 | 39 | |
| 56 | 0 | 00000e48 | 060033c8 | 42 | 4d |
| 57 | 1 | 00000b9b | 060033c8 | 42 | |
| 58 | 1 | 0000096e | 060033c8 | 42 | |
| 59 | 0 | 00000e20 | 300160f0 | 45 | |
| 60 | 0 | 00000a98 | c00555d8 | 47 | |
| 61 | 1 | 00000fe0 | 060069e0 | 50 | 54 |
| 62 | 1 | 00000ce6 | 060069e0 | 50 | |
| 63 | 1 | 00000a7b | 060069e0 | 50 | |
| 64 | 1 | 00000884 | 060069e0 | 50 | |
| 65 | 0 | 00000dd8 | 0c00d3c0 | 51 | |
| 66 | 1 | 00000b40 | 0c00d3c0 | 51 | |
| 67 | 1 | 00000924 | 0c00d3c0 | 51 | |
| 68 | 1 | 00000edc | 1801a780 | 22 | |
| 69 | 0 | 00000224 | 60066db4 | 54 | |
| 70 | 1 | 0000090e | 60066db4 | 54 | |
| 71 | 1 | 00000eb8 | c00cdb68 | 55 | |
| 72 | 1 | 00000bf6 | c00cdb68 | 55 | |
| 73 | 1 | 000009b8 | c00cdb68 | 55 | |
| 74 | 1 | 00000fcc | 018016d0 | 56 | cd |
| 75 | 1 | 00000cd6 | 018016d0 | 56 | |

-continued

| ec | sym | a | x | bits | codebytes |
|---|---|---|---|---|---|
| 76 | 1 | 00000a6e | 018016d0 | 56 | |
| 77 | 1 | 0000087a | 018016d0 | 56 | |
| 78 | 1 | 00000dc8 | 03002da0 | 57 | |
| 79 | 1 | 00000b33 | 03002da0 | 57 | |
| 80 | 1 | 0000091a | 03002da0 | 57 | |
| 81 | 1 | 00000ecc | 06005b40 | 58 | |
| 82 | 1 | 00000c06 | 06005b40 | 58 | |
| 83 | 1 | 000009c5 | 06005b40 | 58 | |
| 84 | 1 | 00000fe2 | 0c00b680 | 59 | |
| 85 | 1 | 00000ce8 | 0c00b680 | 59 | |
| 86 | 1 | 00000a7d | 0c00b680 | 59 | |
| 87 | 0 | 00000fb8 | 60056fd0 | 62 | |
| 88 | 1 | 00000cc6 | 60056fd0 | 62 | |
| 89 | 1 | 00000a61 | 60056fd0 | 62 | |
| 90 | 1 | 0000086f | 60056fd0 | 62 | |
| 91 | 1 | 00000db6 | c00adfa0 | 63 | |
| 92 | 1 | 00000b24 | c00adfa0 | 63 | |
| 93 | 1 | 0000090e | c00adfa0 | 63 | |
| 94 | 1 | 00000eb8 | 01801f40 | 64 | ad |
| 95 | 1 | 00000bf6 | 01801f40 | 64 | |
| 96 | 0 | 000008f8 | 06005620 | 66 | |
| 97 | 0 | 00000d70 | 300276b0 | 69 | |
| 98 | 1 | 00000aeb | 300276b0 | 69 | |
| 99 | 1 | 000008df | 300276b0 | 69 | |
| 100 | 1 | 00000e6c | 6004ed60 | 70 | |
| 101 | 1 | 00000bb8 | 6004ed60 | 70 | |
| 102 | 1 | 00000986 | 6004ed60 | 70 | |
| 103 | 1 | 00000f7a | c009dac0 | 71 | |
| 104 | 1 | 00000c94 | c009dac0 | 71 | |
| 105 | 1 | 00000a39 | c009dac0 | 71 | |
| 106 | 1 | 0000084f | c009dac0 | 71 | |
| 107 | 1 | 00000d82 | 01801580 | 72 | 9d |
| 108 | 1 | 00000afa | 01801580 | 72 | |
| 109 | 1 | 000008ec | 01801580 | 72 | |
| 110 | 0 | 00000d60 | 0c007200 | 75 | |
| 111 | 1 | 00000ade | 0c007200 | 75 | |
| 112 | 1 | 000008d5 | 0c007200 | 75 | |
| 113 | 1 | 00000e5c | 1800e400 | 76 | |
| 114 | 1 | 00000bab | 1800e400 | 76 | |
| 115 | 0 | 000008c0 | 6003 6a14 | 78 | |
| 116 | 1 | 00000e38 | c006d428 | 79 | |
| 117 | 1 | 00000b8e | c006d428 | 79 | |
| 118 | 1 | 00000964 | c006d428 | 79 | |
| 119 | 1 | 00000f44 | 01800850 | 80 | 6d |
| 120 | 1 | 00000c68 | 01800850 | 80 | |
| 121 | 1 | 00000a15 | 01800850 | 80 | |
| 122 | 1 | 00000832 | 01800850 | 80 | |
| 123 | 1 | 00000d52 | 030010a0 | 81 | |
| 124 | 1 | 00000ad3 | 030010a0 | 81 | |
| 125 | 0 | 0000081c | 0c001f50 | 83 | |
| 126 | 0 | 00000c28 | 6000c5c8 | 86 | |
| 127 | 1 | 000009e1 | 6000c5c8 | 86 | |
| 128 | 1 | 00000807 | 6000c5c8 | 86 | |
| 129 | 1 | 00000d0c | c0018b90 | 87 | |
| 130 | 1 | 00000a9a | c0018b90 | 87 | |
| 131 | 1 | 0000089e | c0018b90 | 87 | |
| 132 | 1 | 00000e02 | 01801720 | 88 | 18 |
| 133 | 1 | 00000b62 | 01801720 | 88 | |
| 134 | 1 | 00000940 | 01801720 | 88 | |
| 135 | 0 | 00000de0 | 0c007ce0 | 91 | |
| 136 | 1 | 00000b46 | 0c007ce0 | 91 | |
| 137 | 1 | 00000929 | 0c007ce0 | 91 | |
| 138 | 1 | 00000ee4 | 1800f9c0 | 92 | |
| 139 | 1 | 00000c1a | 1800f9c0 | 92 | |
| 140 | 1 | 000009d6 | 1800f9c0 | 92 | |
| 141 | 1 | 00000ffc | 3001f380 | 93 | |
| 142 | 1 | 00000cfd | 3001f380 | 93 | |
| 143 | 1 | 00000a8e | 3001f380 | 93 | |
| 144 | 1 | 00000894 | 3001f380 | 93 | |
| 145 | 1 | 00000df2 | 6003e700 | 94 | |
| 146 | 1 | 00000b55 | 6003e700 | 94 | |
| 147 | 1 | 00000936 | 6003e700 | 94 | |
| 148 | 1 | 00000ef8 | c007ce00 | 95 | |
| 149 | 1 | 00000c2a | c007ce00 | 95 | |
| 150 | 1 | 000009e3 | c007ce00 | 95 | |
| 151 | 1 | 00000809 | c007ce00 | 95 | |
| 152 | 1 | 00000d10 | 01801c00 | 96 | 7c |
| 153 | 1 | 00000a9d | 01801c00 | 96 | |
| 154 | 0 | 00000fe8 | 0c009b00 | 99 | |
| 155 | 0 | 00000bec | 3002384c | 101 | |
| 156 | 1 | 000009b0 | 3002384c | 101 | |
| 157 | 0 | 00000e88 | 01800368 | 104 | 8c |
| 158 | 1 | 00000bcf | 01800368 | 104 | |
| 159 | 1 | 00000999 | 01800368 | 104 | |
| 160 | 1 | 00000f9a | 030006d0 | 105 | |
| 161 | 1 | 00000cae | 030006d0 | 105 | |
| 162 | 1 | 00000a4e | 030006d0 | 105 | |
| 163 | 1 | 00000860 | 030006d0 | 105 | |
| 164 | 1 | 00000d9c | 06000da0 | 106 | |
| 165 | 0 | 00000a34 | 18000a44 | 108 | |
| 166 | 1 | 0000084b | 18000a44 | 108 | |
| 167 | 1 | 00000d7a | 30001488 | 109 | |
| 168 | 0 | 00000a18 | c0002650 | 111 | |
| 169 | 1 | 00000834 | c0002650 | 111 | |
| 170 | 1 | 00000d56 | 01800ca0 | 112 | 02 |
| 171 | 1 | 00000ad6 | 01800ca0 | 112 | |
| 172 | 1 | 000008ce | 01800ca0 | 112 | |
| 173 | 0 | 00000d30 | 0c002bc0 | 115 | |
| 174 | 1 | 00000ab7 | 0c002bc0 | 115 | |
| 175 | 0 | 00000808 | 30008c2c | 117 | |
| 176 | 1 | 00000d0e | 60011858 | 118 | |
| 177 | 1 | 00000a9c | 60011858 | 118 | |
| 178 | 1 | 0000089f | 60011858 | 118 | |
| 179 | 1 | 00000e04 | c00230b0 | 119 | |
| 180 | 1 | 00000b64 | c00230b0 | 119 | |
| 181 | 0 | 00000888 | 03001db8 | 121 | 22 |
| 182 | 1 | 00000dde | 06003b70 | 122 | |
| 183 | 1 | 00000b45 | 06003b70 | 122 | |
| 184 | 1 | 00000929 | 06003b70 | 122 | |
| 185 | 1 | 00000ee4 | 0c0076e0 | 123 | |
| 186 | 1 | 00000c1a | 0c0076e0 | 123 | |
| 187 | 1 | 000009d6 | 0c0076e0 | 123 | |
| 188 | 1 | 00000ffc | 1800edc0 | 124 | |
| 189 | 1 | 00000cfd | 1800edc0 | 124 | |
| 190 | 1 | 00000a8e | 1800edc0 | 124 | |
| 191 | 1 | 00000894 | 1800edc0 | 124 | |
| 192 | 0 | 00000cd8 | c0073638 | 127 | |
| 193 | 1 | 00000a70 | c0073638 | 127 | |
| 194 | 0 | 00000fa8 | 06006de8 | 130 | 72 |
| 195 | 1 | 00000cb9 | 06006de8 | 130 | |
| 196 | 1 | 00000a57 | 06006de8 | 130 | |
| 197 | 1 | 00000867 | 06006de8 | 130 | |
| 198 | 0 | 00000c98 | 300338a0 | 133 | |
| 199 | 0 | 00000970 | c00cb990 | 135 | |
| 200 | 1 | 00000f56 | 01801320 | 136 | cb |
| 201 | 0 | 00000b80 | 06001aa8 | 138 | |
| 202 | 1 | 00000958 | 06001aa8 | 138 | |
| 203 | 1 | 00000f30 | 0c003550 | 139 | |
| 204 | 1 | 00000c57 | 0c003550 | 139 | |
| 205 | 1 | 00000a07 | 0c003550 | 139 | |
| 206 | 0 | 00000f08 | 60016950 | 142 | |
| 207 | 1 | 00000c37 | 60016950 | 142 | |
| 208 | 1 | 000009ed | 60016950 | 142 | |
| 209 | 1 | 00000811 | 60016950 | 142 | |
| 210 | 1 | 00000d1c | c002d2a0 | 143 | |
| 211 | 0 | 000009d4 | 03001fe4 | 145 | 2c |
| 212 | 1 | 00000ffa | 06003fc8 | 146 | |
| 213 | 1 | 00000cfc | 06003fc8 | 146 | |
| 214 | 1 | 00000a8d | 06003fc8 | 146 | |
| 215 | 1 | 00000893 | 06003fc8 | 146 | |
| 216 | 1 | 00000df0 | 0c007f90 | 147 | |
| 217 | 0 | 00000a74 | 3001d0f4 | 149 | |
| 218 | 1 | 0000087f | 3001d0f4 | 149 | |
| 219 | 1 | 00000dd0 | 6003a1e8 | 150 | |
| 220 | 1 | 00000b39 | 6003a1e8 | 150 | |
| 221 | 0 | 00000868 | 01800324 | 152 | 73 |
| 222 | 1 | 00000daa | 03000648 | 153 | |
| 223 | 1 | 00000b1b | 03000648 | 153 | |
| 224 | 0 | 00000854 | 0bfff508 | 155 | |
| 225 | 1 | 00000d8a | 17ffea10 | 156 | |
| 226 | 1 | 00000b01 | 17ffea10 | 156 | |
| 227 | 1 | 000008f1 | 17ffea10 | 156 | |
| 228 | 0 | 00000d68 | bfff1660 | 159 | |
| 229 | 1 | 00000ae5 | bfff1660 | 159 | |
| 230 | 1 | 000008db | bfff1660 | 159 | |
| 231 | 0 | 00000d48 | 06007970 | 162 | 72 f0 |
| 232 | 1 | 00000acb | 06007970 | 162 | |
| 233 | 1 | 000008c5 | 06007970 | 162 | |
| 234 | 1 | 00000e42 | 0c00f2e0 | 163 | |
| 235 | 0 | 00000ab0 | 30039d28 | 165 | |
| 236 | 1 | 000008af | 30039d28 | 165 | |
| 237 | 0 | 00000d00 | 018010c8 | 168 | e5 |

-continued

| ec | sym | a | x | bits | codebytes |
|---|---|---|---|---|---|
| 238 | 1 | 00000a90 | 018010c8 | 168 | |
| 239 | 1 | 00000895 | 018010c8 | 168 | |
| 240 | 1 | 00000df4 | 03002190 | 169 | |
| 241 | 1 | 00000b57 | 03002190 | 169 | |
| 242 | 1 | 00000937 | 03002190 | 169 | |
| 243 | 1 | 00000efa | 06004320 | 170 | |
| 244 | 0 | 00000b38 | 1800dbd0 | 172 | |
| 245 | 0 | 00000868 | 60034ac8 | 174 | |
| 246 | 1 | 00000daa | c0069590 | 175 | |
| 247 | 1 | 00000b1b | c0069590 | 175 | |
| 248 | 1 | 00000906 | c0069590 | 175 | |
| 249 | 1 | 00000eaa | 01800b20 | 176 | 69 |
| 250 | 1 | 00000beb | 01800b20 | 176 | |
| 251 | 1 | 000009af | 01800b20 | 176 | |
| 252 | 1 | 00000fhe | 03001640 | 177 | |
| 253 | 1 | 00000ccb | 03001640 | 177 | |
| 254 | 1 | 00000a65 | 03001640 | 177 | |
| 255 | 1 | 00000873 | 03001640 | 177 | |
| 256 | 1 | 00000dbc | 06002c80 | 178 | |
| x−a | | | 06001ec4 | | |
| Hardware decoder: | | | | | |
| 0 | | 00001000 | 07d7c020 | 0 | |
| 1 | 1 | 00000d00 | 04d7c220 | 0 | |
| 2 | 1 | 00000a50 | 0267c020 | 0 | |
| 3 | 1 | 00000895 | 006cc020 | 0 | |
| 4 | 0 | 00000cd8 | 03665a01 | 3 | 5a |
| 5 | 1 | 00000a70 | 00fe5a01 | 3 | |
| 6 | 0 | 00000fa8 | 07f2d008 | 6 | |
| 7 | 1 | 00000cb9 | 0503d008 | 6 | |
| 8 | 1 | 00000a57 | 02a1d008 | 6 | |
| 9 | 1 | 00000867 | 00b1d008 | 6 | |
| 10 | 0 | 00000c58 | 058e8040 | 9 | |
| 11 | 1 | 00000a3c | 03328040 | 9 | |
| 12 | 1 | 00000851 | 01478040 | 9 | |
| 13 | 0 | 00000c78 | 0a3c1002 | 12 | 08 |
| 14 | 1 | 00000a22 | 07e61002 | 12 | |
| 15 | 1 | 0000083c | 06001002 | 12 | |
| 16 | 1 | 00000d62 | 08ea2004 | 13 | |
| 17 | 1 | 00000ae0 | 06682004 | 13 | |
| 18 | 1 | 000008d6 | 045e2004 | 13 | |
| 19 | 1 | 00000e5c | 056c4008 | 14 | |
| 20 | 1 | 00000bab | 02bb4008 | 14 | |
| 21 | 1 | 0000097b | 008b4008 | 14 | |
| 22 | 0 | 00000e38 | 045a0040 | 17 | |
| 23 | 1 | 00000b8e | 01b00040 | 17 | |
| 24 | 0 | 000008a8 | 06c04d01 | 19 | 4d |
| 25 | 1 | 00000e12 | 0a429a02 | 20 | |
| 26 | 1 | 00000b6f | 079f9a02 | 20 | |
| 27 | 1 | 0000094b | 057b9a02 | 20 | |
| 28 | 1 | 00000f1a | 077b3404 | 21 | |
| 29 | 1 | 00000c46 | 04a73404 | 21 | |
| 30 | 1 | 000009f9 | 025a3404 | 21 | |
| 31 | 1 | 0000081b | 007c3404 | 21 | |
| 32 | 0 | 00000c28 | 03e1a020 | 24 | |
| 33 | 1 | 000009e1 | 019aa020 | 24 | |
| 34 | 0 | 00000ed0 | 0cd55401 | 27 | 54 |
| 35 | 1 | 00000c09 | 0a0e5401 | 27 | |
| 36 | 1 | 000009c8 | 07cd5401 | 27 | |
| 37 | 1 | 00000fe6 | 0bf0a802 | 28 | |
| 38 | 1 | 00000ceb | 08f5a802 | 28 | |
| 39 | 1 | 00000a7f | 0689a802 | 28 | |
| 40 | 1 | 00000888 | 0492a802 | 28 | |
| 41 | 1 | 00000dde | 05f35004 | 29 | |
| 42 | 1 | 00000b45 | 035a5004 | 29 | |
| 43 | 1 | 00000929 | 013e5004 | 29 | |
| 44 | 0 | 00000db8 | 09f28020 | 32 | |
| 45 | 1 | 00000b26 | 07608020 | 32 | |
| 46 | 1 | 0000090f | 05498020 | 32 | |
| 47 | 1 | 00000eba | 072f0040 | 33 | |
| 48 | 1 | 00000bf8 | 046d0040 | 33 | |
| 49 | 1 | 000009ba | 022f0040 | 33 | |
| 50 | 1 | 00000fd0 | 00ba0080 | 34 | |
| 51 | 0 | 00000bdc | 02e99a02 | 36 | cd |
| 52 | 1 | 000009a3 | 00b09a02 | 36 | |
| 53 | 0 | 00000e70 | 0584d010 | 39 | |
| 54 | 1 | 00000bbb | 02cfd010 | 39 | |
| 55 | 1 | 00000988 | 009cd010 | 39 | |
| 56 | 0 | 00000e48 | 04e68080 | 42 | |
| 57 | 1 | 00000b5b | 02398080 | 42 | |
| 58 | 1 | 0000056e | 000c8080 | 42 | |

-continued

| ec | sym | a | x | bits | codebytes |
|---|---|---|---|---|---|
| 59 | 0 | 00000e20 | 0066b404 | 45 | ad |
| 60 | 0 | 00000a98 | 019ad010 | 47 | |
| 61 | 0 | 00000fe0 | 0cd68080 | 50 | |
| 62 | 1 | 00000ce6 | 09dc8080 | 50 | |
| 63 | 1 | 00000a7b | 07718080 | 50 | |
| 64 | 1 | 00000884 | 057a8080 | 50 | |
| 65 | 1 | 00000dd8 | 07c59d01 | 51 | 9d |
| 66 | 1 | 00000b40 | 052d9d01 | 51 | |
| 67 | 1 | 00000924 | 03119d01 | 51 | |
| 68 | 1 | 00000edc | 02b73a02 | 52 | |
| 69 | 0 | 00000b24 | 0adce808 | 54 | |
| 70 | 1 | 0000090e | 08c6e808 | 54 | |
| 71 | 1 | 00000eb8 | 0e29d010 | 55 | |
| 72 | 1 | 00000bf6 | 0b67d010 | 55 | |
| 73 | 1 | 000009b8 | 0929d010 | 55 | |
| 74 | 1 | 00000fcc | 0eafa020 | 56 | |
| 75 | 1 | 00000cd6 | 0bb9a020 | 56 | |
| 76 | 1 | 00000a6e | 0951a020 | 56 | |
| 77 | 1 | 0000087a | 075da020 | 56 | |
| 78 | 1 | 00000dc8 | 0b8f4040 | 57 | |
| 79 | 1 | 00000b33 | 08fa4040 | 57 | |
| 80 | 1 | 0000091a | 06e14040 | 57 | |
| 81 | 1 | 00000ecc | 0a5a8080 | 58 | |
| 82 | 1 | 00000c06 | 07948080 | 58 | |
| 83 | 1 | 000009c5 | 05538080 | 58 | |
| 84 | 1 | 00000fe2 | 06ff6d01 | 59 | 6d |
| 85 | 1 | 00000ce8 | 04056d01 | 59 | |
| 86 | 1 | 00000a7d | 019a6d01 | 59 | |
| 87 | 0 | 00000fb8 | 0cd36808 | 62 | |
| 88 | 1 | 00000cc6 | 09e16808 | 62 | |
| 89 | 1 | 00000a61 | 077c6808 | 62 | |
| 90 | 1 | 0000086f | 058a6808 | 62 | |
| 91 | 1 | 00000db6 | 07ecd010 | 63 | |
| 92 | 1 | 00000b24 | 055ad010 | 63 | |
| 93 | 1 | 0000090e | 0344d010 | 63 | |
| 94 | 1 | 00000eb8 | 0325a020 | 64 | |
| 95 | 1 | 00000bf6 | 0063a020 | 64 | |
| 96 | 0 | 000008f8 | 018e8080 | 66 | |
| 97 | 0 | 00000d70 | 0c746004 | 69 | 18 |
| 98 | 1 | 00000aeb | 09ef6004 | 69 | |
| 99 | 1 | 000008df | 07e36004 | 69 | |
| 100 | 1 | 00000e6c | 0c74c008 | 70 | |
| 101 | 1 | 00000bb8 | 09c0c008 | 70 | |
| 102 | 1 | 00000986 | 078ec008 | 70 | |
| 103 | 1 | 00000f7a | 0b8b8010 | 71 | |
| 104 | 1 | 00000c94 | 08a58010 | 71 | |
| 105 | 1 | 00000a39 | 064a8010 | 71 | |
| 106 | 1 | 0000084f | 04608010 | 71 | |
| 107 | 1 | 00000d82 | 05a50020 | 72 | |
| 108 | 1 | 00000afa | 031d0020 | 72 | |
| 109 | 1 | 000008ec | 010f0020 | 72 | |
| 110 | 0 | 00000d60 | 08787c01 | 75 | 7c |
| 111 | 1 | 00000ade | 05f67c01 | 75 | |
| 112 | 1 | 000008d5 | 03ed7c01 | 75 | |
| 113 | 1 | 00000e5c | 048cf802 | 76 | |
| 114 | 1 | 00000bab | 01dbf802 | 76 | |
| 115 | 0 | 000008c0 | 076fe008 | 78 | |
| 116 | 1 | 00000e38 | 0b97c010 | 79 | |
| 117 | 1 | 00000b8e | 08edc010 | 79 | |
| 118 | 1 | 00000964 | 06c3c010 | 79 | |
| 119 | 1 | 00000f44 | 0a038020 | 80 | |
| 120 | 1 | 00000c68 | 07278020 | 80 | |
| 121 | 1 | 00000a15 | 04d48020 | 80 | |
| 122 | 1 | 00000832 | 02f18020 | 80 | |
| 123 | 1 | 00000d52 | 02d10040 | 81 | |
| 124 | 1 | 00000ad3 | 00520040 | 81 | |
| 125 | 0 | 0000081c | 01488c01 | 83 | 8c |
| 126 | 0 | 00000c28 | 0a446008 | 86 | |
| 127 | 1 | 000009e1 | 07fd6008 | 86 | |
| 128 | 1 | 00000807 | 06236008 | 86 | |
| 129 | 1 | 00000d0c | 0944c010 | 87 | |
| 130 | 1 | 00000a9a | 06d2c010 | 87 | |
| 131 | 1 | 0000089e | 04d6c010 | 87 | |
| 132 | 1 | 00000e02 | 06738020 | 88 | |
| 133 | 1 | 00000b62 | 03d38020 | 88 | |
| 134 | 1 | 00000940 | 01b18020 | 88 | |
| 135 | 0 | 00000de0 | 0d8c0201 | 91 | 02 |
| 136 | 1 | 00000b46 | 0af20201 | 91 | |
| 137 | 1 | 00000929 | 08d50201 | 91 | |
| 138 | 1 | 00000ee4 | 0e3c0402 | 92 | |
| 139 | 1 | 00000c1a | 0b720402 | 92 | |

-continued

| ec | sym | a | x | bits | codebytes |
|---|---|---|---|---|---|
| 140 | 1 | 000009d6 | 092e0402 | 92 | |
| 141 | 1 | 00000ffc | 0eac0804 | 93 | |
| 142 | 1 | 00000cfd | 0bad0804 | 93 | 5 |
| 143 | 1 | 00000a8e | 093e0804 | 93 | |
| 144 | 1 | 00000894 | 07440804 | 93 | |
| 145 | 1 | 00000df2 | 0b521008 | 94 | |
| 146 | 1 | 00000b55 | 08b51008 | 94 | |
| 147 | 1 | 00000936 | 06961008 | 94 | |
| 148 | 1 | 00000ef8 | 09b82010 | 95 | |
| 149 | 1 | 00000c2a | 06ea2010 | 95 | |
| 150 | 1 | 000009e3 | 04a32010 | 95 | |
| 151 | 1 | 00000809 | 02c92010 | 95 | |
| 152 | 1 | 00000d10 | 02904020 | 96 | |
| 153 | 1 | 00000a9d | 001d4020 | 96 | |
| 154 | 0 | 00000fe8 | 00ea2201 | 99 | 22 |
| 155 | 0 | 00000bec | 03a88804 | 101 | |
| 156 | 1 | 000009b0 | 01c88804 | 101 | |
| 157 | 0 | 00000e88 | 0b644020 | 104 | |
| 158 | 1 | 00000bcf | 08ab4020 | 104 | |
| 159 | 1 | 00000999 | 06754020 | 104 | |
| 160 | 1 | 00000f9a | 09528040 | 105 | |
| 161 | 1 | 00000cae | 06668040 | 105 | |
| 162 | 1 | 00000a4e | 04068040 | 105 | |
| 163 | 1 | 00000860 | 02188040 | 105 | |
| 164 | 1 | 00000d9c | 010d0080 | 106 | |
| 165 | 0 | 00000a34 | 0434e402 | 108 | 72 |
| 166 | 1 | 0000084b | 024be402 | 108 | |
| 167 | 1 | 00000d7a | 017bc804 | 109 | |
| 168 | 0 | 00000a18 | 05ef2010 | 111 | |
| 169 | 1 | 00000834 | 040b2010 | 111 | |
| 170 | 1 | 00000d56 | 05044020 | 112 | |
| 171 | 1 | 00000ad6 | 02844020 | 112 | |
| 172 | 1 | 000008ce | 007c4020 | 112 | |
| 173 | 0 | 00000d30 | 03e2cb01 | 115 | cb |
| 174 | 1 | 00000ab7 | 0169cb01 | 115 | |
| 175 | 0 | 00000808 | 05a72c04 | 117 | |
| 176 | 1 | 00000d0e | 084c5808 | 118 | |
| 177 | 1 | 00000a9c | 05da5808 | 118 | |
| 178 | 1 | 0000089f | 03dd5808 | 118 | |
| 179 | 1 | 00000e04 | 0480b010 | 119 | |
| 180 | 1 | 00000b64 | 01e0b010 | 199 | |
| 181 | 0 | 00000888 | 0782c040 | 121 | |
| 182 | 1 | 00000dde | 0bd38080 | 122 | |
| 183 | 1 | 00000b45 | 093a8080 | 122 | |
| 184 | 1 | 00000929 | 071e8080 | 122 | |
| 185 | 1 | 00000ee4 | 0acf2c01 | 123 | 2c |
| 186 | 1 | 00000c1a | 0805Zc01 | 123 | |
| 187 | 1 | 000009d6 | 05c12c01 | 123 | |
| 188 | 1 | 00000ffc | 07d25802 | 124 | |
| 189 | 1 | 00000cfd | 04d35802 | 124 | |
| 190 | 1 | 00000a8e | 02645802 | 124 | |
| 191 | 1 | 00000894 | 006a5802 | 124 | |
| 192 | 0 | 00000cd8 | 0352c010 | 127 | |
| 193 | 1 | 00000a70 | 00eac010 | 127 | |
| 194 | 0 | 00000fa8 | 07560080 | 130 | |
| 195 | 1 | 00000cb9 | 04670080 | 130 | |
| 196 | 1 | 00000a57 | 02050080 | 130 | |
| 197 | 1 | 00000867 | 00150080 | 130 | |
| 198 | 0 | 00000c98 | 00a9c804 | 133 | 72 |
| 199 | 0 | 00000970 | 02a72010 | 135 | |
| 200 | 1 | 00000f56 | 01c44020 | 136 | |
| 201 | 0 | 00000b80 | 07110080 | 138 | |
| 202 | 1 | 00000958 | 04e90080 | 138 | |
| 203 | 1 | 00000f30 | 0652f001 | 139 | f0 |
| 204 | 1 | 00000c57 | 0379f001 | 139 | |
| 205 | 1 | 00000a07 | 0129f001 | 139 | |
| 206 | 0 | 00000F08 | 094f8008 | 142 | |
| 207 | 1 | 00000c37 | 067e8008 | 142 | |
| 208 | 1 | 000009ed | 04348008 | 142 | |
| 209 | 1 | 00000811 | 02588008 | 142 | |
| 210 | 1 | 00000d1c | 01ab0010 | 143 | |
| 211 | 0 | 000009d4 | 06ac0040 | 145 | |
| 212 | 1 | 00000ffa | 09aa0080 | 146 | |
| 213 | 1 | 00000cfc | 06ac0080 | 146 | |
| 214 | 1 | 00000a8d | 043d0080 | 146 | |
| 215 | 1 | 00000893 | 02430080 | 146 | |
| 216 | 1 | 00000df0 | 0150e501 | 147 | e5 |
| 217 | 0 | 00000a74 | 05439404 | 149 | |
| 218 | 1 | 0000087f | 034e9404 | 149 | |
| 219 | 1 | 00000dd0 | 036f2808 | 150 | |
| 220 | 1 | 00000b39 | 00d82808 | 150 | |
| 221 | 0 | 00000868 | 0360a020 | 152 | |
| 222 | 1 | 00000daa | 039b4040 | 153 | |
| 223 | 1 | 00000b1b | 010c4040 | 153 | |
| 224 | 0 | 00000854 | 04316901 | 155 | 69 |
| 225 | 1 | 00000d8a | 0544d202 | 156 | |
| 226 | 1 | 00000b01 | 02bbd202 | 156 | |
| 227 | 1 | 000008f1 | 00abd202 | 156 | |
| 228 | 0 | 00000d68 | 055e9010 | 159 | |
| 229 | 1 | 00000ae5 | 02db9010 | 159 | |
| 230 | 1 | 000008db | 00d19010 | 159 | |
| 231 | 0 | 00000d48 | 068c8080 | 162 | |
| 232 | 1 | 00000acb | 040f8080 | 162 | |
| 233 | 1 | 000008c5 | 02098080 | 162 | |
| 234 | 1 | 00000e42 | 00cb3d01 | 163 | 3d |
| 235 | 0 | 00000ab0 | 032cf404 | 165 | |
| 236 | 1 | 000008af | 01Zbf404 | 165 | |
| 237 | 0 | 00000d00 | 095fa020 | 168 | |
| 238 | 1 | 00000a90 | 06eaa020 | 168 | |
| 239 | 1 | 00000895 | 04f4a020 | 168 | |
| 240 | 1 | 00000df4 | 06b34040 | 169 | |
| 241 | 1 | 00000b57 | 04164040 | 169 | |
| 242 | 1 | 00000937 | 01f64040 | 169 | |
| 243 | 1 | 00000efa | 00788080 | 170 | |
| 244 | 0 | 00000b38 | 01e31002 | 172 | 88 |
| 245 | 0 | 00000868 | 078c4008 | 174 | |
| 246 | 1 | 00000daa | 0bf28010 | 175 | |
| 247 | 1 | 00000b1b | 09638010 | 175 | |
| 248 | 1 | 00000906 | 074e8010 | 175 | |
| 249 | 1 | 00000eaa | 0b3b0020 | 176 | |
| 250 | 1 | 00000beb | 087c0020 | 176 | |
| 251 | 1 | 000009af | 06400020 | 176 | |
| 252 | 1 | 00000fbe | 08e00040 | 177 | |
| 253 | 1 | 00000ccb | 05ed0040 | 177 | |
| 254 | 1 | 00000a65 | 03870040 | 177 | |
| 255 | 1 | 00000873 | 01950040 | 177 | |
| 256 | 1 | 00000dbc | 00000080 | 178 | |

Inverted decoder:

| ec | sym | a | x | bits | codebytes |
|---|---|---|---|---|---|
| 0 | | 00001000 | 08283e20 | 0 | |
| 1 | 1 | 00000d00 | 08283e20 | 0 | |
| 2 | 1 | 00000a90 | 08283e20 | 0 | |
| 3 | 1 | 00000895 | 08283e20 | 0 | |
| 4 | 0 | 00000cd8 | 0971a501 | 3 | 5a |
| 5 | 1 | 00000a70 | 0971a501 | 3 | |
| 6 | 0 | 00000fa8 | 07b52808 | 6 | |
| 7 | 1 | 00000cb9 | 07b52808 | 6 | |
| 8 | 1 | 00000a57 | 07b52808 | 6 | |
| 9 | 1 | 00000867 | 07b52808 | 6 | |
| 10 | 0 | 00000c98 | 07094040 | 9 | |
| 11 | 1 | 00000a3c | 07094040 | 9 | |
| 12 | 1 | 00000851 | 07094040 | 9 | |
| 13 | 0 | 00000c78 | 023bee02 | 12 | 08 |
| 14 | 1 | 00000a22 | 023bee02 | 12 | |
| 15 | 1 | 0000083c | 023bee02 | 12 | |
| 16 | 1 | 00000d62 | 0477dc04 | 13 | |
| 17 | 1 | 00000ae0 | 0477dc04 | 13 | |
| 18 | 1 | 000008d6 | 0477dc04 | 13 | |
| 19 | 1 | 00000e5c | 08efb808 | 14 | |
| 20 | 1 | 00000bab | 08efb808 | 14 | |
| 21 | 1 | 0000097b | 08efb808 | 14 | |
| 22 | 0 | 00000e38 | 09ddc040 | 17 | |
| 23 | 1 | 00000b8e | 09ddc040 | 17 | |
| 24 | 0 | 000008a8 | 01e7b201 | 19 | 4d |
| 25 | 1 | 00000e12 | 03cf6402 | 20 | |
| 26 | 1 | 00000b6f | 03cf6402 | 20 | |
| 27 | 1 | 0000094b | 03cf6402 | 20 | |
| 28 | 1 | 00000f1a | 079ec804 | 21 | |
| 29 | 1 | 00000c46 | 079ec804 | 21 | |
| 30 | 1 | 000009f9 | 079ec804 | 21 | |
| 31 | 1 | 0000081b | 079ec804 | 21 | |
| 32 | 0 | 00000c28 | 08464020 | 24 | |
| 33 | 1 | 000009e1 | 08464020 | 24 | |
| 34 | 0 | 00000ed0 | 01faab01 | 27 | 54 |
| 35 | 1 | 00000c09 | 01faab01 | 27 | |
| 36 | 1 | 000009c8 | 01faab01 | 27 | |
| 37 | 1 | 00000fe6 | 03f55602 | 28 | |
| 38 | 1 | 00000ceb | 03f55602 | 28 | |
| 39 | 1 | 00000a7f | 03f55602 | 28 | |
| 40 | 1 | 00000888 | 03f55602 | 28 | |
| 41 | 1 | 00000dde | 07eaac04 | 29 | |
| 42 | 1 | 00000b45 | 07eaac04 | 29 | |

-continued

| ec | sym | a | x | bits | codebytes |
|---|---|---|---|---|---|
| 43 | 1 | 00000929 | 07eaac04 | 29 | |
| 44 | 0 | 00000db8 | 03c56020 | 32 | |
| 45 | 1 | 00000b26 | 03c56020 | 32 | |
| 46 | 1 | 0000090f | 03c56020 | 32 | |
| 47 | 1 | 00000eba | 078ac040 | 32 | |
| 48 | 1 | 00000bf8 | 078ac040 | 33 | |
| 49 | 1 | 000009ba | 078ac040 | 33 | |
| 50 | 1 | 00000fd0 | 0f158080 | 34 | |
| 51 | 0 | 00000bdc | 08f26402 | 36 | cd |
| 52 | 1 | 000009a3 | 08f26402 | 36 | |
| 53 | 0 | 00000e70 | 08eb2010 | 39 | |
| 54 | 1 | 00000bbb | 08eb2010 | 39 | |
| 55 | 1 | 00000988 | 08eb2010 | 39 | |
| 56 | 0 | 00000e48 | 09610080 | 42 | |
| 57 | 1 | 00000b9b | 09610080 | 42 | |
| 58 | 1 | 0000090e | 09610080 | 42 | |
| 59 | 0 | 00000e20 | 0db94804 | 45 | ad |
| 60 | 0 | 00000a98 | 08fd2010 | 47 | |
| 61 | 0 | 00000fe0 | 03090080 | 50 | |
| 62 | 1 | 00000ce6 | 03090080 | 50 | |
| 63 | 1 | 00000a7b | 03090080 | 50 | |
| 64 | 1 | 00000884 | 03090080 | 50 | |
| 65 | 1 | 00000dd8 | 06126201 | 51 | 9d |
| 66 | 1 | 00000b40 | 06126201 | 51 | |
| 67 | 1 | 00000924 | 06126201 | 51 | |
| 68 | 1 | 00000edc | 0c24c402 | 52 | |
| 69 | 0 | 00000b24 | 00471008 | 54 | |
| 70 | 1 | 0000090e | 00471008 | 54 | |
| 71 | 1 | 00000eb8 | 008e2010 | 55 | |
| 72 | 1 | 00000bf6 | 008e2010 | 55 | |
| 73 | 1 | 000009b8 | 008e2010 | 55 | |
| 74 | 1 | 00000fcc | 011c4020 | 56 | |
| 75 | 1 | 00000cd6 | 011c4020 | 56 | |
| 76 | 1 | 00000a6e | 011c4020 | 56 | |
| 77 | 1 | 0000087a | 011c4020 | 56 | |
| 78 | 1 | 00000dc8 | 02388040 | 57 | |
| 79 | 1 | 00000b33 | 02388040 | 57 | |
| 80 | 1 | 0000091a | 02388040 | 57 | |
| 81 | 1 | 00000ecc | 04710080 | 58 | |
| 82 | 1 | 00000c06 | 04710080 | 58 | |
| 83 | 1 | 000009c5 | 04710080 | 58 | |
| 84 | 1 | 00000fe2 | 08e29201 | 59 | 6d |
| 85 | 1 | 00000ce8 | 08e29201 | 59 | |
| 86 | 1 | 00000a7d | 08e29201 | 59 | |
| 87 | 0 | 00000fb8 | 02e49008 | 62 | |
| 88 | 1 | 00000cc6 | 02e49008 | 62 | |
| 89 | 1 | 00000a61 | 02e49008 | 62 | |
| 90 | 1 | 0000086f | 02e49008 | 62 | |
| 91 | 1 | 00000db6 | 05c92010 | 63 | |
| 92 | 1 | 00000b24 | 05c92010 | 63 | |
| 93 | 1 | 0000090e | 05c92010 | 63 | |
| 94 | 1 | 00000eb8 | 0b924020 | 64 | |
| 95 | 1 | 00000bf6 | 0b924020 | 64 | |
| 96 | 0 | 000008f8 | 07690080 | 66 | |
| 97 | 0 | 00000d70 | 00fb9c04 | 69 | 18 |
| 98 | 1 | 00000aeb | 00fb9c04 | 69 | |
| 99 | 1 | 000008df | 00fb9c04 | 69 | |
| 100 | 1 | 00000e6c | 01f73808 | 70 | |
| 101 | 1 | 00000bb8 | 01f73808 | 70 | |
| 102 | 1 | 00000986 | 01f73808 | 70 | |
| 103 | 1 | 00000f7a | 03ee7010 | 71 | |
| 104 | 1 | 00000c94 | 03ee7010 | 71 | |
| 105 | 1 | 00000a39 | 03ee7010 | 71 | |
| 106 | 1 | 0000084f | 03ee7010 | 71 | |
| 107 | 1 | 00000d82 | 07dce020 | 72 | |
| 108 | 1 | 00000afa | 07dce020 | 72 | |
| 109 | 1 | 000008ec | 07dce020 | 72 | |
| 110 | 0 | 00000d60 | 04e78301 | 75 | 7c |
| 111 | 1 | 00000ade | 04e78301 | 75 | |
| 112 | 1 | 000008d5 | 04e78301 | 75 | |
| 113 | 1 | 00000e5c | 09cf0602 | 76 | |
| 114 | 1 | 00000bab | 09cf0602 | 76 | |
| 115 | 0 | 000008c0 | 01501808 | 78 | |
| 116 | 1 | 00000e38 | 02a03010 | 79 | |
| 117 | 1 | 00000b8e | 02a03010 | 79 | |
| 118 | 1 | 00000964 | 02a03010 | 79 | |
| 119 | 1 | 00000f44 | 05406020 | 80 | |
| 120 | 1 | 00000c68 | 05406020 | 80 | |
| 121 | 1 | 00000a15 | 05406020 | 80 | |
| 122 | 1 | 00000832 | 05406020 | 80 | |
| 123 | 1 | 00000d52 | 0a80c040 | 81 | |
| 124 | 1 | 00000ad3 | 0a80c040 | 81 | |
| 125 | 0 | 0000081c | 06d37301 | 83 | 8c |
| 126 | 0 | 00000c28 | 01e39808 | 86 | |
| 127 | 1 | 000009e1 | 01e39808 | 86 | |
| 128 | 1 | 00000807 | 01e39808 | 86 | |
| 129 | 1 | 00000d0c | 03c73010 | 87 | |
| 130 | 1 | 00000a9a | 03c73010 | 87 | |
| 131 | 1 | 0000089e | 03c73010 | 87 | |
| 132 | 1 | 00000e02 | 078e6020 | 88 | |
| 133 | 1 | 00000b62 | 078e6020 | 88 | |
| 134 | 1 | 00000940 | 078e6020 | 88 | |
| 135 | 0 | 00000de0 | 0053fd01 | 91 | 02 |
| 136 | 1 | 00000b46 | 0053fd01 | 91 | |
| 137 | 1 | 00000929 | 0053fd01 | 91 | |
| 138 | 1 | 00000ee4 | 00a7fa02 | 92 | |
| 139 | 1 | 00000c1a | 00a7fa02 | 92 | |
| 140 | 1 | 000009d6 | 00a7fa02 | 92 | |
| 141 | 1 | 00000ffc | 014ff404 | 93 | |
| 142 | 1 | 00000cfd | 014ff404 | 93 | |
| 143 | 1 | 00000a8e | 014ff404 | 93 | |
| 144 | 1 | 00000894 | 014ff404 | 93 | |
| 145 | 1 | 00000df2 | 029fe808 | 94 | |
| 146 | 1 | 00000b55 | 029fe808 | 94 | |
| 147 | 1 | 00000936 | 029fe808 | 94 | |
| 148 | 1 | 00000ef8 | 053fd010 | 95 | |
| 149 | 1 | 00000c2a | 053fd010 | 95 | |
| 150 | 1 | 000009e3 | 053fd010 | 95 | |
| 151 | 1 | 00000809 | 053fd010 | 95 | |
| 152 | 1 | 00000d10 | 0a7fa020 | 96 | |
| 153 | 1 | 00000a9d | 0a7fa020 | 96 | |
| 154 | 0 | 00000fe8 | 0efddd01 | 96 | 22 |
| 155 | 0 | 00000bec | 08437404 | 101 | |
| 156 | 1 | 000009b0 | 08437404 | 101 | |
| 157 | 0 | 00000e88 | 0323a020 | 104 | |
| 158 | 1 | 00000bcf | 0323a020 | 104 | |
| 159 | 1 | 00000999 | 0323a020 | 104 | |
| 160 | 1 | 00000f9a | 06474040 | 105 | |
| 161 | 1 | 00000cae | 06474040 | 105 | |
| 162 | 1 | 00000a4e | 06474040 | 105 | |
| 163 | 1 | 00000860 | 06474040 | 105 | |
| 164 | 1 | 00000d9c | 0c8e8080 | 106 | |
| 165 | 0 | 00000a34 | 05ff1a02 | 108 | 72 |
| 166 | 1 | 0000084b | 05ff1a02 | 108 | |
| 167 | 1 | 00000d7a | 0bfe3404 | 109 | |
| 168 | 0 | 00000a18 | 0428d010 | 111 | |
| 169 | 1 | 00000834 | 0428d010 | 111 | |
| 170 | 1 | 00000d56 | 0851a020 | 112 | |
| 171 | 1 | 00000ad6 | 0851a020 | 112 | |
| 172 | 1 | 000008ce | 0851a020 | 112 | |
| 173 | 0 | 00000d30 | 094d3401 | 115 | cb |
| 174 | 1 | 00000ab7 | 094d3401 | 116 | |
| 175 | 0 | 00000808 | 0260d004 | 117 | |
| 176 | 1 | 00000d0e | 04c1a008 | 118 | |
| 177 | 1 | 00000a9c | 04c1a008 | 118 | |
| 178 | 1 | 0000089f | 04c1a008 | 118 | |
| 179 | 1 | 00000e04 | 09834010 | 119 | |
| 180 | 1 | 00000b64 | 09834010 | 119 | |
| 181 | 0 | 00000888 | 01050040 | 121 | |
| 182 | 1 | 00000dde | 020a0080 | 122 | |
| 183 | 1 | 00000b45 | 020a0080 | 122 | |
| 184 | 1 | 00000929 | 020a0080 | 122 | |
| 185 | 1 | 00000ee4 | 0414d301 | 123 | 2c |
| 186 | 1 | 00000c1a | 0414d301 | 123 | |
| 187 | 1 | 000009d6 | 0414d301 | 123 | |
| 188 | 1 | 00000ffc | 0829a602 | 124 | |
| 189 | 1 | 00000cfd | 0829a602 | 124 | |
| 190 | 1 | 00000a8e | 0829a602 | 124 | |
| 191 | 1 | 00000894 | 0829a602 | 124 | |
| 192 | 0 | 00000cd8 | 09853010 | 127 | |
| 193 | 1 | 00000a70 | 09853010 | 127 | |
| 194 | 0 | 00000fa8 | 08518080 | 130 | |
| 195 | 1 | 00000cb9 | 08518080 | 130 | |
| 196 | 1 | 00000a57 | 08518080 | 130 | |
| 197 | 1 | 00000867 | 08518080 | 130 | |
| 198 | 0 | 00000c98 | 0bee3404 | 133 | 72 |
| 199 | 0 | 00000970 | 06c8d010 | 135 | |
| 200 | 1 | 00000f56 | 0d91a020 | 136 | |
| 201 | 0 | 00000b80 | 046e8080 | 138 | |
| 202 | 1 | 00000958 | 046e8080 | 138 | |
| 203 | 1 | 00000f30 | 08dd0f01 | 139 | f0 |
| 204 | 1 | 00000c57 | 08dd0f01 | 139 | |

-continued

| ec | sym | a | x | bits | codebytes |
|---|---|---|---|---|---|
| 205 | 1 | 00000a07 | 08dd0f01 | 139 | |
| 206 | 0 | 00000f08 | 05b87808 | 142 | |
| 207 | 1 | 00000c37 | 05b87808 | 142 | |
| 208 | 1 | 000009ed | 05b87808 | 142 | |
| 209 | 1 | 00000811 | 05b87808 | 142 | |
| 210 | 1 | 00000d1c | 0b70f010 | 143 | |
| 211 | 0 | 000009d4 | 0327c040 | 145 | |
| 212 | 1 | 00000ffa | 064f8080 | 146 | |
| 213 | 1 | 00000cfc | 064f8080 | 146 | |
| 214 | 1 | 00000a8d | 064f8080 | 146 | |
| 215 | 1 | 00000893 | 064f8080 | 146 | |
| 216 | 1 | 00000df0 | 0c9f1a01 | 147 | e5 |
| 217 | 0 | 00000a74 | 05306804 | 149 | |
| 218 | 1 | 0000087f | 05306804 | 149 | |
| 219 | 1 | 00000dd0 | 0a60d008 | 150 | |
| 220 | 1 | 00000b39 | 0a60d008 | 150 | |
| 221 | 0 | 00000868 | 05074020 | 152 | |
| 222 | 1 | 00000daa | 0a0e8040 | 153 | |
| 223 | 1 | 00000b1b | 0a0e8040 | 153 | |
| 224 | 0 | 00000854 | 04229601 | 155 | 69 |
| 225 | 1 | 00000d8a | 08452c02 | 156 | |
| 226 | 1 | 00000b01 | 08452c02 | 156 | |
| 227 | 1 | 000008f1 | 08452c02 | 156 | |
| 228 | 0 | 00000d68 | 08096010 | 159 | |
| 229 | 1 | 00000ae5 | 08096010 | 159 | |
| 230 | 1 | 000008db | 08096010 | 159 | |
| 231 | 0 | 00000d48 | 06bb0080 | 162 | |
| 232 | 1 | 00000acb | 06bb0080 | 162 | |
| 233 | 1 | 000008c5 | 06bb0080 | 162 | |
| 234 | 1 | 00000e42 | 0d76c201 | 163 | 3d |
| 235 | 0 | 0000aab0 | 07830804 | 165 | |
| 236 | 1 | 000008af | 07830804 | 165 | |
| 237 | 0 | 00000d00 | 03a04020 | 168 | |
| 238 | 1 | 00000a90 | 03a04020 | 168 | |
| 239 | 1 | 00000895 | 03a04020 | 168 | |
| 240 | 1 | 00000df4 | 07408040 | 169 | |
| 241 | 1 | 00000b57 | 07408040 | 169 | |
| 242 | 1 | 00000937 | 07408040 | 169 | |
| 243 | 1 | 00000efa | 0e810080 | 170 | |
| 244 | 0 | 00000b38 | 0954ee02 | 172 | 88 |
| 245 | 0 | 00000868 | 00dbb808 | 174 | |
| 246 | 1 | 00000daa | 01b77010 | 175 | |
| 247 | 1 | 00000b1b | 01b77010 | 175 | |
| 248 | 1 | 00000906 | 01b77010 | 175 | |
| 249 | 1 | 00000eaa | 036ee020 | 176 | |
| 250 | 1 | 00000beb | 036ee020 | 176 | |
| 251 | 1 | 000009af | 036ee020 | 176 | |
| 252 | 1 | 00000fbe | 06ddc040 | 177 | |
| 253 | 1 | 00000ccb | 06ddc040 | 177 | |
| 254 | 1 | 00000a65 | 06ddc040 | 177 | |
| 255 | 1 | 00000873 | 06ddc040 | 177 | |
| 256 | 1 | 00000dbc | 0dbb8080 | 178 | |

X register:
    P0000000,nnnnnnnn, xxxxxxxx,xxxxxxxx

A register:
    000aaaaa,aaaaaaaa

What we claim as our invention is:

1. Data compression apparatus using arithmetic coding wherein a data stream is input and decision events are generated in response to an encoding convention producing a code stream with values identifiable in terms of code points along a probability line, comprising:

a first arithmetic coding encoder means for generating, in response to decision events being entered as input, a first code stream according to a first encoding convention;

a second arithmetic coding encoder means for generating, in response to decision events being entered as input, a second code stream according to a second encoding convention;

pointer means, responsive to a given set of decision events entered as input to said first and second encoder means, for identifying corresponding code stream values output by each encoder means as different code points along a probability line, with the identified point of each encoder means being in a respective interval in the probability line in accordance with the respective coding convention; and means for altering the value of the first code stream so that the identified point of the first code stream and that of the second code stream are in the same interval along the probability line in response to the given set of decision events being entered as input to each encoder means.

2. Apparatus as in claim 1 wherein said altering means includes means for converting the code stream values of said first encoder means in such manner as to cause said pointer means to identify the same probability line points as are identified by the corresponding values of said second encoder means for any given set of decision events.

3. Apparatus as in claim 1 wherein said first and second encoder means are each binary arithmetic coding encoders that encode a more probable event or a less probable event for each successive decision; and wherein said first encoder means includes means for up-dating the code stream thereof each less probable event entering said first encoder means as input and wherein the second encoder means up-dates the code stream thereof for each more probable event entering the second encoder means as input.

4. Apparatus as in claim 1 wherein said first and second encoder means operate in accordance with encoding convention which selectively include:

(1) a determination as to the type of decision event upon which the point identified by a respective encoder is moved;

(2) a determination as to the direction in which the point of a respective encoder means is moved in response to a point-moving decision event; and (3) for the interval containing the identified point, a determination of at which bound thereof the identified point is positioned.

5. Apparatus as in claim 4 wherein said first encoder means has a first encoding convention in which the identified point thereof is positioned at the higher-in-value bound of the interval and has a second encoding convention in which the identified point is moved toward the lower-in-value direction when the less probable of the two possible decision events enters said first encoder means as input.

6. Apparatus for compressing data by arithmetic coding, the apparatus comprising:

a first encoder means for generating a first code stream which, in response to successive decision event inputs, identifies successively smaller intervals along a probability line, in such manner that each subsequent interval is a segment selected from a larger interval of exclusive segments, each segment corresponding to one of the possible events for a decision;

said first encoder means being characterized by ordering the decision event segments along each interval in a first prescribed order;

a second encoder means for generating a second code stream which, in response to successive decision event inputs, identifies successively smaller intervals along a probability line, in such manner that each subsequent interval is a segment selected from a larger interval of exclusive segments, each segment corresponding to one of the possible events for a decision;

said second encoder means being characterized by ordering the decision event segments along each interval in a second prescribed order; and means for selectively adjusting the code stream value generated by said first encoder means in response to a set of decision events in order to identify the same interval identified by said second encoder means in response to the same set of decision events.

7. Apparatus as in claim 6 wherein said value adjusting means includes:

means for selectively modifying the value of the first code stream value C1 to conform with the value of the second code stream value C2 according to the relationship:

$$C2 = (A(0) - \epsilon) - C1 - (A\delta - \epsilon)$$

where A(0) is a value of the interval prior to the decision events being encoded; where $\epsilon$ represents a pre-borrow applied to a borrow-propagating minuend, and where $\delta$ represents a decision that a final interval A(f) must be factored in whenever the two encoder means move the respective code points thereof on differing binary events.

8. Apparatus as in claim 7 wherein the two encoder means move their respective code points equal distances in opposite directions in response to the same type of event; and said selectively modifying means modifies C1 to conform to C2 according to the expression:

$$C2 = (A(0) - \epsilon) - C1,$$

wherein C1 and C2 are inverted code streams.

9. Apparatus as in claim 6 wherein said interval identifying means includes means for specifying a point in an interval; and wherein each encoder means is a binary arithmetic coding encoder; and wherein the second encoder means specifies a point which is moved only when the less probable of the two possible binary events of a decision is encoded; and wherein said first encoder means further comprises means for moving the specified point thereof only when the more probable of the two probable binary events of a decision is encoded.

10. Apparatus as in claim 9 wherein the second encoder means is a hardware encoder and said first encoder means comprises a software encoder comprising:

(a) means for positioning the specified point at the upper bound of a current interval; and (b) means for decrementing the code stream value with the encoding of each point-moving event.

11. Apparatus as in claim 6 where in said code stream adjusting means includes:

means for modifying the code stream value of said first encoder means to be the same as that of the code stream of the second encoder means.

12. A finite precision binary arithmetic coding system in which successive smaller-in-size-included intervals along a number line are selected in correspondence with the inputting of successive decision events, said system comprising an arithmetic coding encoder that includes:

means for generating, for a given sequence of decisions events, a code stream having a current value indicative of a point positioned at the higher-in-value bound of a current interval A(i) of said number line, and wherein the current interval is partitioned into a first segment corresponding to a first type of binary event being encoded next and a second segment corresponding to the other type of binary event being encoded next;

means for decrementing the current value of the code stream by the value of the first segment if the next event is the second type of event; and means for up-dating the value for the interval to be either the value of the first segment if a first type event is encoded next; and the value of the second segment if the other type of event is encoded next.

13. The system of claim 12 wherein said encoder includes:

means for computing the code stream value at the ith decision event as $$C = A(0) - \sum_i R(i)A(i)P_e(i)\delta_{S_i=L}$$

where A(i) is the value of the current interval, R(i) corresponds to a renormalization factor applied when A(i) is less than a prescribed minimum value, Pe(i) is a value associated with the first type of event at the ith decision event, and $\delta$ is a function which is 0 when the ith symbol is a first type of event and 1 when the ith symbol is a second type of event and where Si represents the ith event and L represents said second type of event; and wherein the system further includes a decoder which includes:

means for computing a value:

$$C'_d = -A(0) + \left[ C + \sum_i R(i)A(i)P_e(i)\delta_{S_i=L} \right]$$

where C is that portion of the encoded code stream having the same precision as A(i) and where A(0) is the initial interval value for the encoder; and comparison means for determining if $C'_d < A(i)$; and means for determining whether the ith event is a first type of event or a second type of event from the outcome of the comparison.

14. Data compression/de-compression apparatus for generating a code stream from one of a plurality of selectable binary arithmetic coding encoders, the code stream of each encoder having values identifying a different point positioned in a number line interval selected in response to the input of a sequence of binary decision events, wherein for each decision there is a more probable event (MPS) and a less probable event (LPS) having respective probabilities, wherein said encoders comprise:

arithmetic coding hardware encoder means for generating a code stream and including means for altering the code stream value on each MPS;

arithmetic coding software encoder means for generating a code stream and including means for altering the code stream value on each LPS; and means for adjusting at least one of the respective code stream values generated by said hardware encoder means and said software encoder means, for a given sequence of events input to said hardware and software encoder means, so that both code streams identify a point in the same interval along the number line.

15. Apparatus as in claim 14 wherein at least one of said hardware and software encoder means includes:
means for forming the code stream thereof as a sequence of n-bit bytes; and
bit-stuffing means for allocating at least one but less than n 0 bits at a byte boundary at which a carry would propagate more than a prescribed number of bytes.

16. Apparatus as in claim 14 wherein at least one of said hardware and software encoder means includes:
means for forming the code stream thereof as a sequence of n-bit bytes; and
bit-stuffing means for allocating at least one but less than n 1 bits at a byte boundary at which a borrow would propagate more than a prescribed number of bytes.

17. Apparatus as in claim 15 further comprising: decoder means for retrieving an input set of decision events from a code stream including means for decoding the code stream to produce a corresponding set of decision events for a given interval and means for detecting stuffed bits.

18. Apparatus as in claim 16 wherein at least the one of said hardware and software encoder means which forms the code stream thereof as a sequence of bytes includes:
means for pre-borrowing from the byte preceding a subject byte when the subject byte contains all 0 bits and may be a minuend subject to decrementing in which a borrow might propagate beyond a prescribed number of bytes.

19. Apparatus as in claim 16 wherein at least the one of said hardware and software encoder means which forms the code stream thereof as a sequence of bytes includes:
means for pre-carrying when a byte containing all 1 bits may be an addend subject to incrementing in which a carry might propagate beyond a precribed number of bytes.

20. Apparatus as in claim 18 wherein the pre-borrowing means includes:
means for converting a byte containing all 0 bits into a byte containing all 1 bits followed by a set addend bit, said conversion being applied to bytes of 0 bits as each such byte is generated to be added to the code stream in response to decision event input.

21. Apparatus as in claim 18 further comprising:
a code stream register having a first portion in which a byte to be shipped is contained and a second portion which contains bits of the code stream which are subject to computation; and
a buffer memory for storing a finite number of bytes previously shipped from the code stream register;
said pre-borrowing means including conversion means for (a) decrementing by one the value of the most recently shipped byte in said buffer memory, (b) converting the 0 bits in said first portion to 1 bits, and (c) stuffing a set addend bit in the code stream register following said first portion.

22. Apparatus as in claim 21 wherein said preborrowing means further includes:
means for detecting (a) when the current value of the portion of said second portion of the code stream register is less than the value of the current interval and (b) when the code stream is decremented, and wherein said converting means operates in response to said detecting means.

23. In a finite precision binary arithmetic cooling system in which successive, smaller-in-size-included intervals along a number line are selected in correspondence with the inputting of successive decision events, a data compression/de-compression method comprising the steps of:
containing a current interval A(i) in a register of value A greater than A(i);
generating, for a given sequence of decisions events, a first code stream having a value C1 indicative of a point positioned at the lower-in-value bound of current interval A(i);
generating, for the same given sequence of decisions events, a second code stream having a value C2 indicative of a point positioned at the upper bound of current interval A(i) minus the value of the least significant bit of the A register;
partitioning current interval A(i) into non-overlapping segments with a first segment size corresponding to the estimated probability of a first type of decision and a second segment size corresponding to the estimated probability of a second type of decision event input;
incrementing the current value of the first code stream C1 by the value of the second segment if the next event input is a first decision event;
decrementing the current value of the second code stream C2 by the value of the first segment if he next event input is a second type decision event; and
computing a new current interval A(i+1) as:
the first segment, in response to a first type of decision event input; and
the second segment, in response to a second type of decision event input.

24. The method of claim 23 comprising the further step of:
renormalizing to maintain the value of A, after each event input, within fixed limits; and
renormalizing the code stream values by the same factor as the A value renormalization to maintain proportionality.

25. The method of claim 23 comprising the further step of:
decoding a code stream value for any encoder after the computing step to retrieve the given sequence of decision events.

26. A data compression/de-compression system comprising:
a plurality of binary arithmetic coding encoders, each of which generates a code stream that identifies successive, smaller-in-size-included intervals on a number line as successive binary events are entering as input thereto, each said intervals being partitioned into (a) a P segment which is selected as the next current interval when the successive binary event is a more probable event (MPS) and (b) a Q segment which is selected as the next current interval when the successive binary event is less probable event (LPS);
wherein at least one of the encoders is characterized by ordering the P segment of each current interval at the higher-in-value end of the interval with the Q segment occupying the lower-in-value end of the interval; and wherein at least one of the encoders is characterized by ordering the Q segment of each current interval at the higher-in-value end of the interval with the P segment occupying the lower-in-value end of the interval; and wherein at least one of the encoders is characterized by incrementing the value of the code stream thereof from the lower bound of the current interval in response to a selected one of the two possible binary decisions; and wherein at least one of the encoders is characterized by decrementing the value of the code stream thereof from the upper bound of the current interval in response to a selected one of the two possible binary decisions; and wherein each encoder generates a distinct code stream in response to a given sequence of MPS and LPS events; and means for selectively altering any of the code streams such that the value thereof is in the same number line interval as a pre-selected one of the encoders.

27. In a data processing system in which an arithmetic coding encoder generates an encoded code having an associated value C which points to successive, smaller-in-size-included intervals in a probability line in response to successively encoded decisions, starting with a positive interval A(0), the method in an arithmetic coding decoder comprising the steps of:

initializing the decoder probability line interval to A(0); initializing to a value of $-A(0)$ and xc portion of a code stream register, said xc portion comprising the most significant bits of said register and aligned with and of the same precision at the decoder probability line interval;

adding at least one byte of the encoded code stream to the code stream register;

containing a negative value corresponding to one of the decision event intervals in a second register in alignment with the xc portion of said code stream register;

comparing the contents of the xc portion and the contained negative value for said one decision event interval; and decoding the next decision event as one type of binary decision event or the other based on the comparison outcome.

28. The method of claim 27 comprising the further steps of:

when a first type of decision event is decoded, renormalizing A(i) and the contents of the decoder code stream register only if A(i) is greater than or equal to a prescribed value AMIN, where AMIN is a negative constant which determines when renormalization is required; and when a first type of decision event is decoded, (a) adjusting the value of xc to a more positive value, (b) adjusting the interval value to a more positive value, and (c) renormalizing A(i) and the contents of the decoder code stream register only if A(i) is greater than or equal to said negative precribed value AMIN.

29. Arithmetic coding encoder and decoder system comprising:

an arithmetic coding encoder for generating an encoded code stream for a set of decision event inputs based on a specified ordering of decision events along a probability line interval A(i);

means for inverting the bytes of the code stream in the order in which the bytes are generated; and an arithmetic coding decoder means for deriving the set of decision event inputs from the inverted code stream such that said decoder means decodes based on decision event ordering which is inverted from that of said encoder means.

30. Arithmetic coding encoder and decoder system as in claim 29 wherein said encoder means includes said inverting means.

31. Arithmetic coding encoder and decoder system as in claim 29 wherein said decoder means includes said inverting means.

32. In a data compression system using arithmetic coding wherein a data stream is input and decision events are generated in response to an encoding convention producing a code stream with values identifiable in terms of code points along a probability line, and comprising:

a first arithmetic coding encoder means for generating, in response to decision events being entered as input, a first code stream according to a first encoding convention; and a second arithmetic coding encoder means for generating, in response to decision events being entered as input, a second code stream according to a second encoding convention; the improvement comprising:

means, operatively connected to at least said first encoder means and responsive to a given set of decision events enterable as input to said first and second encoder means, for identifying corresponding code stream values, output by said first and second encoder means in response to said given set of decision events, as different code points along a probability line, with the identified point for each encoder means being in a respective interval in the probability line in accordance with its respective coding convention; and means, operatively connected to said first encoder means, for altering the value of the first code stream in response to the given set of decision events being entered as input to said first encoder means, such that the identified point of the first code stream and that of the second code stream are in the same interval along the probability line as through the output of said first encoder means was the output of said second encoder means in response to the given set of decision events being entered as input to said second encoder means.

33. A system as in claim 32 wherein said altering means comprises means for converting the code stream values of said first encoder means in such manner as to cause said identifying means to identify the same probability line points as are identified by the corresponding values of said second encoder means for any given set of decision events.

* * * * *